[12] United States Patent
Tanizaki et al.

(10) Patent No.: US 7,233,537 B2
(45) Date of Patent: Jun. 19, 2007

(54) THIN FILM MAGNETIC MEMORY DEVICE PROVIDED WITH A DUMMY CELL FOR DATA READ REFERENCE

(75) Inventors: Hiroaki Tanizaki, Hyogo (JP); Hideto Hidaka, Hyogo (JP); Takaharu Tsuji, Hyogo (JP); Tsukasa Ooishi, Hyogo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 118 days.

(21) Appl. No.: 10/260,397

(22) Filed: Oct. 1, 2002

(65) Prior Publication Data

US 2003/0189853 A1 Oct. 9, 2003

(30) Foreign Application Priority Data

Apr. 3, 2002 (JP) ............................ 2002-101629

(51) Int. Cl.
*G11C 7/02* (2006.01)

(52) U.S. Cl. .................. 365/209; 365/107; 365/210; 365/158

(58) Field of Classification Search ................ 365/209, 365/207, 210, 185.2
See application file for complete search history.

(56) References Cited

U.S. PATENT DOCUMENTS 5,831,920 A * 11/1998 Chen et al. ............... 365/225.5
6,055,178 A * 4/2000 Naji ............................ 365/158
6,097,633 A * 8/2000 La Placa ................ 365/185.21
6,205,073 B1   3/2001 English

OTHER PUBLICATIONS

"A 10ns Read and Write Non-Volatile Memory Array Using a Magnetic Tunnel Juction and FET Switch in Each Cell", Scheuerlein et al., ISSCC Digest of Techinical Papers, TA 7.2, Feb. 2000, pp. 94–95, 128–129, 409–410.
"Nonvolatile RAM based on Magnetic Tunnel Juction Elements", Durlam et. al., ISSCC Digest of Technical Papers, TA 7.3, Feb. 2000, pp. 96–97, 130–131, 410–411.
"A 256kb 3.0V 1T1MTJ Nonvolatile Magnetoresistive RAM", Naji et al., ISSCC Digest of Technical Papers, TA 7.6, Feb. 2001, pp. 94–95, 122–123, 404–405,438.

* cited by examiner

*Primary Examiner*—Huan Hoang
(74) *Attorney, Agent, or Firm*—McDermott Will & Emery LLP

(57) ABSTRACT

Normal memory cells and dummy cells are arranged continuously in a memory array. In a data read operation, first and second data lines are connected to the selected memory cell and the dummy cell, respectively, and are supplied with operation currents of a differential amplifier. An offset corresponding to a voltage difference between first and second offset control voltages applied from voltage generating circuits are provided between passing currents of the first and second data lines, and a reference current passing through the dummy cell is set to a level intermediate between two kinds of levels corresponding to storage data of a data read current passing through the selected memory cell.

25 Claims, 29 Drawing Sheets

THIN FILM MAGNETIC MEMORY DEVICE PROVIDED WITH A DUMMY CELL FOR DATA READ REFERENCE

BACKGROUND OF THE INVENTION

1. Field of the Invention

The present invention relates to a thin film magnetic memory device, and particularly to a thin film magnetic memory device provided with memory cells having MTJs (magnetic tunnel junctions).

2. Description of the Background Art

Attention is being given to an MRAM device as a memory device, which can nonvolatilely store data with low power consumption. The MRAM device is a memory device, in which a plurality of thin film magnetic members are formed in a semiconductor integrated circuit for nonvolatilely storing data, and random access to each thin film magnetic member is allowed.

Particularly, in recent years, it has been announced that a performance of the MRAM device can be dramatically improved by using the thin film magnetic members, which utilize the magnetic tunnel junctions, as memory cells. The MRAM device with memory cells having the magnetic tunnel junctions has been disclosed in technical references such as "A 10 ns Read and Write Non-Volatile Memory Array Using a Magnetic Tunnel Junction and FET Switch in Each Cell", ISSCC Digest of Technical Papers, TA7.2, February 2000, "Nonvolatile RAM based on Magnetic Tunnel Junction Elements", ISSCC Digest of Technical Papers, TA7.3, February 2000, and "A 256 kb 3.0V 1T1MTJ Nonvolatile Magnetoresistive RAM", ISSCC Digest of Technical Papers, TA7.6, February 2001.

FIG. 30 conceptually shows a structure of a memory cell, which has a magnetic tunneling junction, and may be merely referred to as an "MTJ memory cell" hereinafter.

Referring to FIG. 30, a MTJ memory cell includes a tunneling magneto-resistance element TMR having an electric resistance, which is variable in accordance with a data level of magnetically written storage data, and an access transistor ATR. Access transistor ATR is located between a bit line BL and a source voltage line SRL, and is connected in series to tunneling magneto-resistance element TMR. Typically, access transistor ATR is formed of a field-effect transistor arranged on a semiconductor substrate.

For the MTJ memory cell, the device includes bit line BL and a digit line DL for carrying a data write current in different directions during a data write operation, respectively, a read word line RWL for instructing data reading, and source voltage line SRL for puling down tunneling magneto-resistance element TMR to a predetermined voltage Vss (e.g., ground voltage) during a data read operation. In the data read operation, tunneling magneto-resistance element TMR is electrically coupled between source voltage line SRL and bit line BL in response to turn-on of access transistor ATR.

FIG. 31 conceptually shows an operation of writing data in the MTJ memory cell.

Referring to FIG. 31, tunneling magneto-resistance element TMR has a ferromagnetic material layer FL, which has a fixed and uniform magnetization direction, and may be merely referred to as a "fixed magnetic layer" hereinafter, and a ferromagnetic material layer VL, which is magnetized in a direction depending on an externally applied magnetic field, and may be merely referred to as a "free magnetic layer" hereinafter. A tunneling barrier (tunneling film) TB formed of an insulator film is disposed between fixed magnetic layer FL and free magnetic layer VL. Free magnetic layer VL is magnetized in the same direction as fixed magnetic layer FL or in the opposite direction in accordance with the level of the storage data to be written. Fixed magnetic layer FL, tunneling barrier TB and free magnetic layer VL form a magnetic tunnel junction.

Tunneling magneto-resistance element TMR has an electric resistance, which is variable depending on a correlation in magnetization direction between fixed magnetic layer FL and free magnetic layer VL. More specifically, the electric resistance value of tunneling magneto-resistance element TMR takes a minimum value Rmin when the magnetization directions of fixed magnetic layer FL and free magnetic layer VL are equal (parallel) to each other. When the magnetization directions of them are opposite (anti-parallel) to each other, the above electric resistance value takes a maximum value Rmax.

In the data write operation, read word line RWL is inactive, and access transistor ATR is off. In this state, the data write currents for magnetizing free magnetic layer VL are supplied to bit line BL and digit line DL in directions depending on the level of write data, respectively.

FIG. 32 conceptually shows a relationship between the data write current and the magnetization direction of the tunneling magneto-resistance element in the data write operation.

Referring to FIG. 32, an abscissa H(EA) gives a magnetic field, which is applied in an easy axis (EA) to free magnetic layer VL of tunneling magneto-resistance element TMR. An ordinate H(HA) indicates a magnetic field acting in a hard axis (HA) on free magnetic layer VL. Magnetic fields H(EA) and H(HA) correspond to two magnetic fields produced by currents flowing through bit line BL and digit line DL, respectively.

In the MTJ memory cell, the fixed magnetization direction of fixed magnetic layer FL is parallel to the easy axis of free magnetic layer VL, and free magnetic layer VL is magnetized in the easy axis direction, and particularly in the same parallel direction, which is the same direction as fixed magnetic layer FL, or in the anti-parallel direction, which is opposite to the above direction, depending on the level ("1" or "0") of the storage data. The MTJ memory cell can selectively store data ("1" and "0") of one bit corresponding to the two magnetization directions of free magnetic layer VL.

The magnetization direction of free magnetic layer VL can be rewritten only when a sum of applied magnetic fields H(EA) and H(HA) falls within a region outside an asteroid characteristic line shown in FIG. 32. Therefore, the magnetization direction of free magnetic layer VL does not switch when the data write magnetic fields applied thereto have intensities corresponding to a region inside the asteroid characteristic line.

As can be seen from the asteroid characteristic line, the magnetization threshold required for switching the magnetization direction along the easy axis can be lowered by applying the magnetic field in the direction of the hard axis to free magnetic layer VL.

When the operation point in the data write operation is designed, for example, as shown in FIG. 32, the data write magnetic field in the MTJ cell selected as a data write target is designed such that the data write magnetic field in the direction of the easy axis has an intensity of $H_{WR}$. Thus, the data write current flowing through bit line BL or digit line DL is designed to take a value, which can provide the data write magnetic field of $H_{WR}$. In general, data write magnetic field $H_{WR}$ is represented by a sum of a switching magnetic field $H_{SW}$ required for switching the magnetization direction and a margin $\Delta H$. Thus, it is represented by an expression of $H_{WR}=H_{SW}+\Delta H$.

For rewriting the storage data of the MTJ memory cell, i.e., the magnetization direction of tunneling magneto-resistance element TMR, it is necessary to pass the data write currents at a predetermined level or higher through digit line DL and bit line BL. Thereby, free magnetic layer VL in tunneling magneto-resistance element TMR is magnetized in the parallel direction as fixed magnetic layer FL or anti-parallel direction in accordance with the direction of the data write magnetic field along the easy axis (EA). The magnetization direction, which was once written into tunneling magneto-resistance element TMR, and thus the storage data of MTJ memory cell is held nonvolatilely until next data writing is executed.

FIG. 33 conceptually shows an operation of reading data from the MTJ memory cell.

Referring to FIG. 33, access transistor ATR is turned on in response to activation of read word line RWL in the data read operation. Thereby, tunneling magneto-resistance element TMR is electrically coupled to bit line BL while being pulled down with predetermined voltage Vss (ground voltage GND).

In this state, bit line BL is pulled up with another predetermined voltage, whereby a current path including bit line BL and tunneling magneto-resistance element TMR carries a memory cell current Icell corresponding to storage data of the MTJ memory cell. For example, this memory cell current Icell is compared with a predetermined reference current, whereby storage data can be read out from the MTJ memory cell.

As described above, the electric resistance of tunneling magneto-resistance element TMR is variable in accordance with the magnetization direction, which is rewritable by the data write magnetic field applied thereto. Therefore, nonvolatile data storage can be executed by establishing a correlation of electric resistances Rmax and Rmin of tunneling magneto-resistance element TMR with respect to levels ("1" and "0") of the storage data.

As described above, the MRAM device executes the data storage by utilizing a difference $\Delta R$ (=Rmax−Rmin) in junction resistance of tunneling magneto-resistance element TMR corresponding to a difference between storage data levels. Thus, the data read operation is executed based on the detection of passing current Icell of the selected memory cell.

In general, a reference cell is employed independently of the normal MTJ memory cells which are employed for executing the data storage, for producing a reference current to be compared with memory cell current Icell. The reference current produced by the reference cell is designed to take a value intermediate between two kinds of values of memory cell current Icell corresponding to two kinds of electric resistances Rmax and Rmin of the MTJ memory cell, respectively.

More specifically, the reference cell must be produced to have an electric resistance at a level intermediate between electric resistances Rmax and Rmin. However, special designing and manufacturing are required for achieving such electric resistances. This complicates the structure of reference cell so that a chip area may increase, and a working or processing margin of a memory cell array may lower.

Particularly, in a structure including such dummy cells in a region other than a region of the normal memory cells, a current path including the dummy cell is formed in a region spaced from a region, in which a current path including the normal MTJ memory cell selected as the access target is formed. Therefore, influences of noises and others may increase to impair the read margin in the data read operation.

SUMMARY OF THE INVENTION

An object of the invention is to provide a structure of a thin film magnetic memory device, which can execute a data read operation using a reference cell (dummy cell) designed and manufactured similarly to a normal MTJ memory cell.

In summary, a thin film magnetic memory device according to the invention includes a plurality of memory cells, a dummy cell, first and second data lines, a differential amplifier portion and a first offset adjusting circuit. Each of the plurality of memory cells is configured to exhibit an electric resistance corresponding to a magnetization direction, and is magnetized in a direction corresponding to storage data. The dummy cell has a structure and a form similar to those of the memory cell, and is magnetized in advance in a direction corresponding to a predetermined level of the storage data. The first and second data lines are electrically coupled to a fixed voltage via one and the other of the selected memory cell among the plurality of memory cells and the dummy cell in a data read operation, respectively. The differential amplifier portion reads out the storage data based on a comparison between electric resistances of the selected memory cell and the dummy cell. The differential amplifier portion includes a current supply circuit having first and second transistors electrically coupled between an operation voltage and first and second sense nodes, respectively, and each having a gate connected to one of the first and second sense nodes, and a current amplifier circuit having third and fourth transistors electrically coupled between the first and second data lines and the first and second sense nodes, respectively. The first offset adjusting circuit applies first and second offset control voltages to gates of the third and fourth transistors. The differential amplifier portion provides a first offset, when necessary, between passing currents of the first and second data lines such that the passing current of one of the first and second data lines electrically coupled to the dummy cell is set to a level intermediate between two kinds of passing currents respectively corresponding to levels of the storage data on the other of the first and second data lines electrically coupled to the selected memory cell.

According to a major advantage of the invention, therefore, the dummy cell having a structure and a form similar to those of the memory cell can be used for executing data reading corresponding to a comparison between passing currents of the data lines connected to the memory cell and the dummy cell, respectively. Consequently, special design and manufacturing steps are not required for manufacturing the dummy cell. Therefore, such a problem does not occur that complicated structures increase a chip area and impair a processing margin of the memory array and others, and therefore an intended data read margin can be ensure by arranging the normal memory cells and dummy cells in the same memory array.

According to another aspect of the invention, a thin film magnetic memory device includes a plurality of memory cells, a dummy cell, a first voltage line, a second voltage line, first and second data lines, and a data reading portion. Each of the plurality of memory cells is configured to exhibit an electric resistance corresponding to a magnetization direction, and is magnetized in a direction corresponding to storage data. The dummy cell has a structure and a form similar to those of the memory cell, and is magnetized in advance in a direction corresponding to a predetermined level of the storage data. The first voltage line is provided for the plurality of memory cells for transmitting a first predetermined voltage. The second voltage line is provided corresponding to the dummy cell for transmitting a second predetermined voltage different from the first predetermined voltage. The first and second data lines are electrically coupled to the first and second voltage lines via the selected memory cell among the plurality of memory cells and the dummy cell in a data read operation, respectively. The data reading portion performs data reading in accordance with a difference between passing currents of the first and second data lines. The first and second predetermined voltages are determined such that the passing current of the dummy cell attains a level intermediate between two kinds of passing currents corresponding to respective levels of the storage data in the selected memory cell.

According to the thin film magnetic memory device, a structure for providing an offset between the passing currents of the selected memory cell and the dummy cell is not required in data read circuitry, and the data reading can be performed by using the dummy cell of the structure similar to that of the normal MTJ memory cell. Therefore, special design and manufacturing steps are not required for producing the dummy cell so that it is possible to prevent increase in chip area and impairing of a processing margin of a memory array and others, which may be caused by complication of structures, and an intended data read margin can be ensured by arranging the normal memory cells and the dummy cell in the same memory array. Further, a structure of a data read circuit system can be simple.

According to still another aspect of the invention, a thin film magnetic memory device includes a plurality of memory cells, a dummy cell, first and second data lines, and a data reading portion. Each of the plurality of memory cells has a magneto-resistance element configured to be magnetized in a direction corresponding to a level of storage data, and to have either a first or second electric resistance in accordance with the magnetization direction, and an access transistor connected in series to the magneto-resistance element and being selectively turned on in a data read operation. The dummy cell is provided for comparing a passing current with that of the selected memory cell selected as an access target among the plurality of memory cells in the data read operation. The first and second data lines are electrically coupled to a fixed voltage via the selected memory cell and the dummy cell in the data read operation, respectively. The data reading portion performs data reading in accordance with a difference between passing currents of the first and second data lines. The dummy cell includes a dummy magneto-resistance element having a structure and a form similar to those of the magneto-resistance element and being magnetized in advance to have a smaller one between the first and second electric resistances, a dummy access transistor connected in series to the dummy magneto-resistance element, being selectively turned on in the data read operation and being designed similarly to the access transistor, and a dummy resistance adding portion connected in series to the dummy magneto-resistance element, and having an electric resistance smaller than a difference between the first and second electric resistances. The dummy resistance adding portion has at least one transistor designed similarly to the access transistor and having a gate supplied with an adjustable control voltage.

According to the thin film magnetic memory device described above, since the transistor and the dummy access element forming the dummy resistance adding portion are designed to have sizes similar to those of the access element, the dummy cells can be arranged efficiently in accordance with an arrangement pitch of the memory cells. The memory cells and dummy cell are arranged continuously so that lowering of the processing margin of the memory array can be avoided.

According to yet another aspect of the invention, a thin film magnetic memory device includes a memory array, a first voltage line, a second voltage line, a dummy resistance adding portion, first and second data lines, and a data reading portion. The memory array is provided with a plurality of memory cells and a dummy cell for comparing a passing current with that of the selected memory cell selected as an access target among the plurality of memory cells in a data read operation. Each memory cell includes a magneto-resistance element configured to be magnetized in a direction corresponding to a level of storage data and to have either a first or second electric resistance in accordance with the magnetization direction, and an access transistor connected in series to the magneto-resistance element and being selectively turned on in the data read operation. The dummy cell includes a dummy magneto-resistance element having a structure and a form similar to those of the magneto-resistance element, and being magnetized in advance to have fixedly smaller one between the first and second electric resistances, and a dummy access transistor connected in series to the dummy magneto-resistance element, being selectively turned on in the data read operation and being designed similarly to the access transistor. The first voltage line is provided corresponding to the plurality of memory cells for transmitting a fixed voltage. The second voltage line is provided corresponding to the dummy cell for transmitting the fixed voltage. The first and second data lines are electrically coupled to the first and second voltage lines via the selected memory cell and the dummy cell in the data read operation, respectively. The data reading portion performs data reading in accordance with a difference between passing currents of the first and second data lines. The dummy resistance adding portion is located outside the memory array, is connected in series to the second voltage line and has an electric resistance smaller than a difference between the first and second electric resistances.

The thin film magnetic memory device described above is configured such that a composite resistance of the dummy cell and the dummy resistance adding portion arranged outside the memory array takes a value intermediate between two kinds of electric resistances corresponding to the storage data of the selected memory cell. Therefore, a structure for providing an offset between the passing currents of the selected memory cell and the dummy cell is not required in data read circuitry, and the data reading can be performed by using the dummy cell of the structure similar to the normal MTJ memory cell. Therefore, special design, manufacturing steps, magnetizing steps and others are not required for producing the dummy cell so that it is possible to prevent increase in chip area and impairing of a processing margin of the memory array and others, which may be caused by complication of structures, and an intended data read margin can be ensured by arranging the normal memory cells and the dummy cell in the same memory array. Further, a structure of a data read circuit system can be simple.

According to further another aspect of the invention, a thin film magnetic memory device includes a memory array, first and second data lines, a data reading portion, a first resistance adding portion and a second resistance adding portion. The memory array is provided with a plurality of memory cells and a dummy cell for comparing a passing current with that of the selected memory cell selected as an access target among the plurality of memory cells in a data read operation. Each memory cell has a magneto-resistance element configured to be magnetized in a direction corresponding to a level of storage data and to have either a first or second electric resistance in accordance with the magnetization direction, and an access transistor connected in series to the magneto-resistance element and being selectively turned on in the data read operation. The dummy cell includes a dummy magneto-resistance element having a structure and a form similar to those of the magneto-resistance element, and being magnetized in advance to have fixedly smaller one between the first and second electric resistances, and a dummy access transistor connected in series to the dummy magneto-resistance element, being selectively turned on in the data read operation and being designed similarly to the access transistor. The first and second data lines are electrically coupled to a fixed voltage via the selected memory cell and the dummy cell in the data read operation, respectively. The data reading portion performs data reading in accordance with a difference between passing currents of the first and second data lines. The first resistance adding portion is located outside the memory array, and connects a third electric resistance in series to one of the first and second data lines coupled to the selected memory cell. The second resistance adding portion is located outside the memory array, and connects a fourth electric resistance in series to the other of the first and second data lines connected to the dummy cell. The third and fourth electric resistances are determined such that a sum of an electric resistance of the dummy cell and the fourth electric resistance attains a level intermediate between a sum of the first and third electric resistances and a sum of the second and third electric resistances.

According to the thin film magnetic memory device described above, the first and second resistance adding portions arranged outside the memory array are connected in series to the selected memory cell and the dummy cell, respectively, so that the passing current of the dummy cell is set to the level intermediate between the two kinds of passing currents of the selected memory cell. Therefore, a structure for providing an offset between the passing currents of the selected memory cell and the dummy cell is not required in data read circuitry, and the data reading can be performed by using the dummy cell of the structure similar to that of the normal MTJ memory cell. Consequently, special design and manufacturing steps are not required for producing the dummy cell so that it is possible to prevent increase in chip area and impairing of a processing margin of the memory array and others, which may be caused by complication of structures, and an intended data read margin can be ensured by arranging the normal memory cells and the dummy cell in the same memory array. Further, a structure of a data read circuit system can be simple.

According to further another aspect of the invention, a thin film magnetic memory device includes a memory array, first and second data lines, a data reading portion and a resistance adding portion. The memory array is provided with a plurality of memory cells and a dummy cell for comparing a passing current with that of the selected memory cell selected as an access target among the plurality of memory cells in a data read operation. Each memory cell includes a magneto-resistance element configured to be magnetized in a direction corresponding to a level of storage data and to have either a first or second electric resistance in accordance with the magnetization direction, and an access transistor connected in series to the magneto-resistance element, and being selectively turned on in the data read operation. The dummy cell includes a dummy magneto-resistance element having a structure and a form similar to those of the magneto-resistance element, and being magnetized in advance to have fixedly smaller one between the first and second electric resistances, and a dummy access transistor connected in series to the dummy magneto-resistance element, being selectively turned on in the data read operation and being designed similarly to the access transistor. The first and second data lines are electrically coupled to a fixed voltage via the selected memory cell and the dummy cell in the data read operation, respectively. The data reading portion performs data reading in accordance with a difference between passing currents of the first and second data lines. The resistance adding portion is located outside the memory array to connect in parallel a third electric resistance to one of the first and second data lines. The third electric resistance is determined such that an electric resistance of the dummy cell attains a level intermediate between a composite resistance of the first and third electric resistances connected in parallel and a composite resistance of the second and third electric resistances connected in parallel.

According to the thin film magnetic memory device described, the resistance adding portion arranged outside the memory array is connected in parallel to predetermined one of the selected memory cell and the dummy cell so that the passing current of the dummy cell is set to a level intermediate between the two kinds of passing currents. Therefore, a structure for providing an offset between the passing currents of the selected memory cell and the dummy cell is not required in data read circuitry, and the data reading can be performed by using the dummy cell of the structure similar to that of the normal MTJ memory cell. Consequently, special design and manufacturing steps are not required for producing the dummy cell so that it is possible to prevent problems such as increase in chip area and impairing of a processing margin of the memory array and others, which may be caused by complication of structures, and an intended data read margin can be ensured by arranging the normal memory cells and the dummy cell in the same memory array. Further, a structure of a data read circuit system can be simple.

According to a further aspect of the invention, a thin film magnetic memory device includes a memory array, first and second data lines, a data reading portion and a bias magnetic field applying portion. The memory array is provided with a plurality of memory cells and a dummy cell for comparing a passing current with that of the selected memory cell selected as an access target among the plurality of memory cells in a data read operation. Each memory cell includes a magneto-resistance element configured to have an electric resistance changing in accordance with a magnetization direction, and being magnetized in a positive or negative direction along an easy axis in accordance with a level of storage data, and an access transistor connected in series to the magneto-resistance element, and being selectively turned on in the data read operation. The dummy cell includes a dummy magneto-resistance element having a structure and a form similar to those of the magneto-resistance element, and being magnetized in advance in the positive or negative direction, and a dummy access transistor connected in series to the dummy magneto-resistance element, being selectively turned on in the data read operation and being designed and produced similarly to the access transistor. The first and second data lines are electrically coupled to a fixed voltage via the selected memory cell and the dummy cell in the data read operation, respectively. The data reading portion performs data reading in accordance with a difference between passing currents of the first and second data lines. The bias magnetic field applying portion applies a bias magnetic field along a hard axis to the dummy magneto-resistance element in the data read operation.

According to the thin film magnetic memory device described above, such a structure is not employed that a dummy resistance is connected in series or parallel to a current path including the dummy cell and a current path including the selected memory cell, and also it is not necessary to employ a structure for providing an offset between passing currents of the dummy cell and selected memory cell. Without employing such structures, the data reading can be executed in accordance with the passing current difference between the dummy cell, which is designed and produced similarly to the normal memory cell, and the selected memory cell. Since special design and manufacturing steps are not required for producing the dummy cell, it is possible to prevent problems such as increase in chip area and impairing of a processing margin of the memory array and others, which may be caused by complication of structures, and an intended data read margin can be ensured by arranging the normal memory cells and the dummy cell in the same memory array. Further, a structure of a data read circuit system can be simple.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the figures, the same or corresponding portions bear the same reference numbers.

First Embodiment

Figure 1:
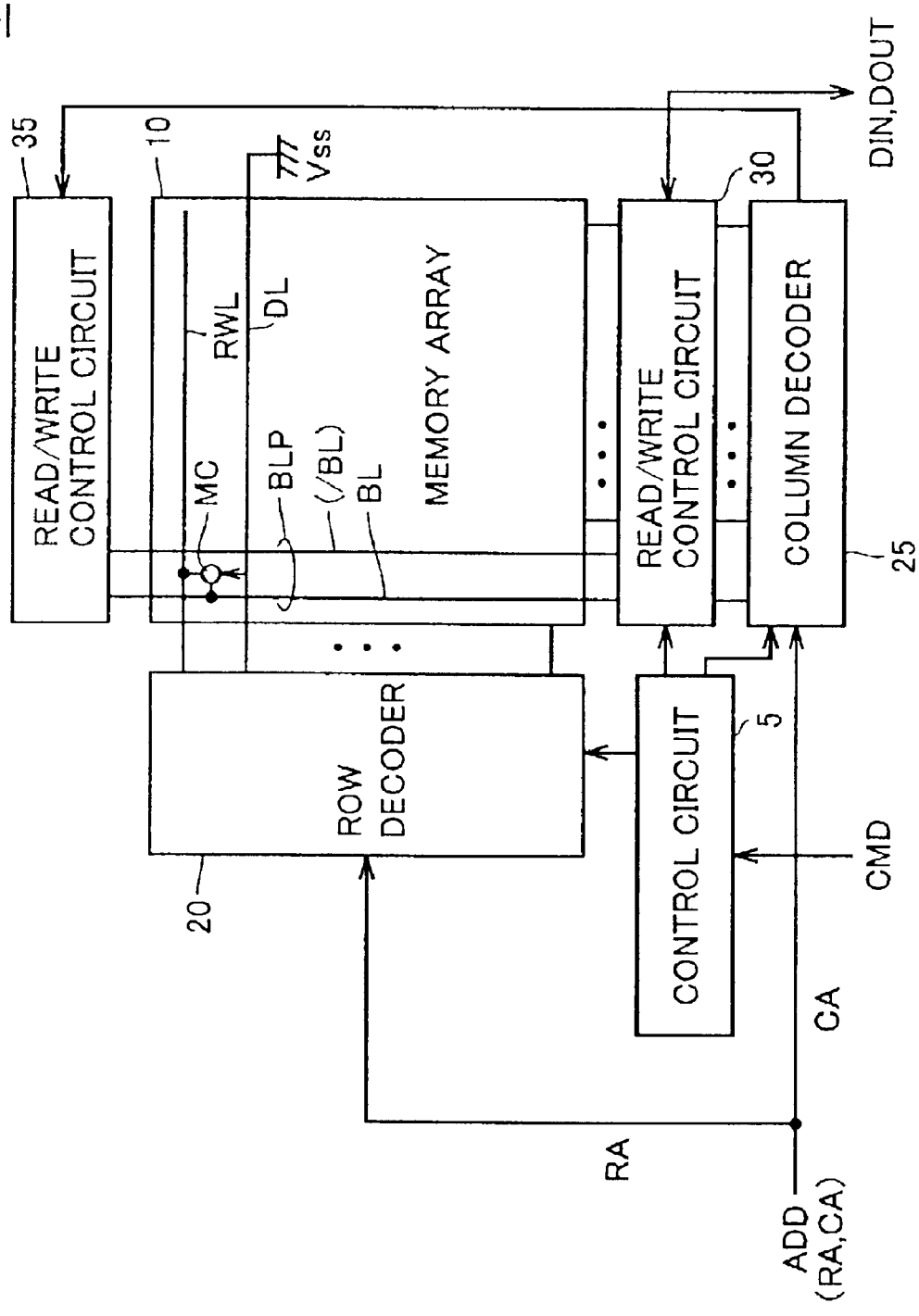
FIG. 1 is a schematic block diagram showing a whole structure of an MRAM device according to an embodiment of the invention.

Referring to FIG. 1, an MRAM device 1 according to a first embodiment of the invention executes random access in response to a control signal CMD and an address signal ADD, which are externally applied, and executes input of write data DIN and output of read data DOUT.

MRAM device 1 includes a control circuit 5 for controlling a whole operation of MRAM device 1 in response to control signal CMD, and a memory array 10 having a plurality of MTJ memory cells arranged in rows and columns.

In memory array 10, a read word line RWL and a digit line DL are arranged corresponding to each row of the MTJ memory cells, and a bit line BL is arranged corresponding to each column of the MTJ memory cells. Alternatively, a bit line pair BLP formed of bit lines BL and /BL may be arranged corresponding to each memory cell column for providing a folded bit line structure. FIG. 1 representatively shows one MTJ memory cell MC as well as an arrangement of read word line RWL, digit line DL and bit line BL (or bit line pair BLP) provided for MTJ memory cell MC.

MRAM device 1 further includes a row decoder 20, which decodes a row address RA represented by an address signal to execute row selection in memory array 10, a column decoder 25, which decodes a column address CA represented by address signal ADD to execute column selection in memory array 10, and read/write control circuits 30 and 35.

Each of read/write control circuits 30 and 35 is formed of a collection of circuits for performing data writing on memory array 10 as well as a collection of circuits (which may also be referred to as a "data read circuit system" hereinafter) for reading data from memory array 10.

Digit line DL is coupled to predetermined voltage Vss (e.g., ground voltage) in a region remote from row decoder 20 with memory array 10 therebetween.

Figure 2:
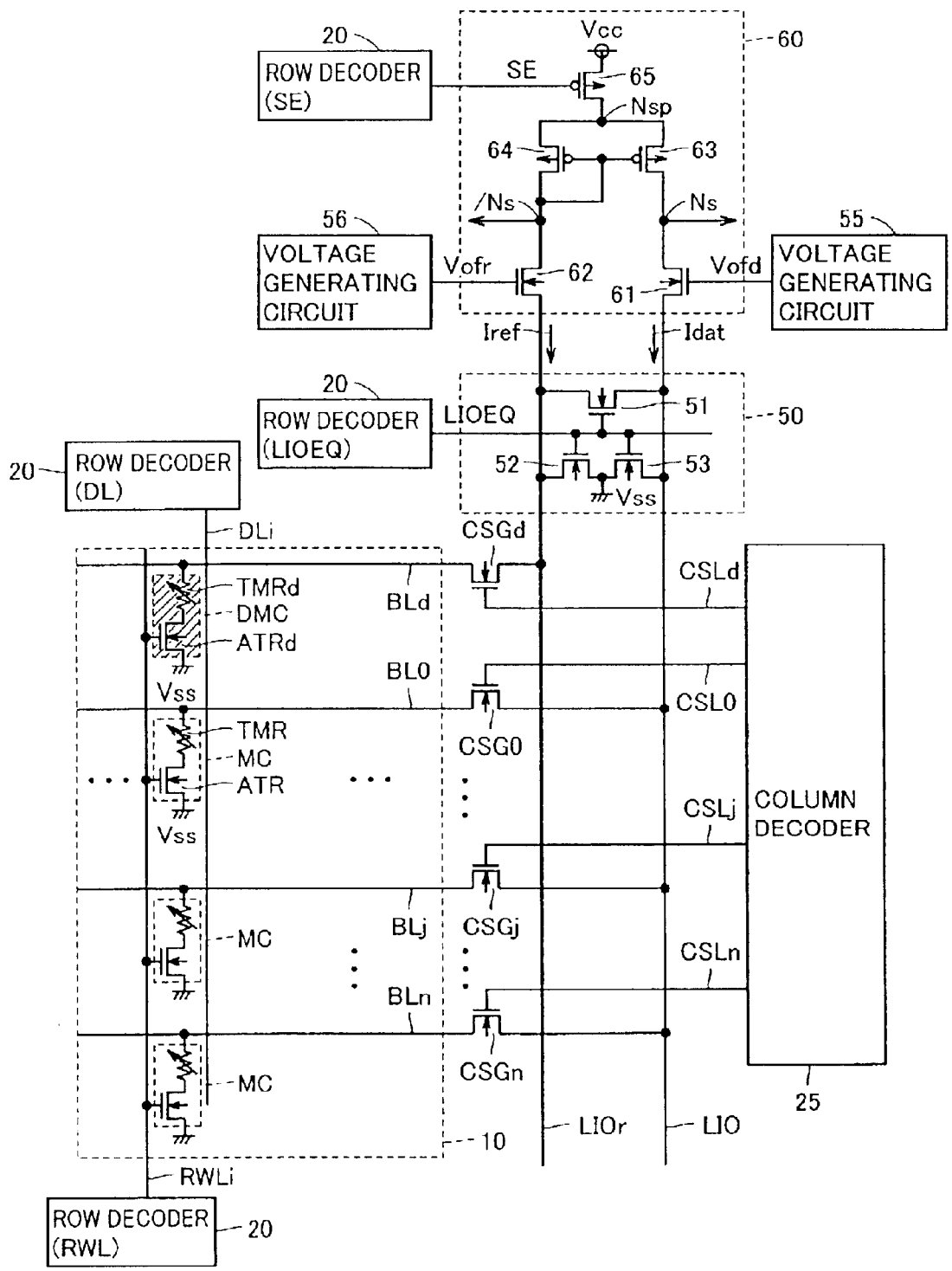
FIG. 2 is a circuit diagram showing a structure of a data read circuit system according to a first embodiment for executing data reading in a memory array.

FIG. 2 shows a structure of a data read circuit system for executing data reading in the memory array according to the first embodiment.

Figure 30:
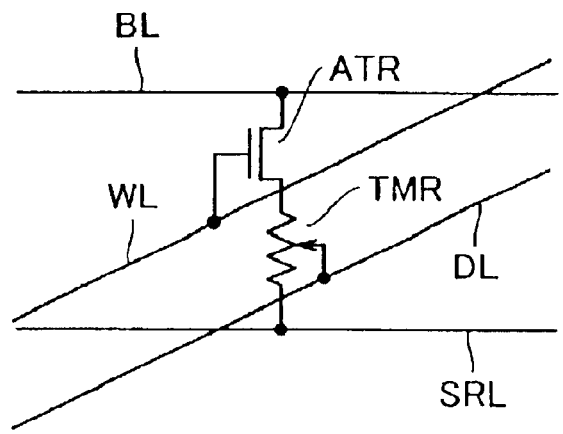
FIG. 30 conceptually shows a structure of an MTJ memory cell.

Referring to FIG. 2, memory array 10 has a plurality of normal MTJ memory cells MC, which are arranged in rows and columns and each can store data of one bit. Normal MTJ memory cells MC may be merely referred to as "normal memory cells MC" hereinafter. Each normal memory cell MC has a structure similar to that shown in FIG. 30, and includes a tunneling magneto-resistance element TMR and an access transistor (access element) ATR connected together in series. Access transistor ATR has a gate connected to corresponding read word line RWL. Tunneling magneto-resistance element TMR is magnetized in a direction corresponding to storage data ("1" or "0"), and has an electric resistance Rmax or Rmin.

In the strict sense, each normal memory cell has an electric resistance, which is equal to a sum of tunneling magneto-resistance element TMR, an on-resistance of access transistor ATR and other parasitic resistances. However, resistances other than that of tunneling magneto-resistance element TMR are constant independent of storage data. In the following description, therefore, two kinds of electric resistances of the normal memory cell corresponding to the storage data are also expressed by "Rmax" and "Rmin", and a difference between them is expressed by "ΔR" (i.e., ΔR=Rmax−Rmin).

Memory array 10 further includes a plurality of dummy cells DMC. Each dummy cell DMC is provided for comparing a passing current with respect to the normal memory cell, which is selected as an access target (and may also be referred to as a "selected memory cell" hereinafter). Each dummy cell DMC has a structure and a form similar to those of normal memory cell MC, and is formed of a dummy magneto-resistance element TMRd and a dummy access element ATRd.

Dummy magneto-resistance element TMRd is designed and produced similarly to tunneling magneto-resistance element TMR in normal memory cell MC, and storage data "1" or "0" can written in advance in dummy magneto-resistance element TMRd. Dummy access element ATRd is designed and produced similarly to access transistor ATR in normal memory cell MC. Dummy access element ATRd and access transistor ATR are designed to have on-resistances at substantially the same level as well as substantially the same transistor sizes. Accordingly, dummy cell DMC has an electric resistance substantially equal to one of the two kinds of electric resistances Rmax and Rmin of the normal memory cell.

Since dummy cell DMC has a structure and a form similar to those of normal memory cell MC, dummy cells DMC can be arranged in memory array 10, and particularly can be located continuously to normal memory cells MC to form the same rows and/or columns. In the structure of the first embodiment, dummy cells DMC form a dummy cell column, and share the memory cell rows with normal memory cells MC.

Read word line RWL and digit line DL are arranged for each memory cell row shared by normal memory cells MC and dummy cell DMC. Conversely, each column of normal memory cells MC (i.e., each normal memory cell column) is independent of the dummy cell column so that bit line BL is arranged for each normal memory cell column, and a dummy bit line BLd is arranged for the dummy cell column.

FIG. 2 representatively shows read word line RWLi, digit line DLi, bit lines BL0, BLj and BLn and dummy bit line BLd, which correspond to the memory cell row in an ith (i: natural number) position and the memory cell columns in the first, jth (j: natural number) and last positions, as well as normal memory cells MC and dummy cell DMC corresponding to these row and columns.

In the following description, binary voltage states, i.e., a high voltage state (e.g., power supply voltage Vcc) and a low voltage state (e.g., predetermined voltage Vss) of signals, signal lines, data and others may also be referred to as "H-level" and "L-level", respectively.

Data lines LIO and LIOr are arranged adjacent to memory array 10. In each memory cell column, a column select gate CSG is arranged between bit line BL and data line LIO, and a dummy column select gate CSGd is arranged between dummy bit line BLd and data line LIOr. Column select gate CSG is turned on in response to activation (H-level) of corresponding column select line CSL. Dummy column select gate CSGd is turned on in response to activation (H-level) of dummy column select line CSLd.

FIG. 2 representatively shows column select lines CSL0, CSLj and CSLn, dummy column select line CSLd, column select gates CSG0, CSGj and CSGn, and dummy column select gate CSGd, which are provided corresponding to bit lines BL0, BLj and BLn as well as dummy bit line BLd.

Row decoder 20 responds to row address RA by selectively activating read word line RWL to attain H-level in a data read operation, and selectively activating digit line DL to attain H-level in a data write operation. Active digit line DLi has one end connected to power supply voltage Vcc by row decoder 20, and also has the other end connected to predetermined voltage Vss as shown in FIG. 1 so that a data write current Ip can flow through the digit line in the selected row. Although the data write operation will not be described in detail, the data write current is passed in the direction corresponding to the write data level through the bit line in the selected column, and thereby data can be written into the memory cell corresponding to the digit and bit lines, both of which are supplied with the data write currents.

In the data read operation, column decoder 25 selectively activates (H-level) column select line CSL and dummy column select line CSLd in accordance with the results of column selection.

Further, the structure in FIG. 2 is provided with a data line equalize circuit 50 for precharging and equalizing data lines LIO and LIOr, and a differential amplifier 60 for executing the data reading based on the electric resistance difference between the selected memory cell and the dummy cell.

Data line equalize circuit 50 has a transistor switch 51 connected between data lines LIO and LIOr, a transistor switch 52 connected between data line LIOr and predetermined voltage Vss, and a transistor switch 53 connected between data line LIO and predetermined voltage Vss. Each of transistor switches 51, 52 and 53 is formed of, e.g., an N-type MOS transistor.

Each of transistor switches 51–53 is supplied with a data line equalize signal LIOEQ produced by row decoder 20. Data line equalize signal LIOEQ is activated to attain H-level at least for a predetermined period before the data reading. In response to this activation, the precharging and equalizing operation is performed to set each of data lines LIO and LIOr to predetermined voltage Vss.

Differential amplifier 60 includes an N-type MOS transistor 61 connected between a sense node Ns and data line LIO, an N-type MOS transistor 62 connected between a sense node /Ns and data line LIOr, a P-type MOS transistor 63 connected between a node Nsp and sense node Ns, a P-type MOS transistor 64 connected between node Nsp and a sense node /Ns, and a P-type MOS transistor 65 connected between power supply voltage Vcc supplied as an operation voltage and node Nsp.

Transistors 63 and 64 have gates connected to one of sense nodes Ns and /Ns. FIG. 2 shows by way of example a structure, in which each of the gates of transistors 63 and 64 is connected to sense node/Ns. Transistors 63 and 64 form a current mirror circuit for supplying the same current to sense nodes Ns and /Ns.

Transistors 61 and 62 have gates receiving offset control voltages Vofd and Vofr, which are produced by voltage generating circuits 55 and 56 forming an offset adjusting circuit, respectively. Transistors 61 and 62 maintain data lines LIO and LIOr at levels not exceeding offset control voltages Vofd and Vofr, respectively, and amplify a passing current difference between data lines LIO and LIOr to covert it into a voltage difference between sense nodes Ns and /Ns.

Transistor 65 receives on its gate a sense enable signal/SE, which is activated to attain L-level by row decoder 20 in the data read operation. For example, in the structure provided with a plurality of data read circuit systems each having a structure shown in FIG. 2, row decoder 20 selectively activates sense enable signal/SE by reflecting the results of selection of these plurality of data read circuit systems. In response to activation (L-level) of sense enable signal/SE, transistor 65 supplies the operation current to operate differential amplifier 60.

Figure 3:
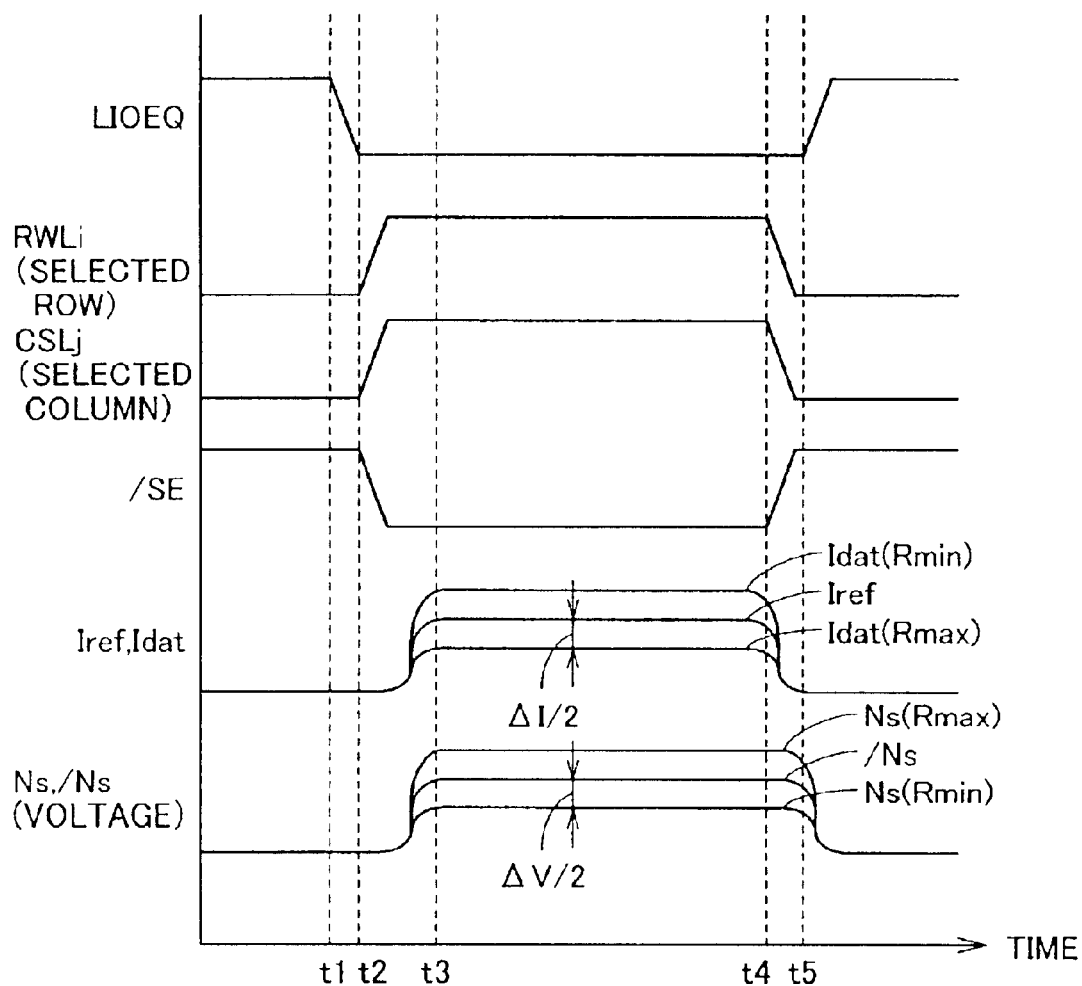
FIG. 3 is an operation waveform diagram illustrating a data read operation by a data read circuit system according to the first embodiment.

Referring to FIG. 3, description will now be given on the data read operation in the MRAM device according to the first embodiment. FIG. 3 representatively illustrates the operation in the case where the normal memory cell in the ith row and jth column is selected as the data read target.

Referring to FIG. 3, data line equalize signal LIOEQ is active and at H-level before a time t1 of start of the data read operation. Thereby, data lines LIO and LIOr have been precharged to predetermined voltage Vss.

When the data read operation starts at time t1, data line equalize signal LIOEQ is first inactivated to attain L-level so that data lines LIO and LIOr are isolated from predetermined voltage Vss. Thereby, preparation for starting the data reading is completed.

At a time t2, sense enable signal/SE is activated to attain L-level so that differential amplifier 60 starts the operation. Thereby, current supply to each of data lines LIO and LIOr starts. In accordance with the same timing, read word line RWLi in the selected row and column select line CSLj in the selected column are activated to attain H-level.

In response to the activation of read word line RWLi in the selected row and column select line CSLj in the selected column, data line LIO is electrically coupled to predetermined voltage Vss via bit line BLj and the selected memory cell, and data line LIOr is electrically coupled to predetermined voltage Vss via dummy bit line BLd and dummy cell DMC. In the structure according to the first embodiment, a connection relationship of data lines LIO and LIOr with respect to the selected memory cell and the dummy cell is fixed. Thus, data lines LIO and LIOr are electrically coupled to the selected memory cell and the dummy cell in the data read operation regardless of the results of address selection.

As already described, the selected memory cell has the electric resistance of Rmax or Rmin corresponding to the storage data. Therefore, a passing current Idat of data line LIO electrically coupled to the selected memory cell takes a value of either Idat(Rmax) or Idat(Rmin) corresponding to the storage data. In the following description, passing current Idat of the data line electrically coupled to the selected memory cell will be referred to as "data read current Idat", and a difference between two kinds of data read currents Idat(Rmax) and Idat(Rmin) is expressed by ΔI. Thus, a relationship of (ΔI=Idat(Rmin)−Idat(Rmax)) is present.

A passing current Iref of data line LIOr is set to an intermediate level between Idat(Rmax) and Idat(Rmin), and preferably is set to satisfy the following formula (1). In the following description, passing current Iref of the data line electrically coupled to the dummy cell may also be referred to as "reference current Iref". In other words, differential amplifier 60 must apply an offset to the passing currents of data lines LIO and LIOr to satisfy the following formula (1).

$$Idat\ (Rmax)+\Delta I/2=Iref=Idat(Rmin)-\Delta I/2 \qquad (1)$$

For example, offset control voltages Vofd and Vofr, which are produced by voltage generating circuits 55 and 56, are set to different levels for applying the above offset, respectively.

More specifically, if the electric resistance of the dummy cell is set in advance to Rmin, offset control voltage Vofr is set to (Vofd−Vα) for providing an offset, which reduces reference current Iref, i.e., the passing current of data line LIOr by ΔI/2. Thereby, the gate voltage of transistor 62 electrically coupled to the dummy cell becomes lower than the gate voltage of transistor 61 electrically coupled to the selected memory cell so that the foregoing offset can be provided. A difference Vα between offset control voltages Vofr and Vofd is adjusted corresponding to the foregoing difference of ΔI/2.

Conversely, if the electric resistance of the dummy cell is set in advance to Rmax, offset control voltage Vofr is set to (Vofd+Vα) for providing an offset, which increases reference current Iref, i.e., the passing current of data line LIOr by ΔI/2. Thereby, the gate voltage of transistor 62 electrically coupled to the dummy cell becomes higher than the gate voltage of transistor 61 electrically coupled to the selected memory cell so that the foregoing offset can be applied. Difference Vα between offset control voltages Vofr and Vofd is likewise adjusted corresponding to the foregoing difference of ΔI/2.

Another structure may be employed for providing the foregoing offset by differential amplifier 60. For this, transistors 63 and 64 forming the current mirror may be configured to have different current drive capabilities (transistor sizes), respectively. In this structure, offset control voltages Vofd and Vofr are set to a common level.

More specifically, if the dummy cell has the electric resistance preset to Rmin, the current drive capability (transistor size) of transistor 64 is designed to be smaller than the current drive capability (transistor size) of transistor 63 for providing the offset reducing the passing current (reference current Iref) of data line LIOr by ΔI/2. Conversely, if the dummy cell has the electric resistance preset to Rmax, the current drive capability (transistor size) of transistor 64 is designed to be larger than the current drive capability (transistor size) of transistor 63 for providing the offset increasing the passing current (reference current Iref) of data line LIOr by ΔI/2.

Between times t3 and t4, differential amplifier 60 amplifies current difference ΔI/2, which is produced between data read current Idat and reference current Iref by the foregoing offset based on the electric resistances of the selected memory cell and the dummy cell, and converts it into voltage difference ΔV/2 between sense nodes Ns and /Ns. Since this voltage difference ΔV/2 has a polarity corresponding to the storage data of the selected memory cell, the storage data of the selected memory cell can be detected from the voltages on sense nodes Ns and /Ns.

When the data reading ends at a time t4, sense enable signal/SE, read word line RWLi in the selected row and column select line CSLj in the selected column become inactive. At a time t5, data line equalize signal LIOEQ is activated to attain H-level so that data lines LIO and LIOr are precharged again, and the circuit state before the data reading is attained again.

According to the structure of the first embodiment, as described above, since the dummy cell for generating the reference current can have the structure and form similar to those of the normal memory cell, the dummy cell can be formed by partially using the MTJ memory cells, which are produced continuously in the same memory array. Thus, special design and manufacturing steps are not required for producing the dummy cell so that it is possible to avoid problems such as increase in chip area and impairing of a processing or working margin of the memory array and others due to complication of the structures, and an intended data read margin can be ensured by arranging the normal memory cells and dummy cells in the same memory array.

Further, the operation current of differential amplifier 60 is used as the passing currents of the selected memory cell and the dummy cell so that the circuit elements in the data read circuit system can be reduced in number. Furthermore, without complicating the circuit structure, it is possible to provide the offset, which causes the passing current difference of the polarity corresponding to the storage data level, between the selected memory cell and the dummy cell having similar characteristics.

First Modification of the First Embodiment

Figure 4:
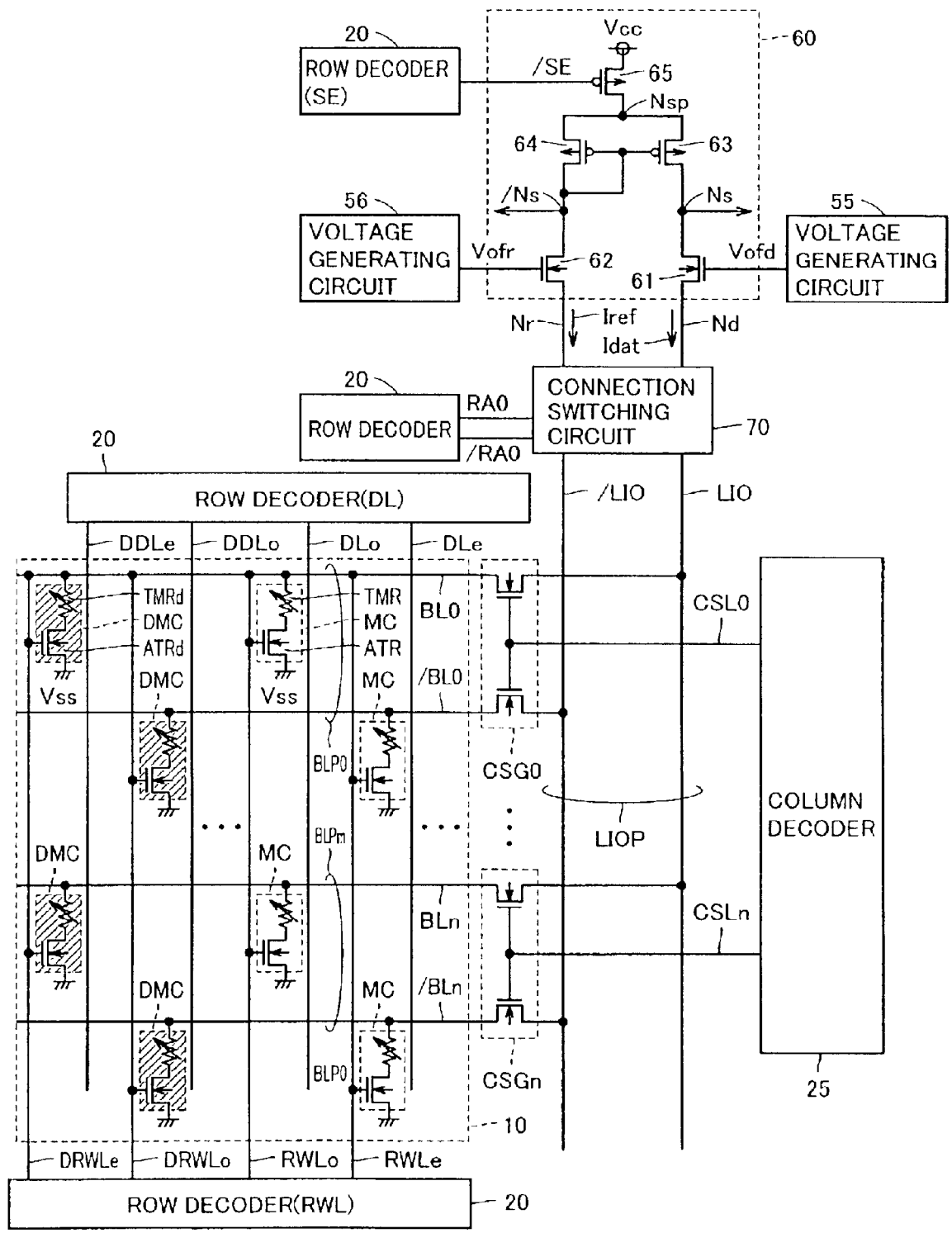
FIG. 4 is a circuit diagram showing a structure of a data read circuit system according to a first modification of the first embodiment.

Referring to FIG. 4, a structure of a first modification of the first embodiment differs from the structure of the first embodiment shown in FIG. 2 in that memory array 10 has a so-called "folded bit line structure", and a connection switching circuit 70 is additionally employed.

In memory array 10, bit line pairs BLP each formed of complementary bit lines BL and /BL are arranged corresponding to the memory cell columns, respectively. Normal memory cells MC in alternate rows are arranged in a zigzag fashion with respect to those in neighboring rows so that normal memory cells MC in odd-numbered rows are connected to bit lines BL, and normal memory cells MC in even-numbered rows are connected to bit lines /BL.

Dummy cells DMC are arranged to form a matrix in memory array 10 together with normal memory cells MC neighboring thereto. Dummy cells DMC form two dummy cell rows corresponding to the odd-numbered and even-numbered rows, respectively, and share the memory cell columns with normal memory cells MC.

Accordingly, complementary bit lines BL and /BL arranged in each memory cell column are shared by normal memory cell MC and dummy cell DMC. The rows of normal memory cells MC, which may also be referred to as "normal memory cell rows", are independent of the dummy cell rows, and read word line RWL and digit line DL are arranged for each normal memory cell row. Dummy read word lines DRWLe and DRWLo as well as dummy digit lines DDLe and DDLo are arranged corresponding to the two dummy cell rows.

FIG. 4 representatively shows one even-numbered row and one odd-numbered row of the normal memory cells as well as two dummy cell rows, and also shows read word lines RWLe and RWLo, digit lines DLe and DLo, dummy read word lines DRWLe and DRWLo, dummy digit lines DDLe and DDLo, and bit line pairs BLP0 and BLPn as well as normal memory cells MC and dummy cells DMC corresponding to them.

The dummy cells in a group corresponding to dummy read word line DRWLe are connected between bit line BL and predetermined voltage Vss. The dummy cells in a group corresponding to dummy read word line DRWLo are connected between bit line /BL and predetermined voltage Vss.

Complementary data lines LIO and /LIO forming data line pair/IOP neighbors to memory array 10. Column select gates CSG0–CSGn arranged corresponding to the memory cell columns are arranged between data line pair/IOP and the corresponding bit line pairs BLP0–BLPn, respectively. In the data read operation, therefore, complementary bit lines BL and /BL corresponding to the selected column are electrically coupled to data lines LIO and /LIO, respectively. Thus, in the case where the memory array has the folded bit line structure, a connection relationship of data lines LIO and /LIO with respect to the selected memory cell and the dummy cell DMC is not fixed, and is variable depending on which one between the odd-numbered row and even-numbered row is selected. More specifically, when the odd-numbered row is selected, data lines LIO and /LIO are electrically coupled to the selected memory cell and the dummy cell via bit lines BL and /BL, respectively. Conversely, when the even-numbered row is selected, data lines LIO and /LIO are electrically coupled to the dummy cell and the selected memory cell via bit lines BL and /BL, respectively.

In accordance with the above coupling, connection switching circuit 70 switches the connection relationship between differential amplifier 60 and data lines LIO and /LIO in accordance with the results of address selection, i.e., depending on which one between the odd- and even-numbered rows is selected. Connection switching circuit 70 is arranged between nodes Nd and Nr on source sides of transistors 61 and 62, which are supplied with data read current Idat and reference current Iref, respectively, and data lines LIO and /LIO.

Figure 5:
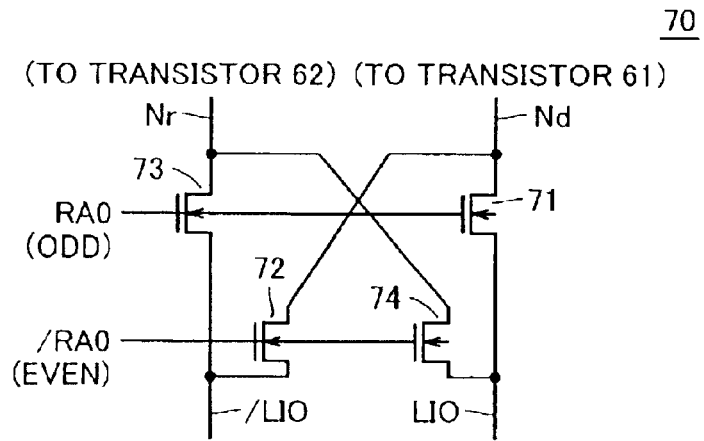
FIG. 5 is a circuit diagram showing a structure of a connection switching circuit shown in FIG. 4.

FIG. 5 is a circuit diagram illustrating a structure of connection switching circuit 70.

Referring to FIG. 5, connection switching circuit 70, includes an N-type MOS transistor 71 electrically coupled between node Nd and data line LIO, an N-type MOS transistor 72 electrically coupled between node Nd and data line/LIO, an N-type MOS transistor 73 electrically coupled between node Nr and data line/LIO, and an N-type MOS transistor 74 electrically coupled between node Nr and data line LIO. Transistors 71 and 73 have gates receiving an address signal RA0, which is set to H-level ("1") when selecting the odd-numbered row, and is set to L-level ("0") when selecting the even-numbered row. Transistors 72 and 74 have gates receiving an address signal/RA0, which is an inverted signal of address signal RA0.

According to the above structures, the selected memory cell and the dummy cell can be electrically coupled to nodes Nd and Nr supplying data read current Idat and reference current Iref, respectively, regardless of the selected row (i.e., odd- or even-numbered row).

Figure 6:
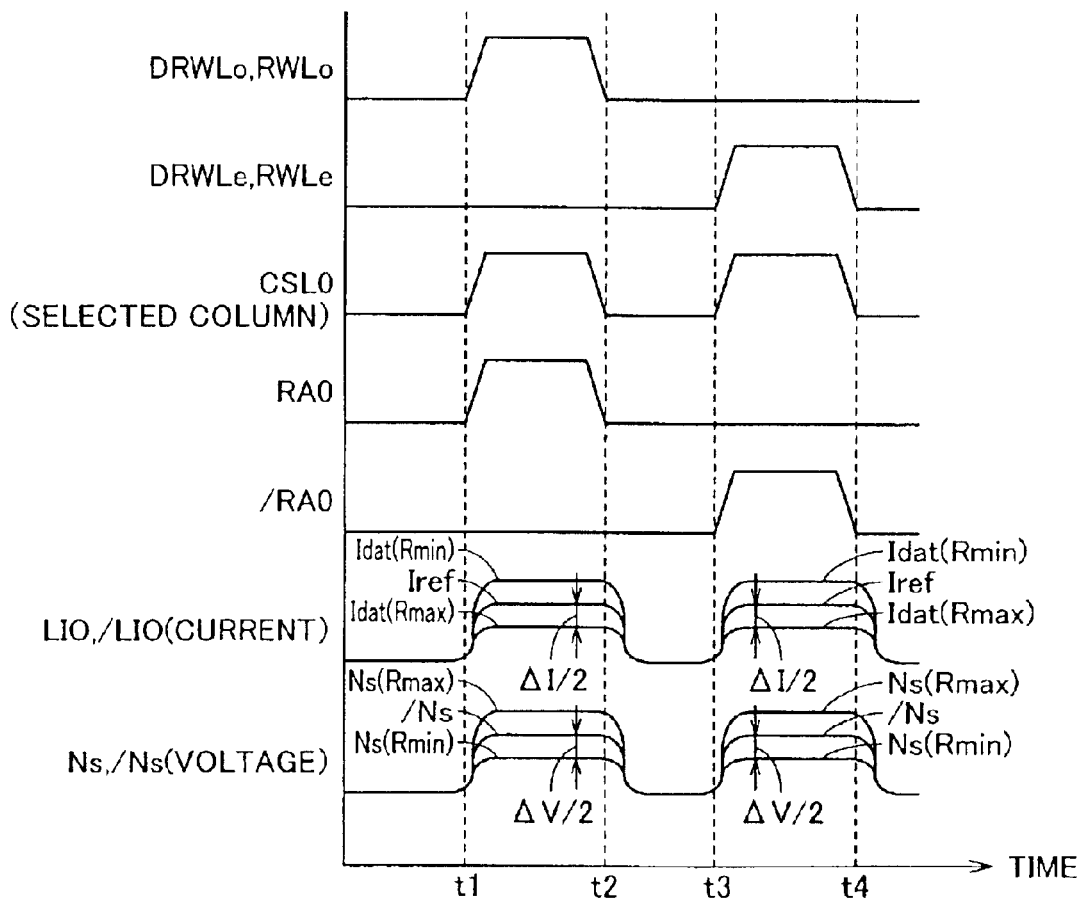
FIG. 6 is an operation waveform diagram illustrating a data read operation by the data read circuit system according to the first modification of the first embodiment.

Referring to FIG. 6, description will now be given on the data read operation by the data read circuit system according to the first modification of the first embodiment.

Referring to FIG. 6, when the data read operation is to be performed between times t1 and t2 by selecting the odd-numbered row, address signals RA0 and /RA0 are set to H- and L-levels, respectively, and read word line RWLo in the selected row and dummy read word line DRWLo as well as column select line CSL0 corresponding to the selected column are activated to attain H-level.

Voltage generating circuits 55 and 56 as well as differential amplifier 60 are designed to provide an intended offset between data read current Idat and reference current Iref, similarly to the first embodiment.

Consequently, when the odd-numbered row is selected, data read current Idat flows through data line LIO coupled to the selected memory cell, and reference current Iref flows through data line/LIO coupled to dummy cell DMC. Similarly to the data read operation according to the first embodiment, therefore, differential amplifier 60 amplifies the difference between data read current Idat and reference current Iref to convert it into a voltage difference between sense nodes Ns and /Ns, and the storage data of the selected memory cell can be detected from the voltages on sense nodes Ns and /Ns.

When the data read operation is to be performed between times t3 and t4 by selecting the even-numbered row, address signals RA0 and /RA0 are set to L- and H-levels, respectively, and read word line RWLe in the selected row and dummy read word line DRWLe as well as column select line CSL0 corresponding to the selected column are activated to attain H-level.

Consequently, when the even-numbered row is selected, data read current Idat likewise flows through the data line (/LIO) coupled to the selected memory cell, and reference current Iref flows through the data line (LIO) coupled to dummy cell DMC.

Accordingly, whichever one is selected between the odd- and even-numbered rows, differential amplifier 60 can amplify the current difference ΔI/2 between data read current Idat and reference current Iref to convert it into voltage difference ΔV/2 between sense nodes Ns and /Ns, similarly to the data read operation according to the first embodiment. Therefore, the storage data of the selected memory cell can be detected from the voltages on sense nodes Ns and /Ns.

According to the first modification of the first embodiment, effects similar to those by the first embodiment can be achieved in the memory array having the folded bit line structure, in which the connection relationship between the complementary data lines and the selected memory cell and dummy cell is switched depending on the results of address selection. In the memory array of the folded bit line structure, the data read operation is performed based on comparisons between the neighboring bit lines and data lines, and thereby the data reading can be accurately executed with high resistance against noises.

Second Modification of the First Embodiment

A second modification of the first embodiment will now be described in connection with a structure of a differential amplifier applicable to a structure, in which the connection relationship between data lines LIO and /LIO and the selected memory cell and dummy cell already described in connection with the first modification of the first embodiment is switched in accordance with the results of address selection.

Figure 7:
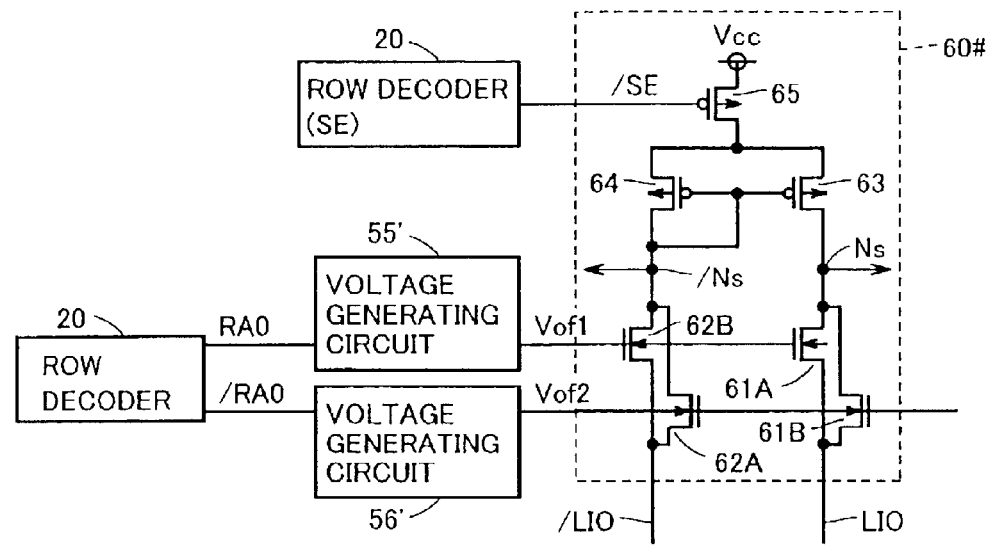
FIG. 7 is a circuit diagram showing a structure of a differential amplifier according to a second modification of the first embodiment.

Referring to FIG. 7, a differential amplifier 60# according to the second modification of the first embodiment differs from differential amplifier 60 shown in FIG. 2 in that transistors 61A, 61B, 62A and 62B are employed instead of transistors 61 and 62. Transistors 61A and 61B are connected in parallel between sense node Ns and data line LIO. Likewise, transistors 62A and 62B are connected in parallel between sense node/Ns and data line/LIO.

Further, voltage generating circuits 55' and 56' are employed instead of voltage generating circuits 55 and 56 forming the offset adjusting circuit, respectively. Each of transistors 61A and 62B receives an offset control voltage Vof1 sent from voltage generating circuit 55' on its gate, and each of transistors 61B and 62A receives an offset control voltage Vof2 sent from voltage generating circuit 56' on its gate. Voltage generating circuit 55' operates in accordance with address signal RA0, which is set to H-level when an odd-numbered row is selected. Voltage generating circuit 56' operates in accordance with address signal/RA0, which is set to H-level when an even-numbered row is selected.

Although description will be given later in greater detail, one of offset control voltages Vof1 and Vof2 is set in accordance with the results of address selection, i.e., selection of an odd-numbered row or an even-numbered row such that a set of transistors 61A and 62B or a set of transistors 61B and 62A may be turned off. Further, each of transistors 61A and 62A has a current drive capability (transistor size) set to a level different from that of the current drive capability (transistor size) of each of transistors 61B and 62B. Others structures of differential amplifier 60# are substantially the same as those of differential amplifier 60 shown in FIG. 2, and therefore, description thereof is not repeated.

Figure 8:
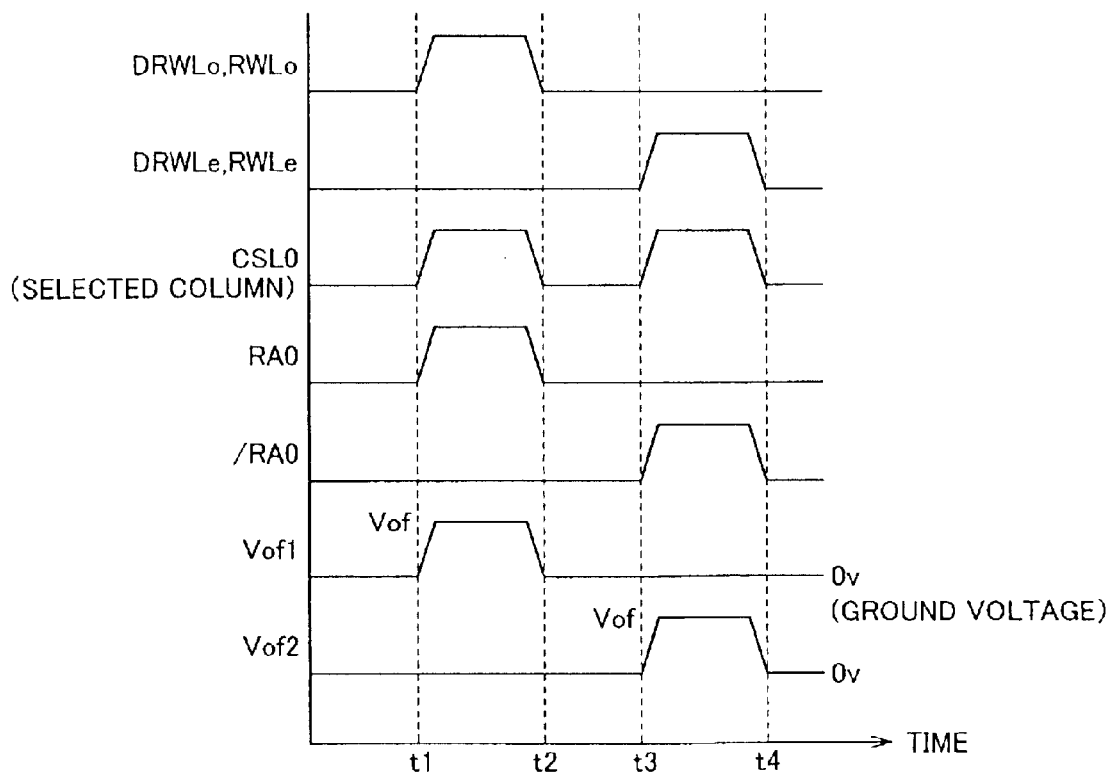
FIG. 8 is an operation waveform diagram illustrating an operation of the differential amplifier shown in FIG. 7.

FIG. 8 is an operation waveform diagram illustrating an operation of differential amplifier 60#.

Referring to FIG. 8, when the data read operation is to be performed between times t1 and t2 by selecting the odd-numbered row, address signals RA0 and /RA0 are set to H- and L-levels, respectively, and read word line RWLo in the selected row and dummy read word line DRWLo as well as column select line CSL0 corresponding to the selected column are activated to attain H-level.

Offset control voltage Vof1 generated by voltage generating circuit 55' is set to a level (e.g., ground voltage), which can turn off transistors 61A and 62B, and offset control voltage Vof2 generated by voltage generating circuit 56' is set to level Vof, which can turn on transistors 61B and 62A.

In contrast to the above, when the data read operation is to be performed between times t3 and t4 by selecting the even-numbered row, address signals RA0 and /RA0 are set to L- and H-levels, respectively, and read word line RWLe in the selected row and dummy read word line DRWLe as well as column select line CSL0 corresponding to the selected column are activated to attain H-level.

Offset control voltage Vof1 generated by voltage generating circuit 55' is set to a level (e.g., ground voltage), which can turn off transistors 61A and 61B, and offset control voltage Vof2 generated by voltage generating circuit 56' is set to level Vof, which can turn on transistors 61B and 62A.

Accordingly, whichever one is selected between the even- and odd-numbered rows, transistors 61A and 62A are connected in series to one of data lines LIO and /LIO, which is electrically coupled to the selected memory cell, and transistors 61B and 62B are connected in series to the other data line electrically coupled to the dummy cell.

The relationship in magnitude of the current drive capability of each of turned-on transistors 61A and 62A with respect to each of turned-on transistors 61B and 62B is set similarly to the relationship in magnitude, which is determined between the current drive capabilities (transistor sizes) of transistors 63 and 64 for providing the offset as already described in FIG. 2.

More specifically, if the dummy cell has the electric resistance preset to Rmin, the current drive capability (transistor size) of each of transistors 61B and 62B is designed to be smaller than the current drive capability (transistor size) of each of transistors 61A and 62A so that an offset for reducing reference current Iref by $\Delta I/2$ may be provided. Conversely, if the dummy cell has the electric resistance preset to Rmax, the current drive capability (transistor size) of each of transistors 61B and 62B is designed to be larger than the current drive capability (transistor size) of each of transistors 61A and 62A so that an offset for increasing the passing current (reference current Iref) of data line LIOr by $\Delta I/2$.

As a result, whichever one is selected between the odd- and even-numbered rows, a relationship similar to that expressed by the foregoing formula (1) can be established between data read current Idat flowing through the data line coupled to the selected memory cell and reference current Iref flowing through the data line coupled to dummy cell DMC.

Accordingly, whichever one is selected between the odd- and even-numbered rows, the data read operation can be performed similarly to that in the first embodiment, and differential amplifier 60 can amplify the difference between data read current Idat and reference current Iref to convert it into the voltage difference between sense nodes Ns and /Ns, and the storage data of the selected memory cell can be detected from the voltages on sense nodes Ns and /Ns.

As described above, the structure of the second modification of the first embodiment employs differential amplifier 60# formed by adding two transistors to the structure of differential amplifier 60 shown in FIG. 2, and thereby the data reading can be performed similarly to that of the first modification of the first embodiment without employing connection switching circuit 70 shown in FIGS. 4 and 5. Accordingly, the same effect as that by the structure of the first modification of the first embodiment can be achieved, and further the circuit area can be reduced.

Second Embodiment

A second embodiment will now be described in connection with a structure for providing an offset, which is similar to that in the first embodiment, in a structure provided with differential amplifiers in two stages.

Figure 9:
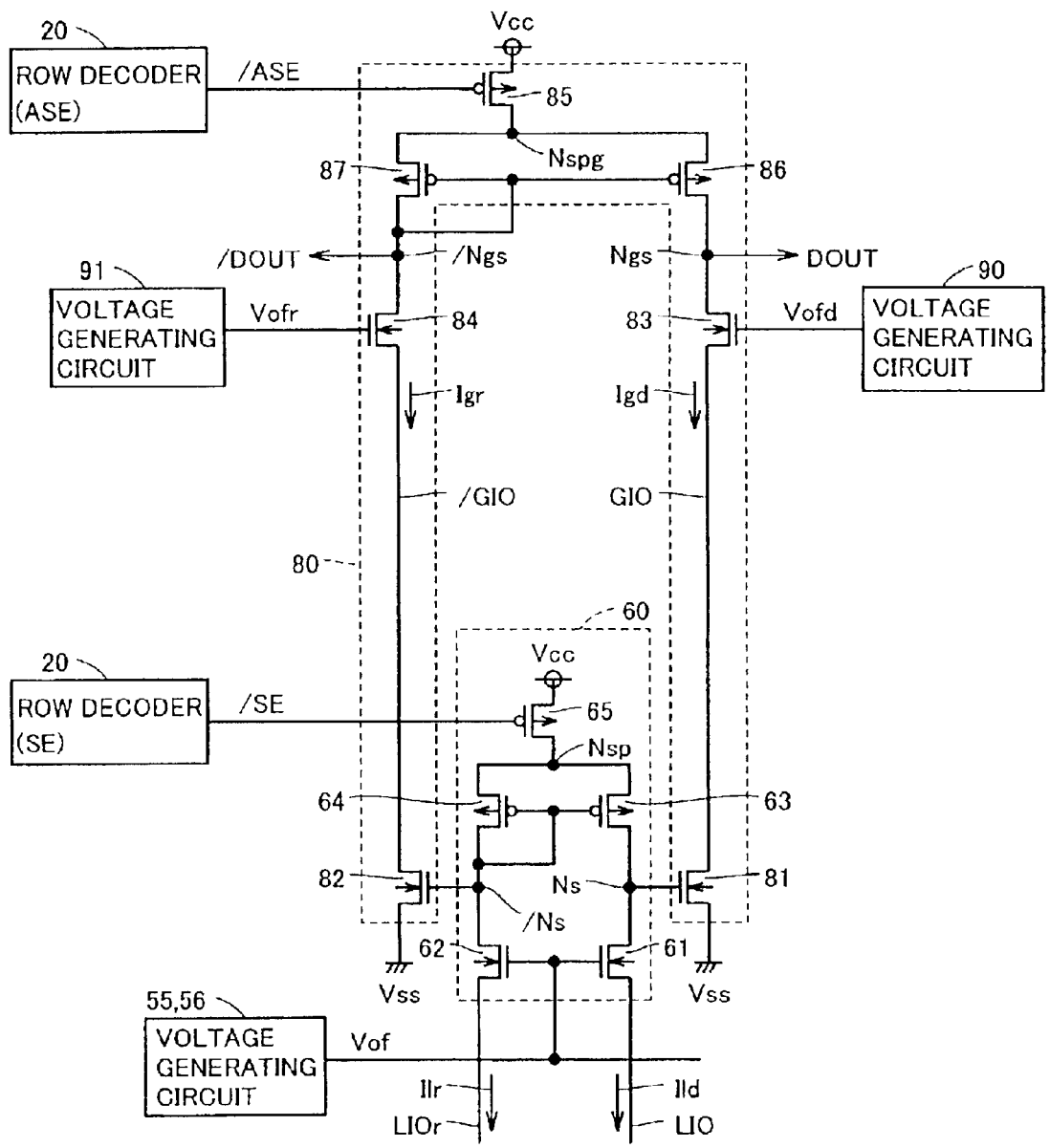
FIG. 9 is a circuit diagram showing a structure of a data read circuit system according to a second embodiment.

Referring to FIG. 9, a structure according to the second embodiment further includes a global differential amplifier 80 arranged subsequently to differential amplifier 60. Global differential amplifier 80 converts the voltage difference between sense nodes Ns and /Ns into a passing current difference between complementary global data lines GIO and /GIO, and amplifies this current difference to produce a voltage difference between global sense nodes Ngs and /Ngs.

Differential amplifier 60 is provided for memory array 10 having the structure shown in FIG. 2. In the data read operation, therefore, data line LIO electrically coupled to sense node Ns is connected in series to the selected memory cell, and data line LIOr electrically coupled to sense node /Ns is connected in series to dummy cell DMC, although not shown.

Global differential amplifier 80 includes an N-type MOS transistor 81 having a gate connected to sense node Ns, an N-type MOS transistor 82 having a gate connected to sense node/Ns, an N-type MOS transistor 83 receiving offset control voltage Vofd from a voltage generating circuit 90 on its gate, and an N-type MOS transistor 84 receiving offset control voltage Vofr from a voltage generating circuit 91 on its gate. Transistor 81 is electrically connected between global data line GIO and predetermined voltage Vss, and transistor 82 is electrically coupled between global data line/GIO and predetermined voltage Vss. Transistor 83 is connected in series to global data line GIO, and transistor 84 is connected in series to global data line/GIO.

Global differential amplifier 80 further includes a P-type MOS transistor 85 electrically coupled between power supply voltage Vcc and a node Nspg, and P-type MOS transistors 86 and 87 electrically coupled between node Nspg and global sense nodes Ngs and /Ngs, respectively. Transistor 85 receives on its gate a control signal/ASE corresponding to the enable signal of global differential amplifier 80 from row decoder 20. Transistor 85 supplies an operation current in response to activation (L-level) of control signal/ASE for operating global differential amplifier 80. Gates of transistors 86 and 87 are connected to predetermined one (e.g., global sense node/Ngs) of global sense nodes Ngs and /Ngs.

Offset control voltages Vofd and Vofr produced by voltage generating circuits 90 and 91 are set to different levels, respectively, so that an intended offset may be provided between the passing currents of complementary global data lines GIO and /GIO, as will be described later in greater detail. As described above, global differential amplifier 80 has the structure of the differential amplifier, which is formed of transistors 81, 82, 86 and 87 for amplifying the voltage difference between sense nodes Ns and /Ns, and further has a structure, in which offset control voltages Vofd and Vofr applied respectively to the gates of transistors 83 and 84 can provide an intended offset between the passing currents of global data lines GIO and /GIO.

Further, the gates of transistors 61 and 62 of differential amplifier 60 are supplied with common offset control voltage Vof. Thus, differential amplifier 60 in the upstream stage does not provide an intentional offset between the passing currents of data lines LIO and LIOr. Consequently, passing currents of data lines LIO and LIOr depend on the electric resistances of the selected memory cell and the dummy cell.

Figure 10:
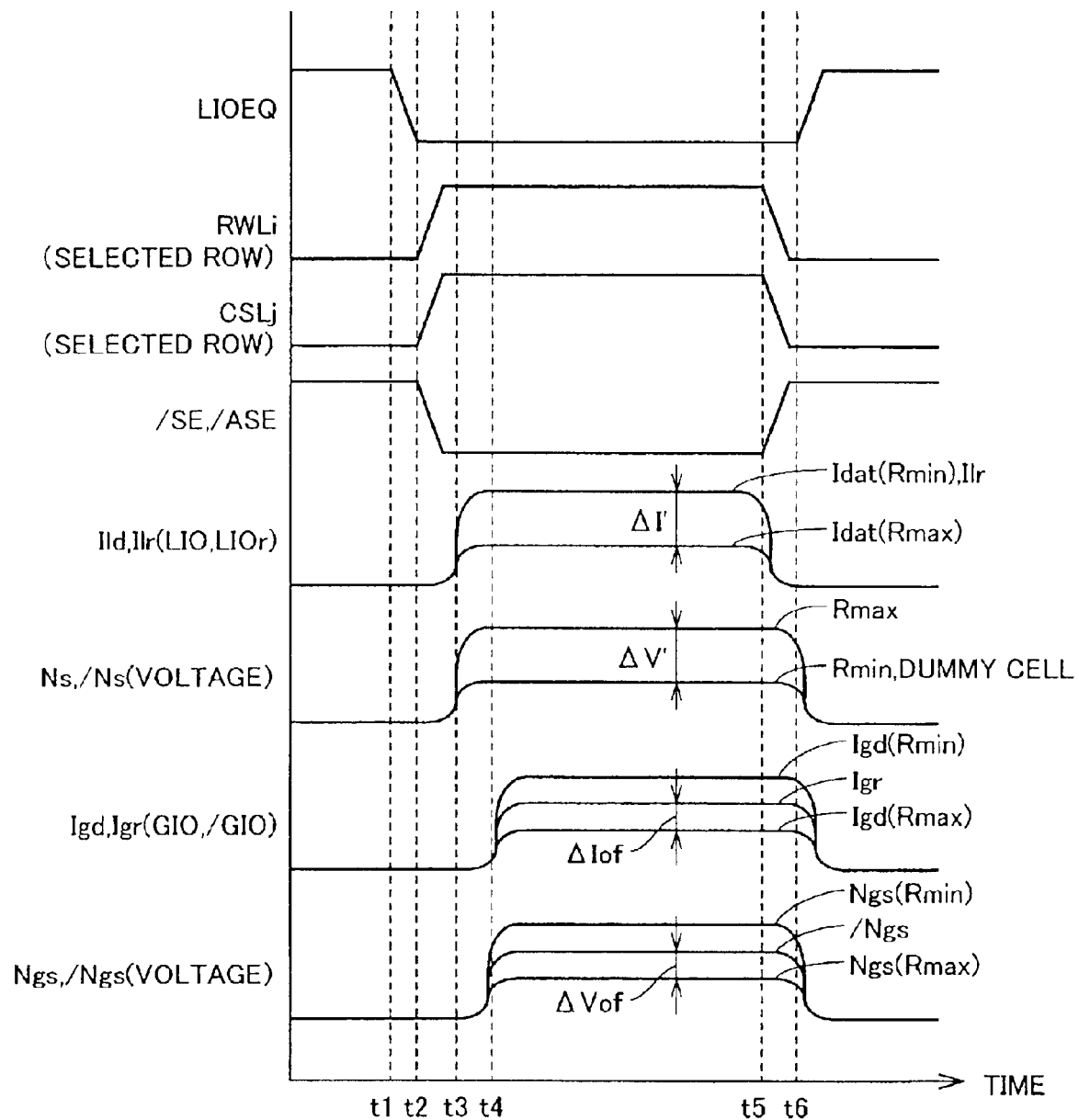
FIG. 10 is an operation waveform diagram illustrating a data read operation by the data read circuit system according to the second embodiment.

Referring to FIG. 10, description will now be given on the data read operation according to the second embodiment.

FIG. 10 representatively shows an operation, in which the dummy cell has an electric resistance preset to Rmin, and the normal memory cell in the ith row and jth column is selected as the data read target.

When the data read operation starts at time t1, data line equalize signal LIOEQ is inactivated to attain L-level so that data lines LIO and LIOr are isolated from predetermined voltage Vss. Thereby, preparation for starting the data reading is completed.

At time t2, sense enable signal /SE and control signal /ASE are activated to attain L-level, and differential amplifier 60 and global differential amplifier 80 start the operation. Thereby, data lines LIO and LIOr as well as global data lines GIO and /GIO are supplied with the currents. In accordance with similar timing, read word line RWLi in the selected row and column select line CSLj in the selected column are activated to attain H-level.

In response to the activation of read word line RWLi in the selected row and column select line CSLj in the selected column, data lines LIO and LIOr are electrically coupled to the selected memory cell and dummy cell, respectively. Thereby, currents start to flow through data lines LIO and LIOr at time t3. in response to the voltages on sense nodes Ns and iNs, which depend on the passing currents of data lines LIO and LIOr, currents start to flow to global data lines GIO and /GIO, respectively.

Passing current Ild of data line LIO electrically coupled to the selected memory cell takes a value of Idat(Rmax) or Idat(Rmin) depending on the storage data. A difference between currents Idat(Rmin) and Idat(Rmax) is expressed as $\Delta I'$.

Since the dummy cell has the electric resistance preset to Rmin, passing current Ilr of data line LIOr is at the same level as Idat(Rmin). Therefore, a voltage difference does not occur between sense nodes Ns and /Ns when the storage data of the selected memory cell corresponds to electric resistance Rmin. Consequently, when offset control voltages Vofd and Vofr applied to gates of transistors 83 and 84 are at the same level, an offset does not occur between passing currents Igd and Igr of global data lines GIO and /GIO.

Conversely, if the storage data of the selected memory cell corresponds to electric resistance Rmax, passing current Idat(Rmax) of data line LIO is smaller than passing current Ilr of data line LIOr so that the voltage on sense node Ns is higher by $\Delta V'$ than the voltage on sense node /Ns. Therefore, passing current Igd of global data line GIO is larger than passing current Igr of global data line /GIO even if offset control voltages Vofd and Vofr are at the same level because the gate voltage of transistor 81 is higher than the gate voltage of transistor 82.

As described above, if the dummy cell has the electric resistance corresponding to Rmin, passing current Igd of global data line GIO corresponding to the selected memory cell is equal to passing current Igr of global data line /GIO corresponding to the dummy cell, or is larger than the same.

Accordingly, global differential amplifier 80 must provides the offset satisfying the following formula (2) so that passing current Igr of global data line /GIO may attain the level intermediate between two kinds of passing currents Igd(Rmin) and Igd(Rmax) of global data line GIO corresponding to the storage data of the selected memory cell.

$$\text{Igd(Rmax)}+\Delta \text{Iof}=\text{Igr}=\text{Igd(Rmin)}-\Delta \text{Iof} \tag{2}$$

Thus, if the dummy cell has the electric resistance preset to Rmin, offset control voltage Vofr is set to (Vofd−Vα) for providing the offset, which reduces reference current Igr, i.e., the passing current of global data line/GIO$_F$ by ΔIof.

Difference Vα between offset control voltages Vofr and Vofd is adjusted in accordance with the above value of ΔIof.

Alternatively, offset control voltages Vofr and Vofd may be set to the common level, and the offset, which reduces the passing current (reference current fret) of data line LIOr by ΔIof, may be provided by employing such a design that the current drive capability (transistor size) of transistor 87 connected to global data line/GIO$_F$ is smaller than the current drive capability (transistor size) of transistor 86 connected to global data line GIO.

In the case where dummy cell DMC has electric resistance Rmax, offset control voltage Vofr is set to (Vofd+Vα) for providing the offset, which increases reference current Igr, i.e., the passing current of global data line/GIO$_F$ by ΔIof.

Alternatively, offset control voltages Vofr and Vofd may be set to a common level, and an offset, which increases the passing current (reference current Iref) of data line LIOr by ΔIof, may be provided by employing such a design that the current drive capability (transistor size) of transistor 87 connected to global data line/GIO$_f$ is larger than the current drive capability (transistor size) of transistor 86 connected to global data line GIO.

Between times t4 and t5, the offset thus provided causes passing current difference ΔIof between global data lines GIO and /GIO based on the electric resistances of the selected memory cell and the dummy cell, and global differential amplifier 80 converts this passing current difference ΔIof into voltage difference ΔVof between global sense nodes Ngs and /Ngs. Since this voltage difference ΔVof has the polarity corresponding to the storage data of the selected memory cell, the storage data of the selected memory cell can be detected from the voltages on global sense nodes Ngs and /Ngs.

Operations after the end of the data reading at time t5 are substantially the same as those after time t4 in FIG. 3, and therefore description thereof is not repeated.

According to the second embodiment, the data read operation similar to that in the first embodiment can be executed in the structure having the differential amplifiers in the two stages. Since the data reading is executed by the differential amplifying operations in two stages, a sufficient amplification factor can be achieved for executing the data reading without employing a large MOS transistor, and therefore the circuit area of the data read circuit system can be small.

First Modification of the Second Embodiment

A first modification of the second embodiment will now be described in connection with a structure, in which the connection relationship of data lines LIO and /LIO shown in FIG. 4 with respect to the selected memory cell and the dummy cell is switched in accordance with the results of address selection, and particularly in connection with a structure for executing the differential amplification in two stages.

Figure 11:
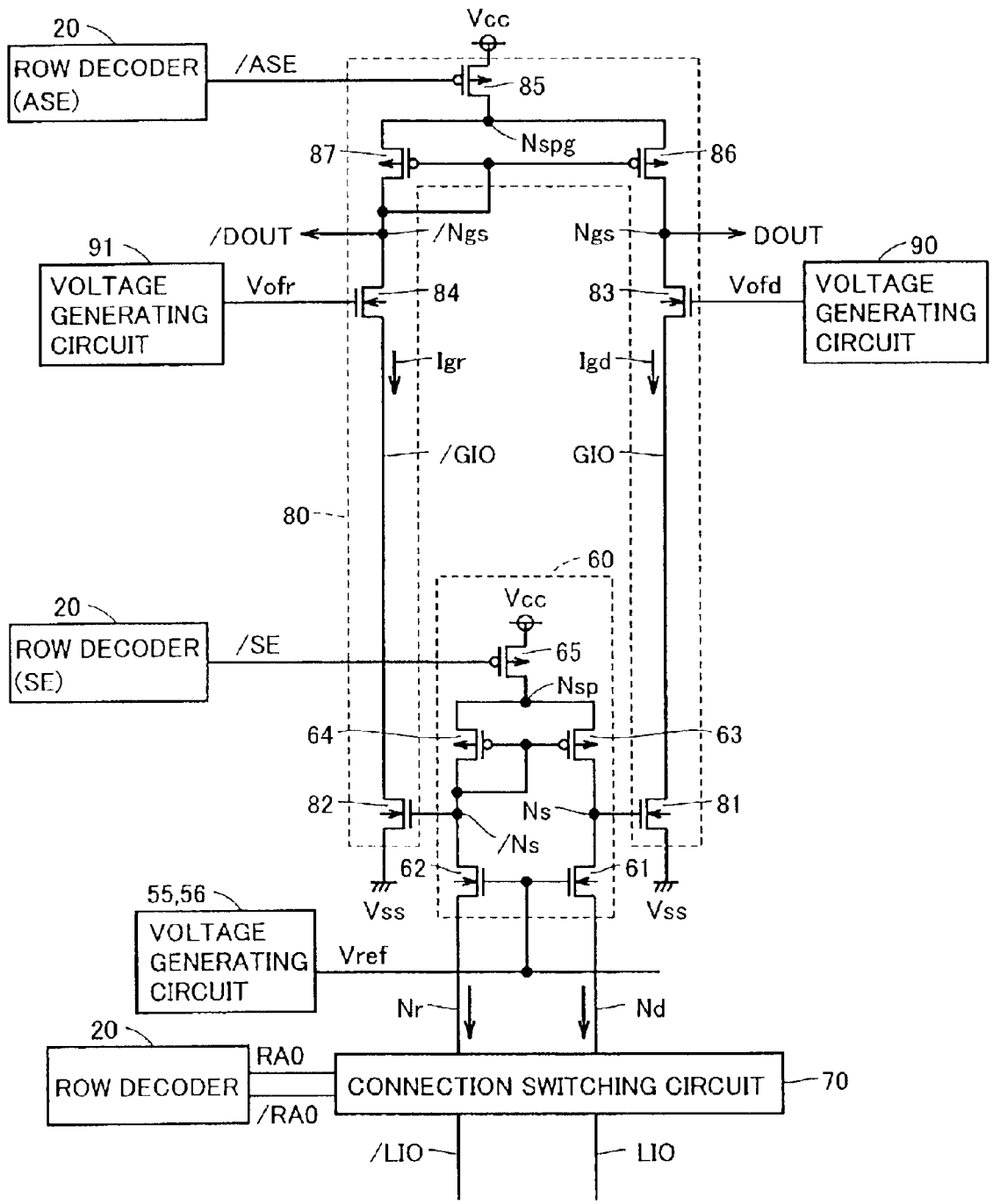
FIG. 11 is a circuit diagram showing a structure of a data read circuit system according to a first modification of the second embodiment.

Referring to FIG. 11, a structure of the first modification of the second embodiment differs from the structure of the second embodiment shown in FIG. 9 in that connection switching circuit 70 is arranged between differential amplifier 60 and data lines LIO and /LIO. Differential amplifier 60 is provided for memory array 10 having the structure shown in FIG. 4. In the data read operation, therefore, each of sense nodes Ns and /Ns as well as data line LIO or /LIO electrically coupled thereto are connected in series to the selected memory cell or dummy cell DMC in accordance with the results of address selection, although not shown.

The structure of connection switching circuit 70 is similar to that shown in FIG. 5. One of data lines LIO and /LIO, which is connected to the selected memory cell, is fixedly connected to node Nd (i.e., to the side of transistor 61) in accordance with the results of address selection, and the other connected to the dummy cell is fixed connected to node Nr (i.e., to the side of transistor 62).

Thereby, differential amplifier 60, global differential amplifier 80 and voltage generating circuits 90 and 91 operate similarly to those already described in connection with the second embodiment so that effects similar to those in the second embodiment can be achieved even in the memory array of the folded bit line structure, in which the connection relationship of the complementary data lines with respect to the selected memory cell and the dummy cell is switched in accordance with the results of address selection. Further, by employing the folded bit line structure in the memory array, the data reading can be performed accurately with higher resistance against noises.

Second Modification of the Second Embodiment

Figure 12:
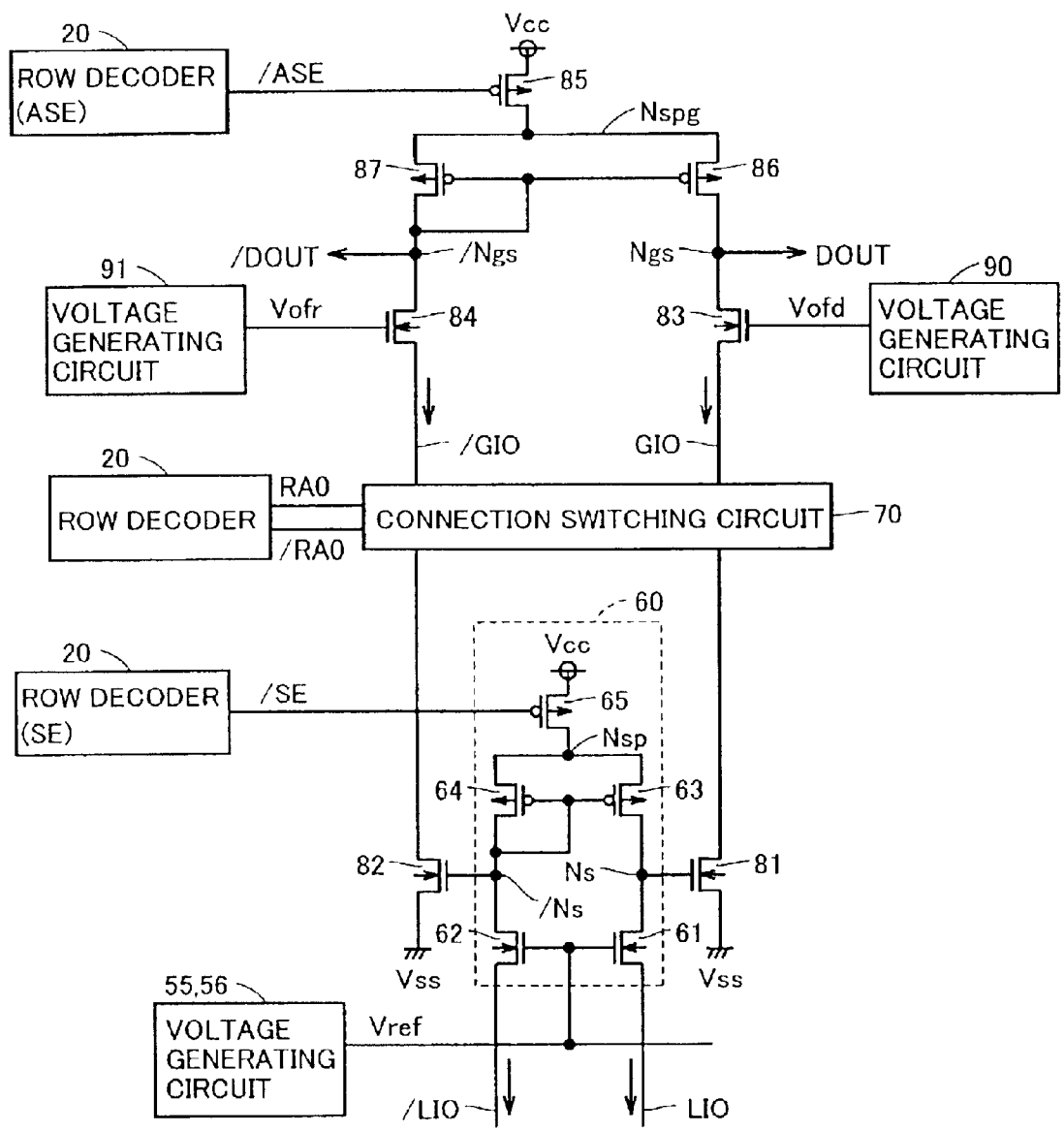
FIG. 12 is a circuit diagram showing a structure of a data read circuit system according to a second modification of the second embodiment.

In a structure according to a second modification of the second embodiment, as shown in FIG. 12, connection switching circuit 70 is provided corresponding to the inner structure of global differential amplifier 80. More specifically, connection switching circuit 70 is arranged in a position dividing each of global data lines GIO and /GIO, and controls the connection relationship of transistors 81 and 82 with respect to transistors 83 and 84 in accordance with the results of address selection.

More specifically, when an odd-numbered row is selected and address signal RA0 is set to H-level, connection switching circuit 70 connects transistor 81, of which passing current is controlled in accordance with a voltage on sense node Ns electrically coupled to the selected memory cell via data line LIO, in series to transistor 83 receiving offset control voltage Vofd on its gate, and also connects transistor 82, of which passing current is controlled in accordance with a voltage on sense node/Ns electrically coupled to the dummy cell via data line/LIO, in series to transistor 84 receiving offset control voltage Vofr on its gate.

Conversely, when an even-numbered row is selected and address signal/RA0 is set to H-level, connection switching circuit 70 connects transistor 81, of which passing current is controlled in accordance with a voltage on sense node Ns electrically coupled to the dummy cell via data line LIO, in series to transistor 84 receiving offset control voltage Vofr on its gate, and also connects transistor 82, of which passing current is controlled in accordance with a voltage on sense node/Ns electrically coupled to the selected memory cell via data line/LIO, in series to transistor 83 receiving offset control voltage Vofd on its gate.

As described above, connection switching circuit 70 is arranged in the stage subsequent to differential amplifier 60, and thus is arranged corresponding to global differential amplifier 80. In this structure, differential amplifier 60, global differential amplifier 80 and voltage generating circuits 90 and 91 are operated similarly to those in the second embodiment already described so that effects similar to those of the second embodiment can likewise be achieved in the memory array of the folded bit line structure, which is configured to switch the connection relationship of the complementary data lines with respect to the selected memory cell and the dummy cell in accordance with the results of address selection. Further, by employing the folded bit line structure in the memory array, the data reading can be performed accurately with higher resistance against noises.

The above structure may be employed, e.g., in a memory array structure divided into a plurality of memory blocks, and an initial amplifier circuit corresponding to differential amplifier 60 may be arranged for each memory block. Further, global differential amplifiers 80 may be arranged commonly to these plurality of blocks. Thereby, connection switching circuits 70 can be reduced in number and the circuit area can be reduced.

According to differential amplifiers 60 and 60# and global differential amplifier 80 in the first and second embodiments, transistors 61, 61A, 61B, 62, 62A, 62B and 81–84 are formed of N-type MOS transistors, and transistors 63–65 and 85–87 are formed of P-type MOS transistors. However, the polarities (N- and P-types) of these transistors can be appropriately changed in view of the operation voltages of these differential amplifiers as well as the polarities of gates voltages (e.g., setting of the offset control voltages) of the respective transistors.

Third Embodiment

A third embodiment will now be described in connection with another example of the structure, in which data reading is performed by using dummy cells having substantially the same structures as the normal memory cells.

Figure 13:
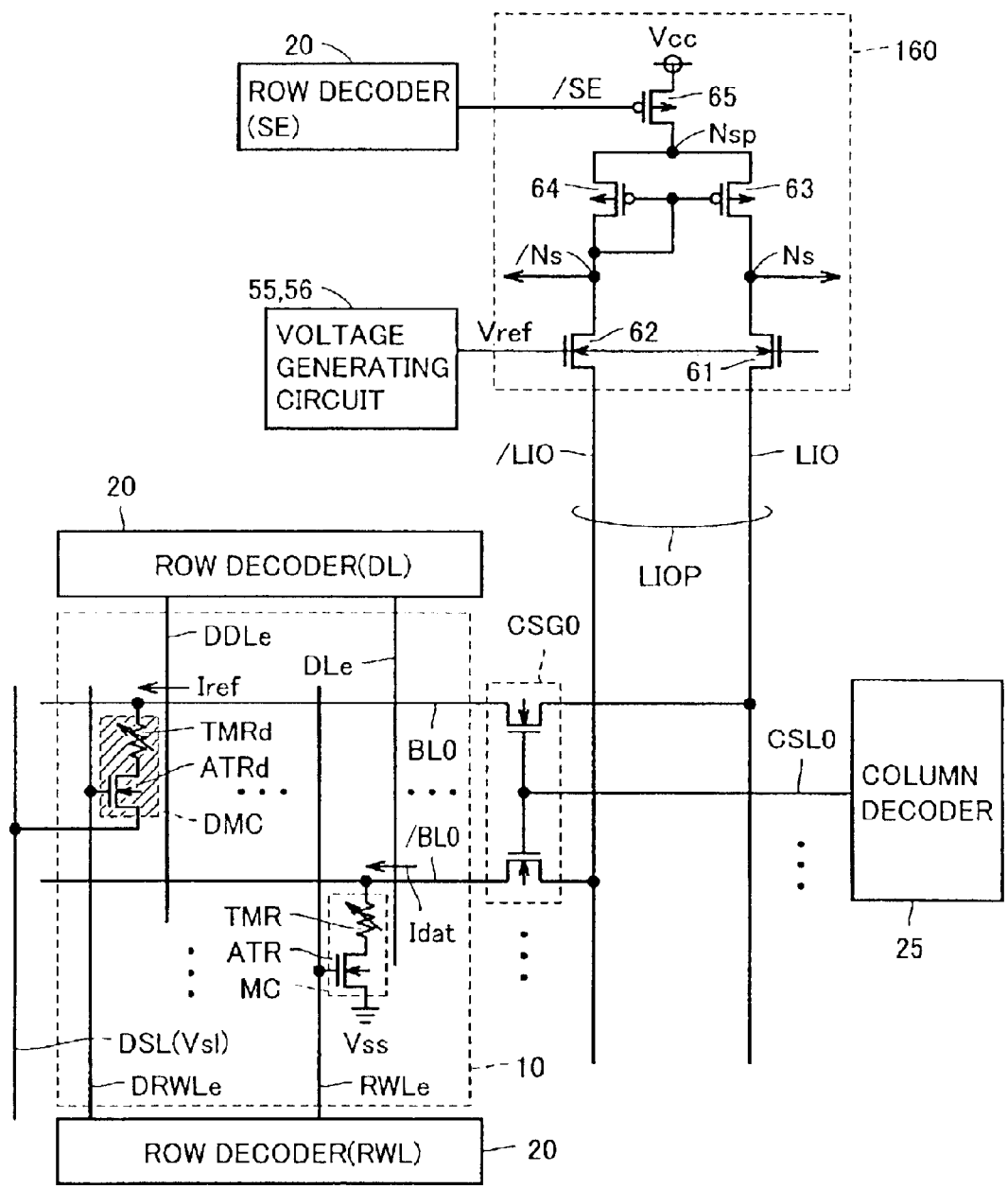
FIG. 13 is a circuit diagram showing a structure of a data read circuit system according to a third embodiment.

FIG. 13 is a circuit diagram showing a structure of a data read circuit system according to the third embodiment.

Referring to FIG. 13, memory array 10 has substantially the same structure as that shown in FIG. 4, and therefore, description thereof is not repeated. FIG. 13 representatively shows read word line RWLe, digit line DLe, bit lines BL0 and /BL0, and normal memory cells corresponding to one even-numbered row and the first memory cell column as well as dummy cell DMC, dummy read word line DRWLe and dummy digit line DDLe corresponding to them.

Data line pair/IOP formed of data lines LIO and /LIO is connected to memory array 10 in the same manner as those in FIG. 4, and therefore, description of the connection relationship between them is not repeated. The structure differs from the structure shown in FIG. 4 in that connection switching circuit 70 is not arranged, and a data read circuit 160 is arranged instead of differential amplifier 60. In contrast to differential amplifier 60, data read circuit 160 does not have a function of providing an offset between the passing currents of data lines LIO and /LIO, and executes the operation of reading data from the selected memory cell by converting the passing current difference, which occurs between data lines LIO and /LIO, and directly reflects the passing current difference between the selected memory cell and the dummy cell, into the voltage difference between sense nodes Ns and /Ns.

For example, a structure corresponding to differential amplifier 60 may be configured to keep a balance between current drive capabilities (transistor sizes) of transistors 61 and 62 as well as a balance between current drive capabilities (transistor sizes) of transistors 63 and 64, and further, to apply common control voltage Vref to the gates of transistors 61 and 62. Thereby, data read circuit 160 described above can be achieved.

According to the structure of the third embodiment, the source voltage of access transistor ATR in normal memory cell MC is set to predetermined voltage Vss by a source line SL (not shown in FIG. 13), and the source voltage of dummy access transistor ATRd in dummy cell DMC is set to source voltage Vs1 (Vs1≠Vss) supplied by a dummy source voltage line DSL.

In the data read operation, each of data lines LIO and /LIO is set to a common voltage corresponding to control voltage Vref. Thereby, a voltage applied across opposite ends of the selected memory cell having turned-on access transistor ATR differs from that of the dummy cell having turned-on dummy access transistor. Consequently, the voltage applied across opposite ends of tunneling magneto-resistance element TMR in the selected memory cell differs from the voltage applied across opposite ends of dummy magneto-resistance element TMRd in the dummy cell.

For example, if dummy cell DMC has the electric resistance preset to Rmin, source voltage Vs1 is set to exceed predetermined voltage Vss (Vs1>Vss) so that the voltage applied across the opposite ends of dummy magneto-resistance element TMRd may be lower than the voltage applied across the opposite ends of tunneling magneto-resistance element TMR. Thereby, reference current Iref passing through the dummy cell can be set to a level intermediate between two kinds of data read currents Idat passing through the selected memory cell. By suppressing the voltage applied across the opposite ends of dummy magneto-resistance element TMRd, dummy cell DMC, which is accessed more frequently than the normal memory cell, can operate with improved reliability.

Conversely, if dummy cell DMC has the electric resistance preset to Rmax, source voltage Vs1 is set to be lower than predetermined voltage Vss (Vs1<Vss) so that the voltage applied across the opposite ends of dummy magneto-resistance element TMRd may be higher than the voltage applied across the opposite ends of tunneling magneto-resistance element TMR. Thereby, reference current Iref can be set to a level intermediate between the two kinds of passing currents of the selected memory cell.

According to the structure of the third embodiment, as described above, a special structure is not required for proving an offset on the side of differential amplifier 60, i.e., for providing the offset between the passing currents of data lines LIO and /LIO. By controlling or adjusting the source voltage supplied to dummy cell DMC, and thus, by employing the data read circuit system of a simpler structure, the data reading can be executed while using dummy cell DMC having the structure similar to that of the normal memory cell.

First Modification of the Third Embodiment

Figure 14:
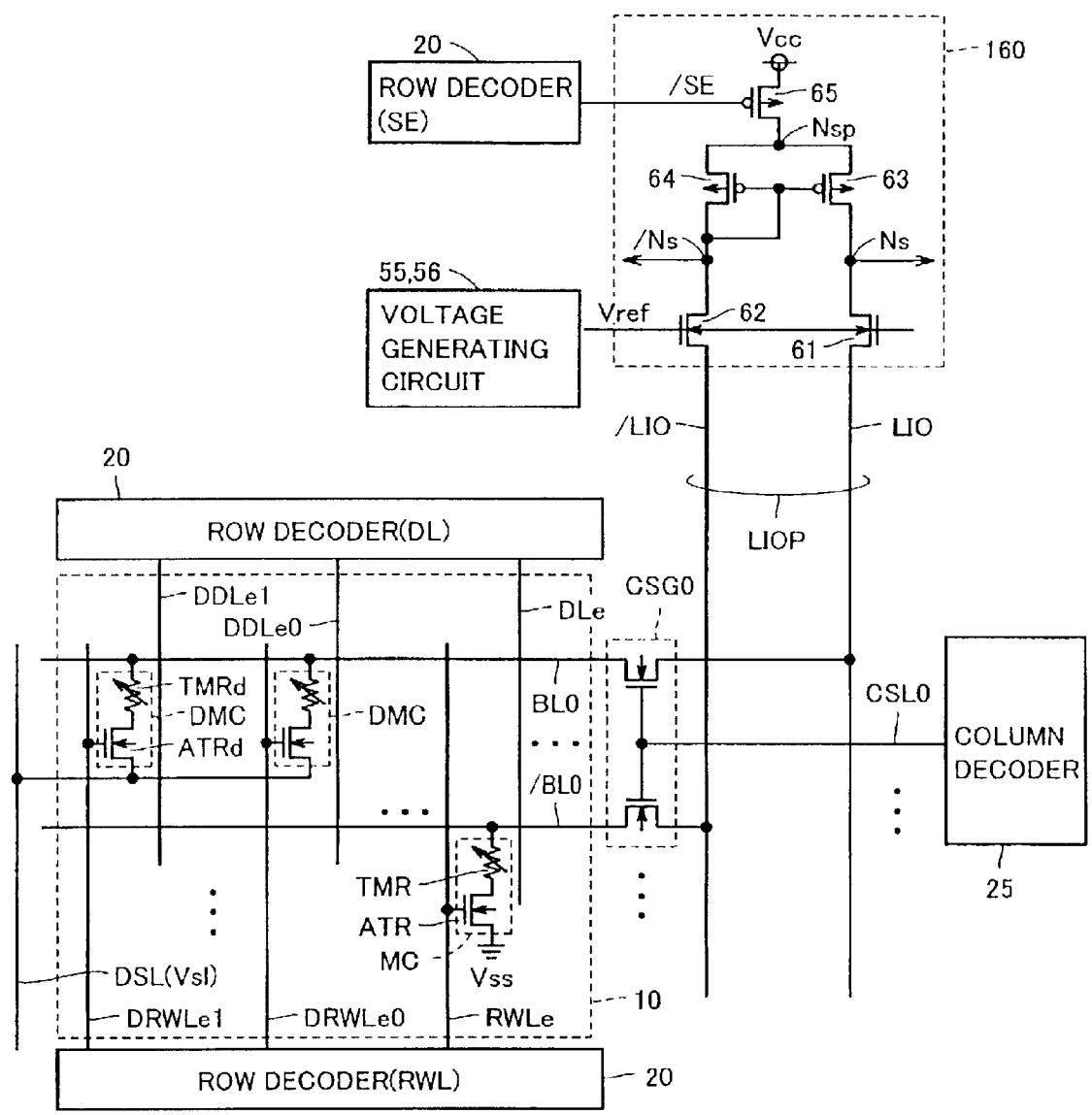
FIG. 14 is a circuit diagram showing a structure of a data read circuit system according to a first modification of the third embodiment.

Referring to FIG. 14, a structure according to a modification of the third embodiment differs from the structure of the third embodiment shown in FIG. 13 in that the plurality of dummy cells DMC are connected in parallel between bit line BL or /BL and dummy source voltage line DSL in the data read operation.

In this modification, dummy cell rows arranged in memory array 10 are N (N: integer larger than 2) times larger in number than those in the structure of the third embodiment. FIG. 14 shows by way of example a structure, in which N is equal to two, and therefore two dummy cells DMC are connected in parallel between bit line BL or /BL and dummy source voltage line DSL in the data read operation. FIG. 14 representatively shows dummy read word lines DRWLe0 and DRWLe1, which correspond to two dummy cell rows arranged corresponding to even-numbered rows, respectively, as well as two dummy cells corresponding to these lines and located in the first memory cell column.

Dummy read word lines DRWLe0 and DRWLe1 are commonly activated and inactivated. Therefore, when the even-numbered row is selected in the data read operation, two dummy cells DMC are arranged between each bit line BL and dummy source voltage line DSL. Although not shown, the dummy cells corresponding to the odd-numbered rows are arranged in two rows similarly to the above.

According to the above structure, since reference current Iref is produced from the passing currents of the plurality of dummy magneto-resistance elements, the passing current per dummy cell can be suppressed. For example, if dummy cell DMC has the electric resistance set to Rmin, intended reference current Iref can be produced even if the voltage applied across the opposite ends of each dummy magneto-resistance element TMRd is reduced by raising source voltage Vs1 supplied by dummy source voltage line DSL above the level in the structure shown in FIG. 13.

Thereby, the intended operation reliability of dummy cell DMC, which is accessed more frequently than the normal memory cell, can be ensured, and the data reading can be executed similarly to the third embodiment.

Second Modification of the Third Embodiment

Figure 15:
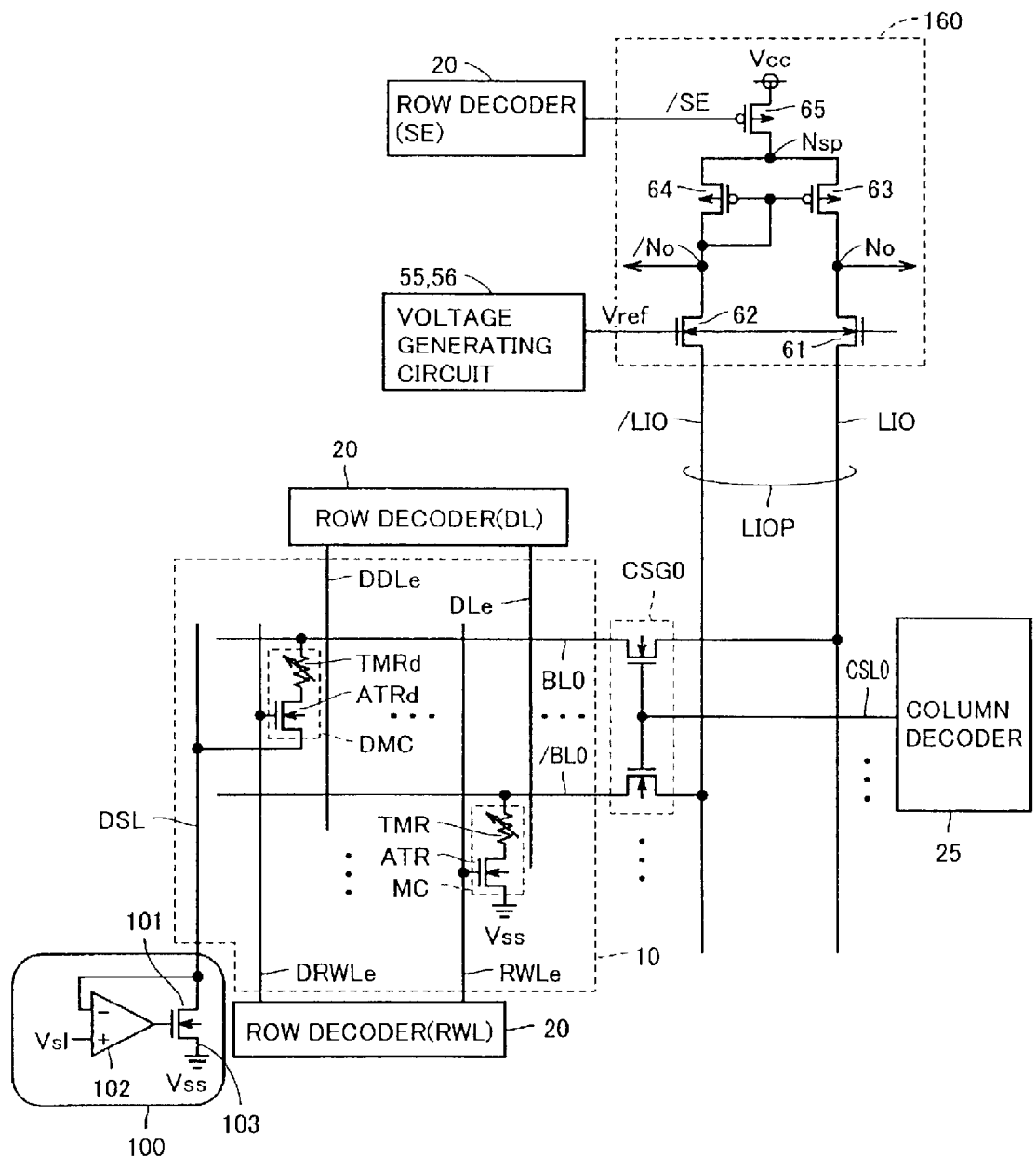
FIG. 15 is a circuit diagram showing a structure of a data read circuit system according to a second modification of the third embodiment.

FIG. 15 is a circuit diagram showing a data read circuit system according to a second modification of the third embodiment.

Referring to FIG. 15, the structure of the second modification of the third embodiment differs from the structure according to the third embodiment shown in FIG. 13 in that a current transmitting circuit 100 is further employed for controlling the voltage on dummy source voltage line DSL.

Current transmitting circuit 100 includes a transistor 101 electrically coupled between a node 103 supplied with predetermined voltage Vss and dummy source voltage line DSL, and a sense amplifier 102 for amplifying a voltage difference between the voltage on dummy source voltage line DSL and source voltage Vs1 corresponding to a reference value thereof, and applying it to the gate of transistor 101. Thereby, the passing current of transistor 101 is controlled to maintain source voltage Vs1 on dummy source voltage line DSL.

The above structure can stably set source voltage Vs1 on dummy source voltage line DSL in the structure according to the third embodiment so that the data reading can be executed stably.

Third Modification of the Third Embodiment

Figure 16:
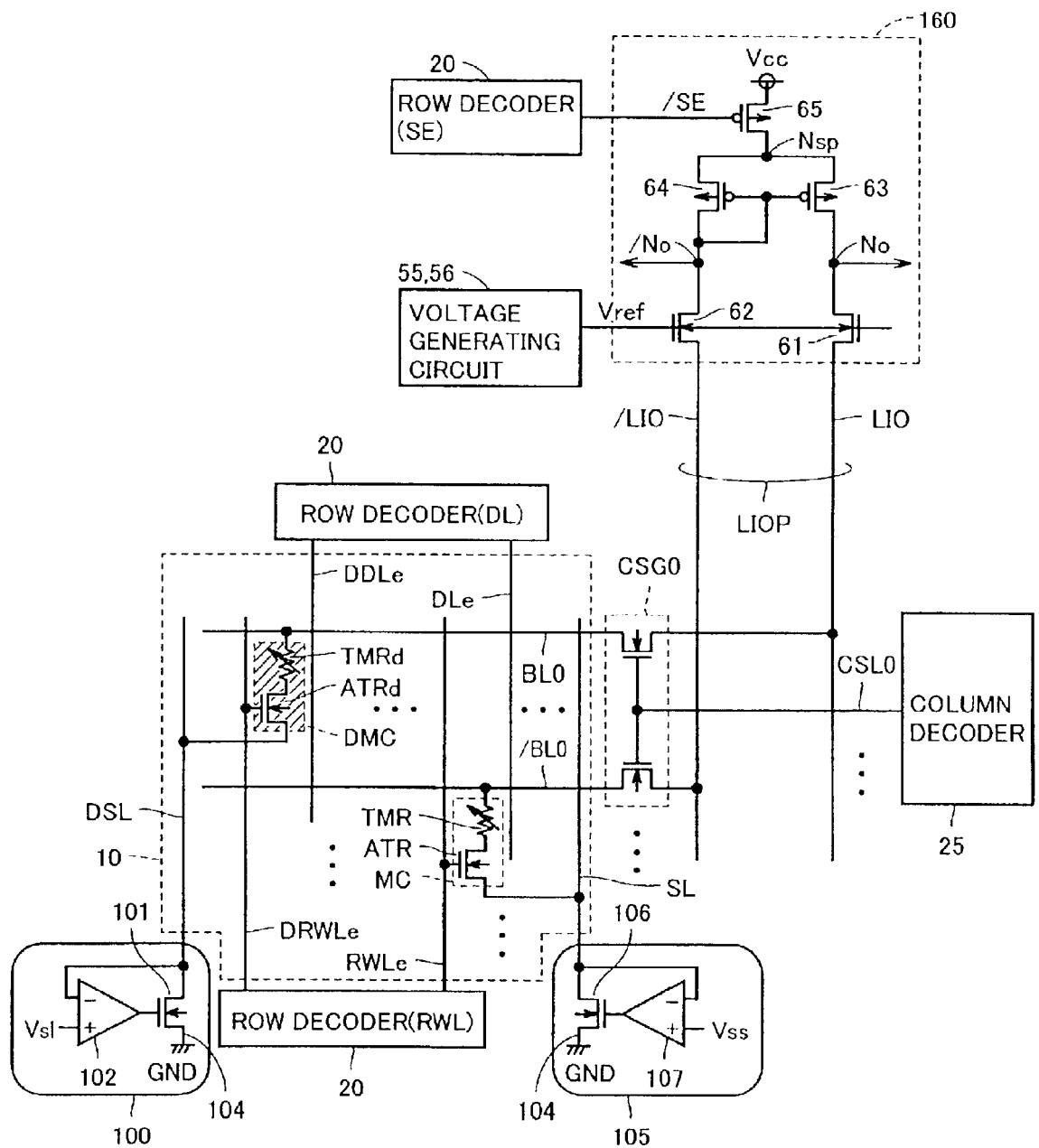
FIG. 16 is a circuit diagram showing a structure of a data read circuit system according to a third modification of the third embodiment.

Referring to FIG. 16, a structure of a third modification of the third embodiment differs from the structure of the second modification of the third embodiment shown in FIG. 15 in that a current transmitting circuit 105 is further employed for source voltage line SL supplying predetermined voltage Vss to the normal memory cell.

Current transmitting circuit 105 includes a transistor 106 electrically coupled between source voltage line SL and a ground node 104, and a sense amplifier 107 for amplifying a voltage difference between the voltage on source voltage line SL and predetermined voltage Vss corresponding to the reference value thereof, and applying it to the gate of transistor 106. The passing current of transistor 106 is controlled to maintain predetermined voltage Vss on source voltage line SL. In current transmitting circuit 100, transistor 101 is arranged between dummy source voltage line and ground node 104.

According to the structure of the third modification of the third embodiment, as described above, the predetermined voltage Vss, which is applied as the source voltage of access transistor ATR of the normal memory cell, is set to a voltage different from ground voltage GND.

Figure 17:
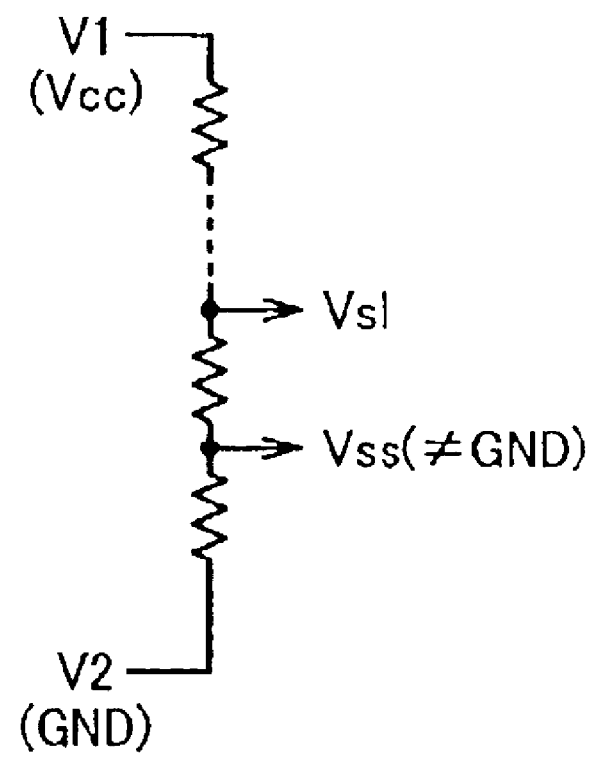
FIG. 17 conceptually shows a structure for producing a reference voltage of a source voltage line shown in FIG. 16.

As shown in FIG. 17, one of source voltage Vs1 for the dummy cell and the source voltage (Vss) for the normal memory cell is generated based on the other of them by using the same voltage dividing path. In general, it is difficult to maintain strictly the absolute levels of source voltages Vs1 and Vss produced as the reference voltage. By the foregoing structure, however, the relative level difference between source voltages Vs1 and Vss can be stably maintained.

In the data read operation according to the third embodiment, reference current Iref is produced by providing an intended difference between the voltage applied across the opposite ends of the selected memory cell and the voltage applied across the opposite ends of the dummy cell. Therefore, the structure of the third modification of the third embodiment can set reference current Iref more accurately by suppressing variations thereof.

Fourth Embodiment

A fourth embodiment will now be described in connection with a structure, in which the MTJ memory cells are arranged in a plurality of divided memory blocks, and the data read circuit system is shared by the plurality of memory blocks.

Figure 18:
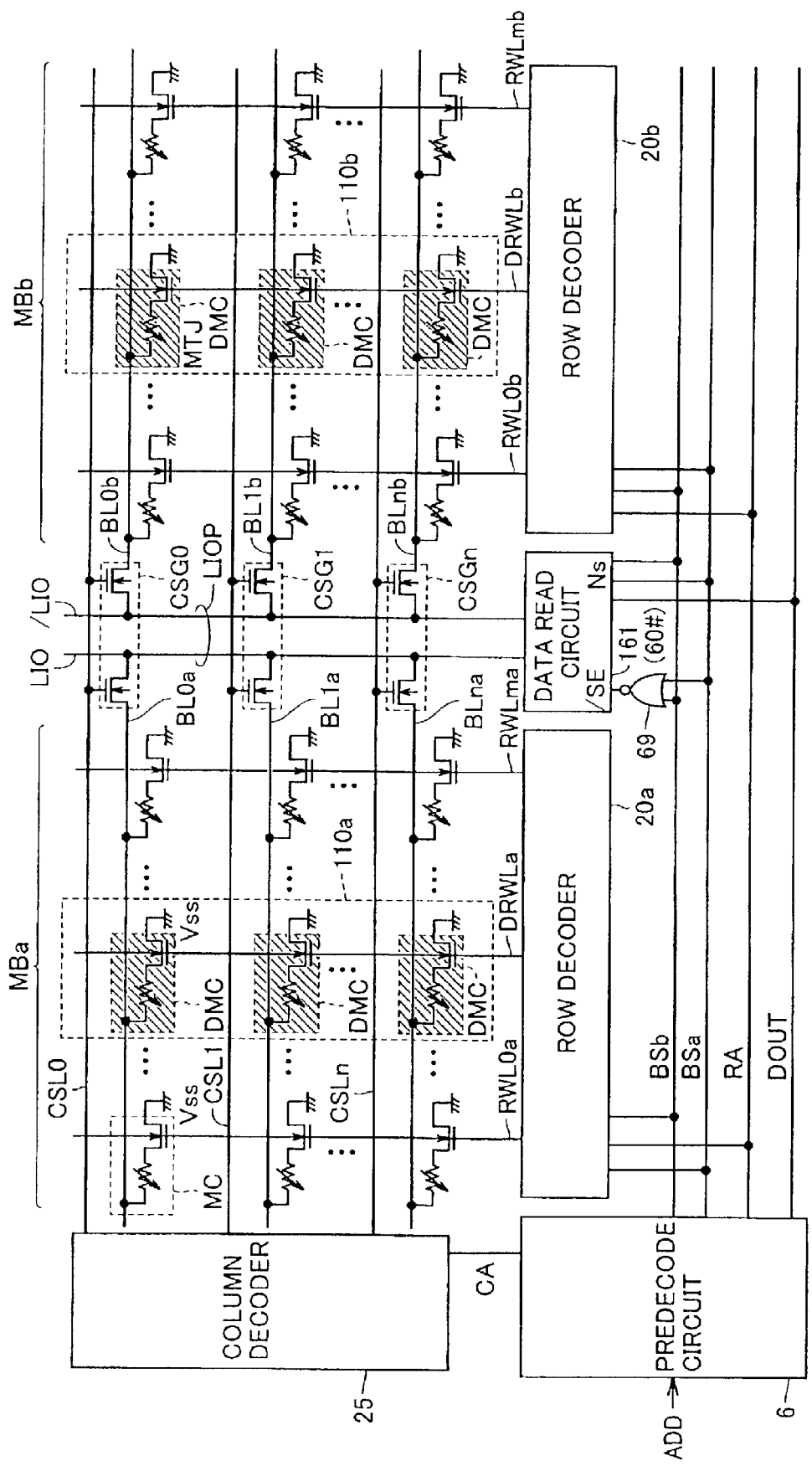
FIG. 18 is a circuit diagram showing a structure of a data read circuit system according to a fourth embodiment.

FIG. 18 is a circuit diagram showing a structure of the data read circuit system according to the fourth embodiment.

Referring to FIG. 18, the plurality of MTJ memory cells are arranged in divided memory blocks MBa and MBb, which are alternatively selected as the data read target.

Memory blocks MBa and MBb share the memory cell column. Therefore, column select lines CSL0–CSLn provided corresponding to the respective memory cell columns are shared by memory blocks MBa and MBb. Column decoder 25 selectively activates column select lines CSL0–CSLn in accordance with column address CA.

Read word lines RWL arranged corresponding to the respective memory cell rows in each memory block are independent from those in the other memory block. Dummy cells DMC are arranged such that dummy cell rows 110a and 110b are formed in memory blocks MBa and MBb, respectively. For example, memory block MBa is provided with read word lines RWL0a–RWLma corresponding to the normal memory cell rows of (m+1) (m: natural number) in number as well as a dummy read word line DRWLa corresponding to dummy cell row 110a. Likewise, memory block MBb is provided with read word lines RWL0b–RWLmb corresponding to the normal memory cell rows of (m+1) in number as well as a dummy read word line DRWLb corresponding to dummy cell row 110b.

Row decoders 20a and 20b are provided corresponding to memory blocks MBa and MBb, respectively. Row decoders 20a and 20b receive block select signal BSa and BSb, which represent the results of selection of memory blocks MBa and MBb, respectively, and execute the row selection in accordance with row address RA.

More specifically, when memory block MBa is selected as the data read target and block select signal BSa becomes active (H-level), row decoder 20a selectively activates one of read word lines RWL0a–RWLma based on row address RA. Row decoder 20b activates dummy read word line DRWLb for selecting dummy cell row 110b.

Conversely, when memory block MBb is selected as the data read target and block select signal BSb becomes active (H-level), row decoder 20b selectively activates one of read word lines RWL0b–RWLmb based on row address RA. Row decoder 20a activates dummy read word line DRWLa for selecting dummy cell row 110a.

Corresponding to the respective memory cell columns of (n+1) (n: natural number) in number, each of memory blocks MBa and MBb is provided with bit lines BL0a–BLna or bit lines BL0b–BLnb, which are independent of bit lines BL0b–BLnb or BL0a–BLna arranged in the other memory block. Complementary data lines LIO and /LIO are arranged in the direction of read word line RWL, and are shared by memory blocks MBa and MBb. Column select gates CSG0–CSGn are arranged corresponding to the memory cell columns, respectively. Each of column select gates CSG0–CSGn connects corresponding one of bit lines BL0a–BLna to data line LIO in response to the activation (H-level) of corresponding one of column select lines CSL0–CSLn, and connects corresponding one of bit lines BL0b–BLnb to data line/LIO.

A data read circuit 161 has a structure and a function similar to those of differential amplifier 60# shown in FIG. 7. Data read circuit 161 operates in response to block select signals BSa and BSb instead of address signals RA0 and /RA0 shown in FIG. 7. Logic gate 69 applies a result of logical NOR between block select signals BSa and BSb to data read circuit 161 as sense enable signal/SE. Sense enable signal/SE thus produced is sent to the gate of transistor 65 shown in FIG. 2 so that supply of the operation current for executing the differential amplifying operation by data read circuit 161 starts when one of memory blocks MBa and MBb is selected as the data read target, and one of block select signals BSa and BSb is activated to attain H-level.

When memory block MBa is selected as the data read target, the selected memory cell in memory block MBa is connected to data line LIO, and the dummy cell in memory block MBb is connected to data line/LIO. Conversely, when memory block MEb is selected as the data read target, the selected memory cell in memory block MiBab is connected to data line/LIO, and the dummy cell in memory block MBa is connected to data line LIO.

As described above, the data read operation according to the second modification of the first embodiment is executed in accordance with the passing current difference between data lines LIO and /LIO, which are connected to the selected memory cell and one dummy cell, respectively, and the storage data can be read from the selected memory cell.

Owing to the above structure, the two memory blocks can share complementary data lines LIO and /LIO as well as the data read circuit corresponding to the differential amplifier so that the circuit scale of the data read circuit system can be small.

Modification of the Fourth Embodiment

Figure 19:
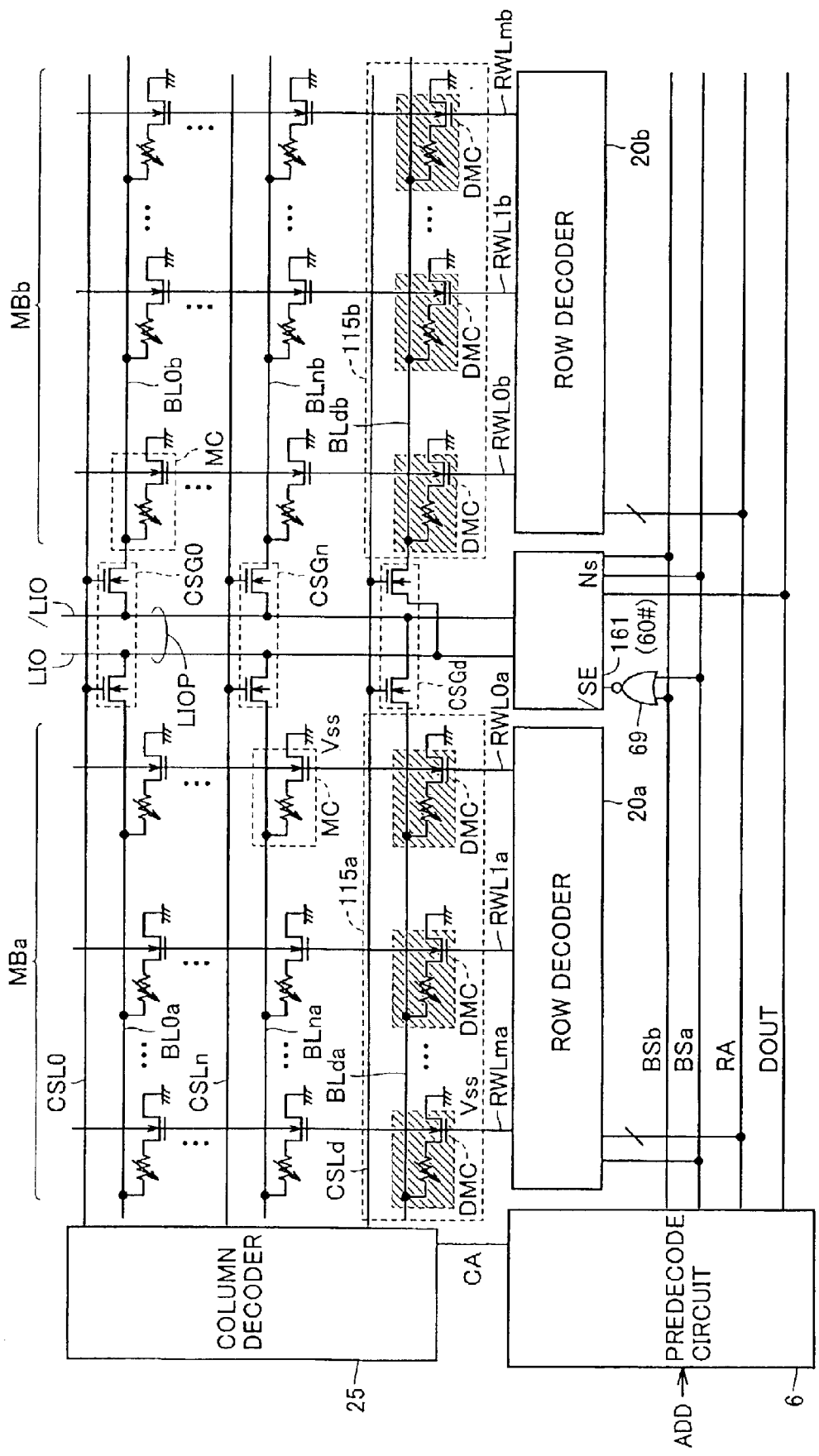
FIG. 19 is a circuit diagram showing a structure of a data read circuit system according to a modification of the fourth embodiment.

Referring to FIG. 19, a structure of a modification of the fourth embodiment differs from the structure of the fourth embodiment shown in FIG. 18 in that dummy cells are arranged to form dummy cell columns 115a and 115b in memory block MBa and MBb, respectively.

Accordingly, each of read word lines RWL0a–RWLma and RWL0b–RWLmb arranged in memory blocks MBa and MBb is shared by normal memory cell MC and dummy cell DMC. However, bit lines BL0a–BLna in memory block MBa are arranged corresponding to the normal memory cell columns, respectively, and bit lines BL0b–BLnb in memory block MBb are arranged corresponding to the normal memory cell columns, respectively. Further, memory blocks MBa and MBb are provided with dummy bit lines BLda and BLdb corresponding to dummy cell columns 115a and 115b, respectively.

Column select gates CSG0–CSGn are provided corresponding to the (n+1) normal memory cell columns, respectively, and dummy column select gate CSGd is provided corresponding to dummy cell columns 115a and 115b. Each of column select gates CSG0–CSGn connects corresponding one of bit lines BL0a–BLna to data line LIO in response to the activation (H-level) of the corresponding one of column select lines CSL0–CSLn, and also connects corresponding one of bit lines BL0b–BLnd to data line/LIO. Dummy column select gate CSGd connects dummy bit lines BLda and BLdb to data lines/LIO and LIO in response to activation of dummy column select line CSLd, respectively.

In the data read operation, column decoder 25 selectively activates column select lines CSL0–CSLn in accordance with column address CA, and in parallel with this, activates dummy column select line CSLd to attain H-level independently of the results of address selection. When memory block MBa includes the selected memory cell, row decoder 20a selectively activates one of read word lines RWL0a–RWLma in accordance with row address RA. When memory block MBb includes the selected memory cell, row decoder 20b selectively activates one of read word lines RWL0b–RWLmb in accordance with row address RA. Structures and operations other than the above are substantially the same as those of the fourth embodiment shown in FIG. 18, and therefore, description thereof is not repeated.

According to the above structure, when memory block MBa includes the selected memory cell in the data read operation, the selected memory cell is connected to data line LIO, and the dummy cell, which is located in memory block MBa and belongs to the same memory cell row as the selected memory cell, is connected to data line/LIO. Conversely, when memory block MBb includes the selected memory cell in the data read operation, the selected memory cell is connected to data line/LIO, and the dummy cell, which is located in memory block MBb and belongs to the same memory cell row as the selected memory cell, is connected to data line LIO.

Accordingly, even in the case where the dummy cells are arranged in each memory block to form the cell column, the two memory blocks can share complementary data lines LIO and /LIO as well as data read circuit 161 similarly to the fourth embodiment, and the data read structure having the reduced circuit scale can be achieved.

In the fourth embodiment and the modification thereof, differential amplifier 60 and connection switching circuit 70 may be combined to form a data read circuit 161 shared by the two memory blocks, similarly to the first modification of the first embodiment. In this case, connection switching circuit 70 must switch the connection relationship between data lines LIO and /LIO and transistors 61 and 62 shown in FIG. 2 in accordance with block select signals BSa and BSb.

In memory blocks MBa and MBb, the source voltage applied to the normal memory cells may be independent of the source voltage applied to the dummy cell, similarly to the third embodiment. In this case, data read circuit 160 shown in FIG. 13 is arranged instead of data read circuit 161. In the case where the structure according to the third embodiment is combined with the structure according to fourth embodiment or the modification thereof, the two memory blocks can likewise share data read circuit 160, data lines LIO and /LIO, and the source voltage lines corresponding to the normal memory cells and the dummy cells.

Fifth Embodiment

A fifth embodiment will now be described in connection with a structure of a dummy cell, which has an intermediate electric resistance, and can be arranged efficiently in accordance with a pitch of the normal memory cell.

Figure 20:
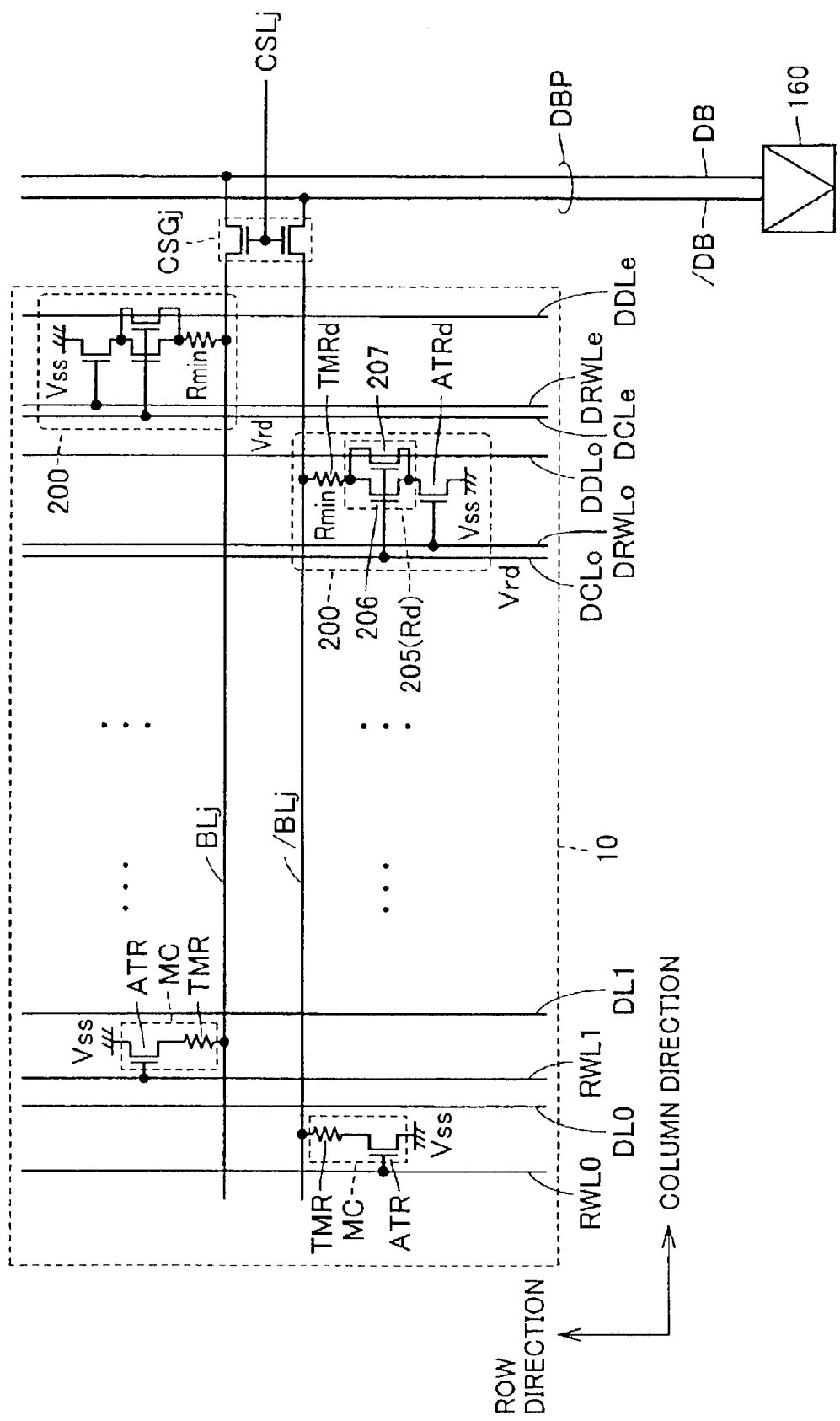
FIG. 20 is a circuit diagram illustrating a first example of structure and arrangement of dummy cells according to a fifth embodiment.

According to a structure of a fifth embodiment shown in FIG. 20, memory array 10 is provided with normal memory cells MC and dummy cells 200 according to the fifth embodiment, which are arranged similarly to the structure shown in FIG. 4. Thus, normal memory cells MC and dummy cells 200 in alternate rows are arranged in a zigzag or staggered fashion with respect to those in neighboring rows based on the folded bit line structure. More specifically, dummy cells 200 are arranged similarly to dummy cells DMC shown in FIG. 4 so that dummy cells 200 may provide two dummy cell rows corresponding to the odd- and even-numbered rows of the normal memory cells, respectively. Dummy read word line DRWLo and dummy digit line DDLo are arranged for the dummy cell row corresponding to the odd-numbered row, and dummy read word line DRWLe and dummy digit line DDLe are arranged for the dummy cell row corresponding to the even-numbered row.

FIG. 20 representatively shows read word lines RWL0 and RWL1, digit lines DL0 and DL1, bit line pair BLP and normal memory cells corresponding to the first and second memory cell rows and the jth memory cell column, and also shows the dummy cells corresponding to these normal memory cells. Bit line pair BLPj is formed of complementary bit lines BLj and /BLj.

In each memory cell column, complementary bit lines BL and /BL are connected to data buses DB and /DB forming a data bus pair DBP via corresponding column select gate CSG. For example, bit lines BLj and /BLj corresponding to the jth memory cell column are connected to data buses DB and /DB in response to the activation of corresponding column select line CSLj, respectively.

Data read circuit 160 has a structure similar to that in the third embodiment already described, and reads the data from the selected memory cell by detecting and amplifying the passing current difference, which occurs between data buses DB and /DB, and directly reflects the passing current difference between the selected memory cell and the dummy cell.

Dummy cell 200 includes dummy access element ATRd, dummy magneto-resistance element TMRd and a dummy resistance adding portion 205, which are connected in series between predetermined voltage Vss and corresponding bit line BL or /BL. Each dummy magneto-resistance element TMRd is magnetized in advance so that dummy cell DMC has electric resistance Rmin. The gate of dummy access element ATRd in each dummy cell row is connected to dummy read word line DRWLo or DRWLe.

Electric resistance Rd of dummy resistance adding portion 205 must be smaller than $\Delta R$, and is preferably set to $\Delta R/2$. Thereby, dummy cell 200 has the electric resistance of (Rmin+$\Delta R/2$), which is intermediate between two kinds of electric resistances Rmax and Rmin of the selected memory cell.

Dummy resistance adding portion 205 has at least one transistor connected in parallel. FIG. 20 shows an example, in which two field-effect transistors 206 and 207 form dummy resistance adding portion 205. Field-effect transistors 206 and 207 forming dummy resistance adding portion 205 are designed and manufactured similarly to access transistor ATR in normal memory cell MC, and have the same size as access transistor ATR.

Accordingly, dummy cell 200 formed on a semiconductor substrate may employ such a layout that dummy access element ATRd and field-effect transistors 206 and 207 are arranged in parallel, whereby dummy cells 200 can be efficiently arranged at the same pitch in the row direction (i.e., at the same bit line pitch) as the normal memory cells.

In each dummy cell row, the gate of each of field-effect transistors 206 and 207 is connected to one of control voltage lines DCLo and DCLe transmitting an adjustable control voltage Vrd. Therefore, dummy resistance Rd of dummy resistance adding portion 205 can be tuned by adjusting control voltage Vrd. In other words, control voltage Vrd is adjusted to provide preferable resistance value ($\Delta R/2$).

The structure described above does not require a special structure in data read circuit 160 for providing an offset between the passing currents of data buses DB and /DB, and can provide the dummy cell, which has an intermediate electric resistance and allows arrangement at the same pitch as the normal memory cells.

Figure 21:
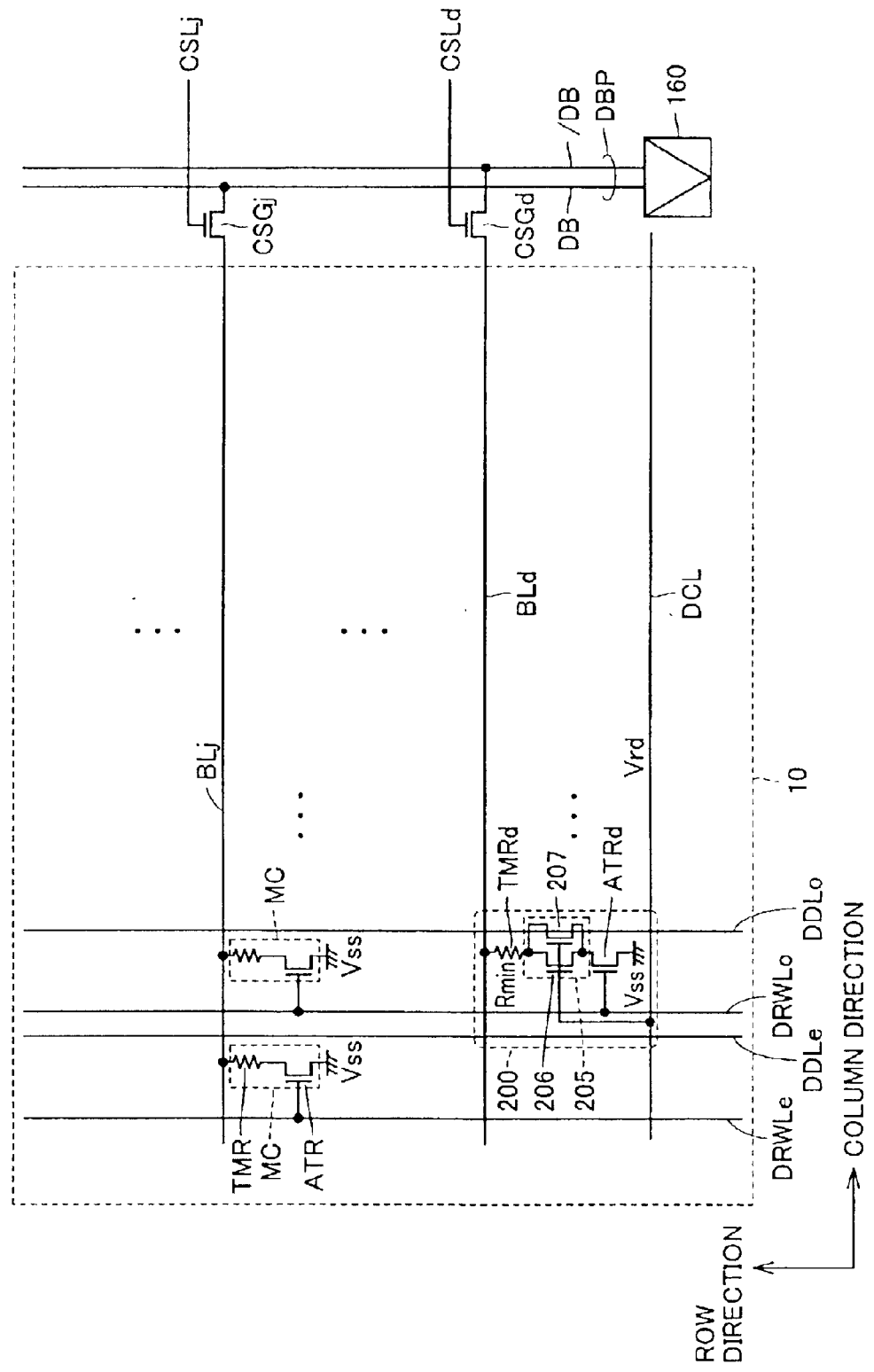
FIG. 21 is a circuit diagram illustrating a second example of the structure and arrangement of dummy cells according to the fifth embodiment.

Dummy cells 200 according to the fifth embodiment can be arranged in memory array 10 to form a dummy cell column as shown in FIG. 21.

Referring to FIG. 21, bit line BLd and control voltage line DCL are arranged for dummy cells 200 forming a dummy cell column. Dummy cells 200 share the memory cell rows with normal memory cells MC. Therefore, when read word line RWL in the selected row is activated to attain H-level in accordance with the results of row selection, dummy access element ATRd in the corresponding dummy cell is turned on.

Dummy column select gate CSGd is arranged corresponding to dummy cell column for controlling connection between data bus/DB and bit line BLd in response to activation of dummy column select line CSLd. In the data read operation, dummy column select line CSLd is activated to attain H-level regardless of the results of address selection so that data bus/DB is connected to bit line BLd connected to the dummy cell. Meanwhile, the bit line (e.g., bit line BLj) corresponding to the selected memory cell is connected to data bus DB. Thus, in the data read operation, data bus DB is connected to bit line BL, which is selected from the plurality of bit lines BL corresponding the normal memory cells and corresponds to the selected column.

Therefore, data read circuit 160 can reads the data from the selected memory cell by detecting and amplifying the passing current difference between data buses DB and /DB, which are connected in series to the selected memory cell and the dummy cell, respectively.

In the structure shown in FIG. 21, dummy access transistor ATRd and field-effect transistors 206 and 207, which have the same sizes, may be continuously arranged in the row direction, whereby dummy cells 200 can be arranged in accordance with the arrangement pitch (i.e., read word line pitch) of the normal memory cells in the column direction. Thereby, it is possible to prevent increase in area of memory array 10, and dummy cells 200 can be arranged efficiently.

Sixth Embodiment

A sixth embodiment will be described in connection with another example of the structure for executing the data reading by using dummy cells, which have structures and forms similar to those of the normal memory cells.

Figure 22:
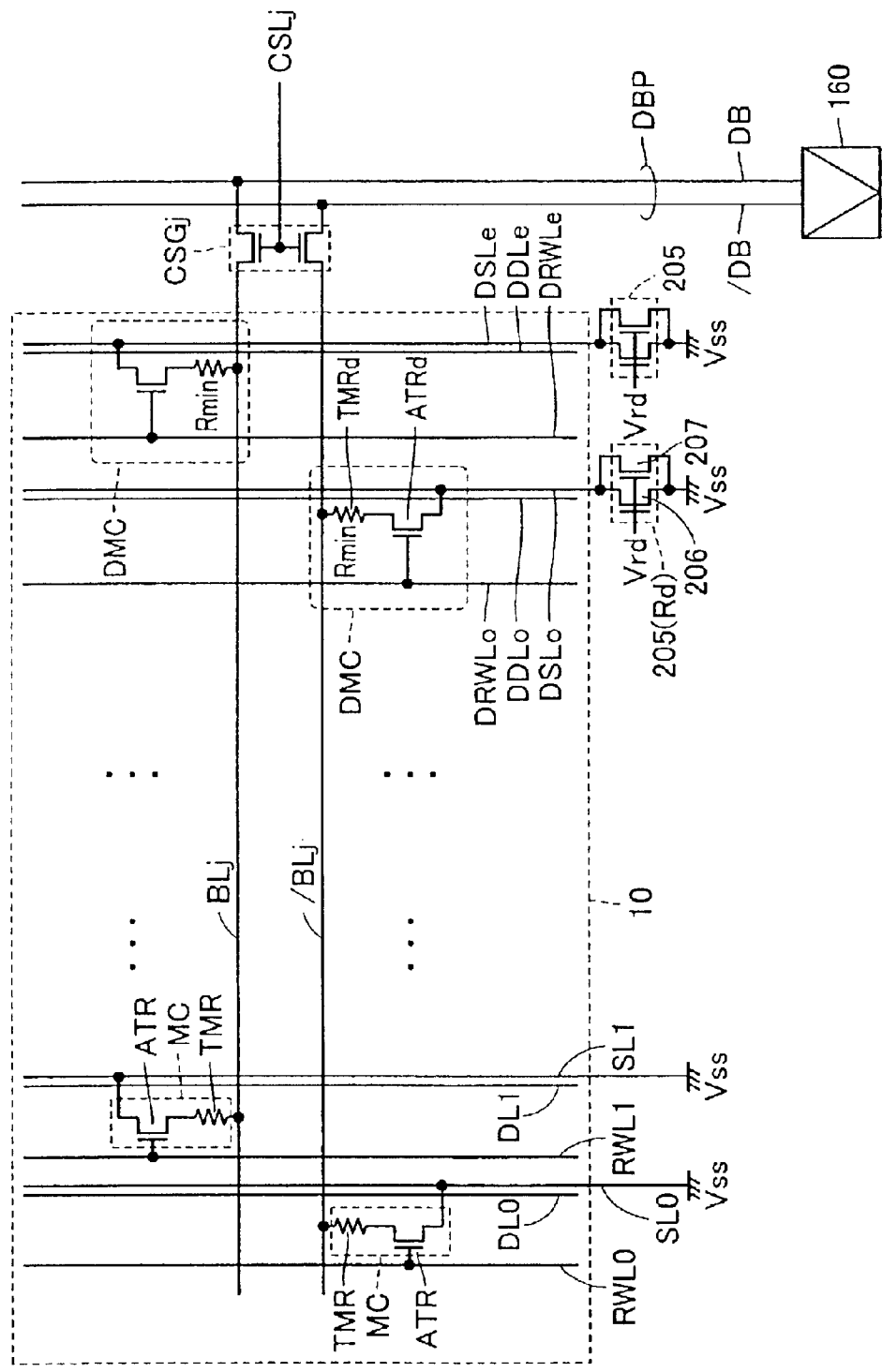
FIG. 22 is a circuit diagram showing a structure of a data read circuit system according to a sixth embodiment.

In a structure according to the sixth embodiment shown in FIG. 22, memory array 10 is provided with normal memory cells MC and dummy cells DMC, which are arranged similarly to the structure shown in FIG. 4 so that these cells in alternate rows are arranged in a zigzag fashion with respect to those in neighboring rows based on the folded bit line structure. As already described, dummy cell DMC has the structure and form similar to those of normal memory cell MC so that dummy cells DMC can be arranged continuously to normal memory cells MC in a matrix form. In each dummy cell DMC, dummy magneto-resistance element TMRd is magnetized in advance to have electric resistance Rmin.

Read word lines RWL and digit lines DL, which are arranged corresponding to the normal memory cell rows, are arranged similarly to FIG. 4. Also, dummy read word lines DRWLe and DRWLo as well as dummy digit lines DDLe and DDLo, which are arranged corresponding to the dummy cell rows, are arranged similarly to FIG. 4. Further, complementary bit lines BL and /BL, which are shared by the normal memory cells and dummy cells, and are provided corresponding to the memory cell columns, are arranged similarly to FIG. 4. Therefore, description of arrangements of these lines is not repeated.

Corresponding to the normal memory cell rows, source voltage lines SL0, SL1, . . . are arranged for setting the sources of access transistors ATR to predetermined voltage Vss. In dummy cells DMC, predetermined voltage Vss is supplied to the sources of dummy access transistors ATRd via dummy source voltage lines DSLe and DSLo arranged corresponding to the two dummy cell rows, respectively.

In a position outside memory array 10, dummy resistance adding portion 205 is connected between predetermined voltage Vss and each of dummy source voltage lines DSLe and DSLo. By this structure, dummy resistance adding portion 205 can add electric resistance Rd in series to each of dummy cells DMC belonging to the dummy cell row, which corresponds to active dummy read word line DRWLe or DRWLo. Thus, dummy resistance adding portion 205 can be shared by dummy cells DMC belonging to the same dummy cell row.

According to the above structure, the dummy cells can be completed by partially using the MTJ memory cells, which are continuously arranged in the same memory array, similarly to the first embodiment. Thus, special design and manufacturing steps for producing the dummy cells are not required. Therefore, an intended data read margin can be ensured by arranging the normal memory cells and the dummy cells in the same memory array without causing problems such as increase in chip area and impairing of a processing margin of the memory array and others, which may be caused by complication of the structures.

Similarly to the third embodiment, data read circuit 160 does not require a special structure for providing an offset between the passing currents of data buses DB and /DB, and thus the data reading can be executed by the data read circuit system having a simpler structure.

First Modification of the Sixth Embodiment

Figure 23:
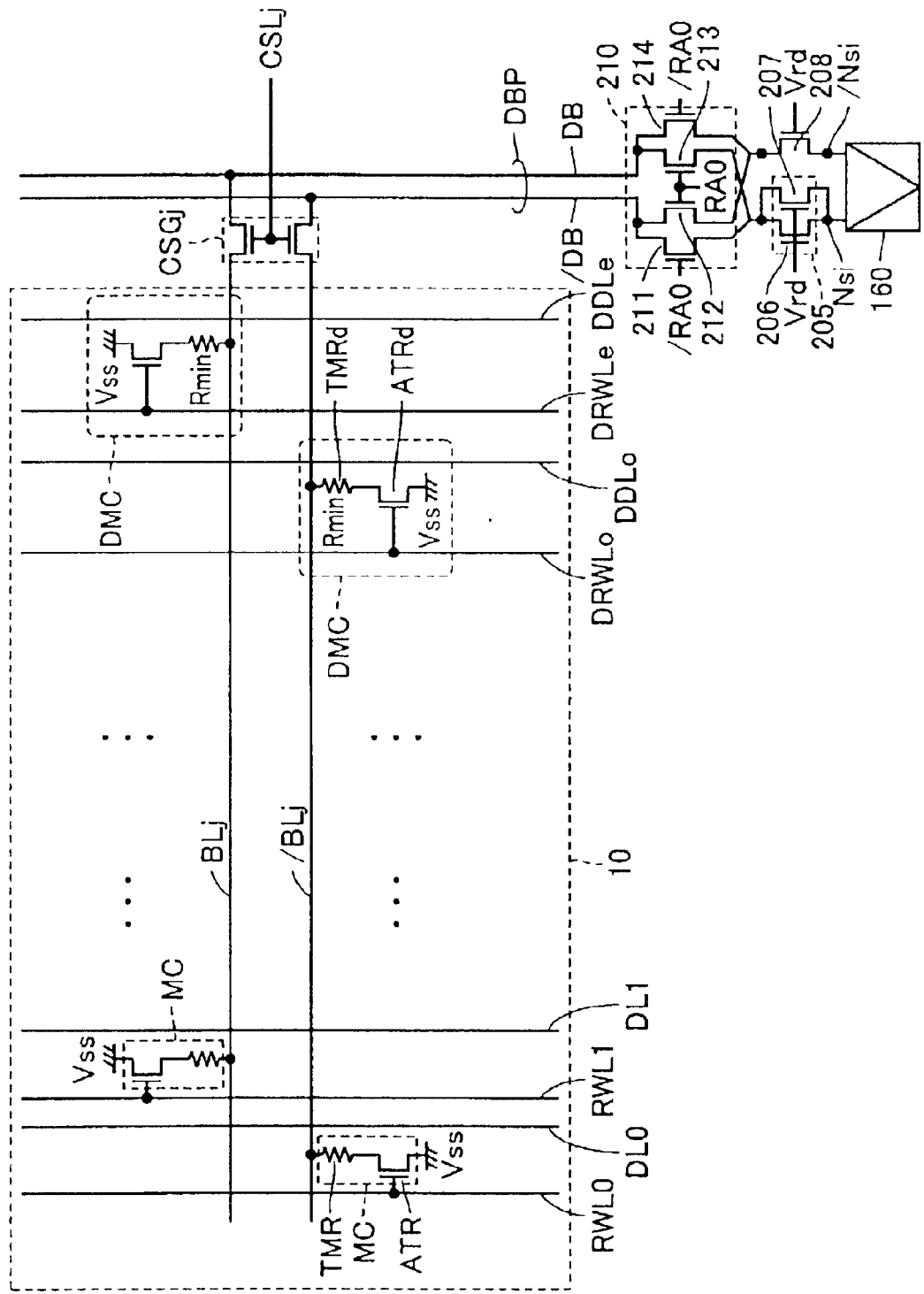
FIG. 23 is a circuit diagram showing a first example of a structure of a data read circuit system according to a first modification of the sixth embodiment.

Referring to FIG. 23, a structure of a first modification of the sixth embodiment differs from a structure of the sixth embodiment shown in FIG. 22 in that a dummy resistance adding portion 208 is employed in addition to dummy resistance adding portion 205. Dummy resistance adding portions 205 and 208 are arranged outside memory array 10 and between data buses DB and /DB and data read circuit 160. Dummy resistance adding portion 205 is connected in series to one (Nsi) of sense input nodes, and dummy resistance adding portion 208 is connected in series to the other sense input node/Nsi.

The structure of memory array 10 is similar to that shown in FIG. 22, and therefore, description thereof is not repeated. In memory array 10, the normal memory cells and dummy cells are arranged based on the folded bit line structure. Therefore, the connection relationship of data buses DB and /DB with respect to the selected memory cell and the dummy cell is switched based on the results of address selection, i.e., depending on the row selected between the odd-numbered and even-numbered rows.

In accordance with the above structure, the structure of the first modification of the sixth embodiment is further provided with a connection switching circuit 210 for switching the connection relationship of data buses DB and /DB with respect to dummy resistance adding portions 205 and 208 in accordance with the results of address selection.

Connection switching circuit 210 has transistor switches 211 and 212, which are electrically coupled between data bus/DB and dummy resistance adding portions 205 and 208, respectively, and also has transistor switches 213 and 214, which are electrically coupled between data bus DB and dummy resistance adding portions 205 and 208, respectively. Each of transistor switches 212 and 213 is supplied on its gate with address signal RA0, which is set to H-level when an odd-numbered row is selected. Each of transistor switches 211 and 214 is supplied on its gate with address signal/RA0, which is set to H-level when an even-numbered row is selected.

Consequently, when the odd-numbered row is selected, data bus DB electrically coupled to the selected memory cell is connected in series to dummy resistance adding portion 205, and data bus/DB electrically coupled to the dummy cell is connected in series to dummy resistance adding portion 208. When the even-numbered row is selected, data bus DB electrically coupled to the dummy cell is connected in series to dummy resistance adding portion 208, and data bus/DB electrically coupled to the selected memory cell is connected in series to dummy resistance adding portion 205.

Thus, connection switching circuit 210 connects dummy resistance adding portion 205 in series to the selected memory cell, and also connects dummy resistance adding portion 208 in series to the dummy cell, regardless of the results of address selection.

The electric resistances of dummy resistance adding portions 205 and 208 are determined such that the electric resistance equal to the sum of electric resistances of the dummy cell and dummy resistance adding portion 208 is at a level intermediate between two electric resistances, which are obtained by adding two kinds of electric resistances (Rmax and Rmin) of the selected memory cell to that of dummy resistance adding portion 205, respectively. For example, if the dummy cell has the electric resistance set to Rmin, dummy resistance adding portion 205 may be configured to add the electric resistance of $\Delta R/2$, and dummy resistance adding portion 208 may be configured to add the electric resistance of $\Delta R$, whereby the foregoing conditions can be satisfied in accordance with the following formula (3).

$$Rmin+\Delta R/2<Rmin+\Delta R<Rmax+\Delta R/2 \quad (3)$$

FIG. 23 shows by way of example the structures of dummy resistance adding portions 205 and 208 designed to satisfy the above conditions. Dummy resistance adding portion 205 has field-effect transistors 206 and 207 connected in parallel, and dummy resistance adding portion 208 is formed of one field-effect transistor, i.e., half the number of the transistors of dummy resistance adding portion 205. Each of transistors 206–208 is supplied on its gate with common control voltage Vrd. Thereby, the electric resistance of dummy resistance adding portion 205 is set to half the electric resistance of dummy resistance adding portion 208. Therefore, by adjusting control voltage Vrd to add the electric resistance of $\Delta R$ by dummy resistance adding portion 208, dummy resistance adding portion 205 can have the electric resistance of $\Delta R/2$ in accordance with such adjustment.

Owing to the above structure, a passing current difference of the polarity corresponding to the storage data of the selected memory cell can be produced between sense input nodes Nsi and /Nsi of data read circuit 160. By detecting and amplifying this passing current difference, the data can be read from the selected memory cell.

As described above, the structure of the first modification of the sixth embodiment can likewise provide the dummy cells by partially using the MTJ memory cells continuously formed in the same memory array 10, and therefore can achieve effects similar to those of the sixth embodiment.

Figure 24:
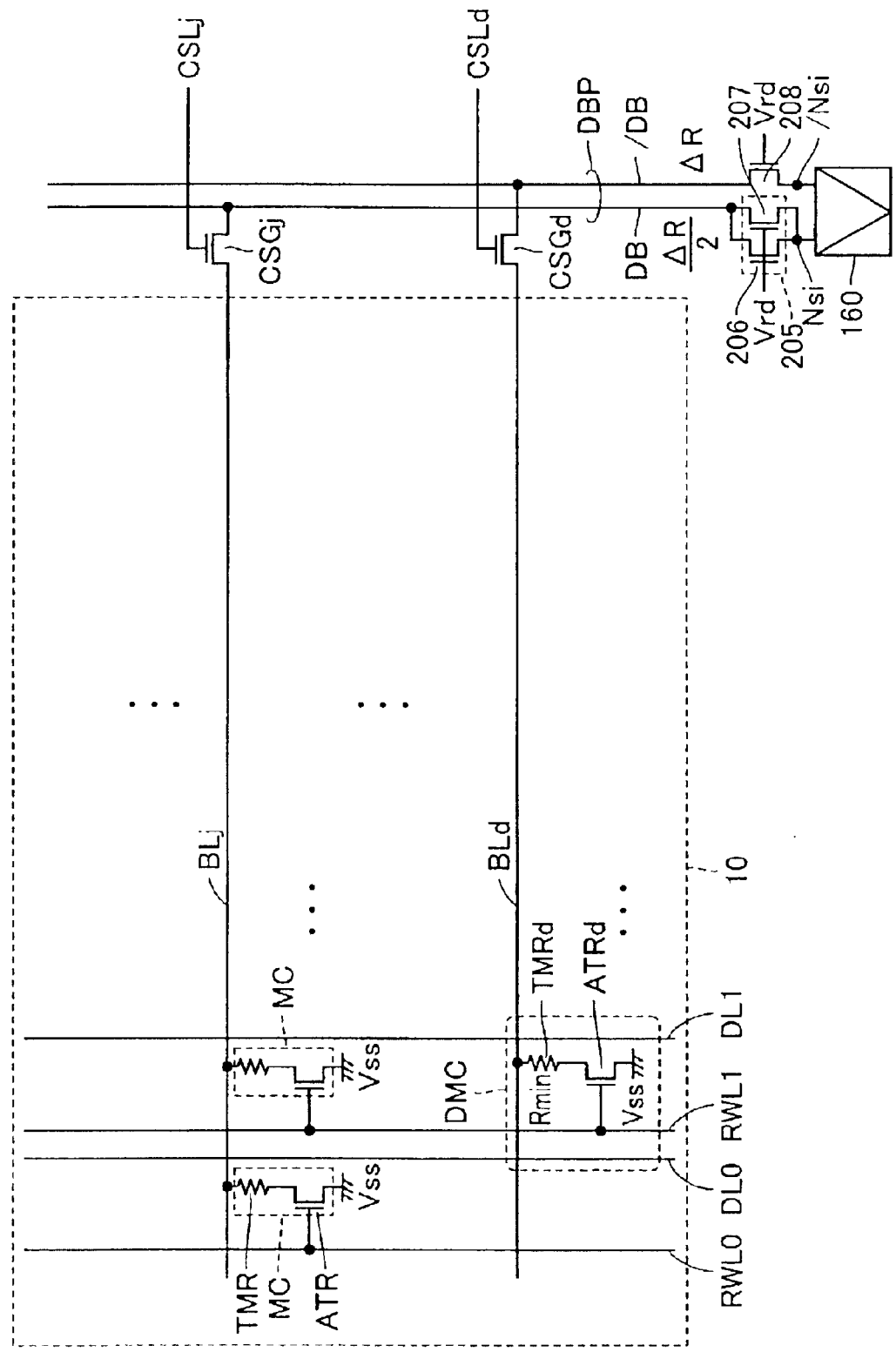
FIG. 24 is a circuit diagram showing a second example of the structure of the data read circuit system according to the first modification of the sixth embodiment.

As shown in FIG. 24, dummy cells DMC in memory array 10 may be arranged to form a dummy cell column corresponding to dummy bit line BLd, similarly to FIG. 21.

In this case, the connection relationship of data buses DB and /DB with respect to the selected memory cell and the dummy cell is fixed independently of the results of address selection, as already described with reference to FIG. 21. Thus, the structure does not employ connection switching circuit 210 shown in FIG. 23 for electrically coupling data buses DB and /DB to selected memory cell and dummy cell DMC in the data read operation, respectively, and dummy resistance adding portions 205 and 208 can be arranged between data buses DB and /DB and sense input nodes Nsi and /Nsi, respectively.

Second Modification of the Sixth Embodiment

In the structure shown in FIG. 24, an imbalance occurs between the load capacitances of data buses DB and /DB. A second modification of the sixth embodiment eliminates this imbalance.

Figure 25:
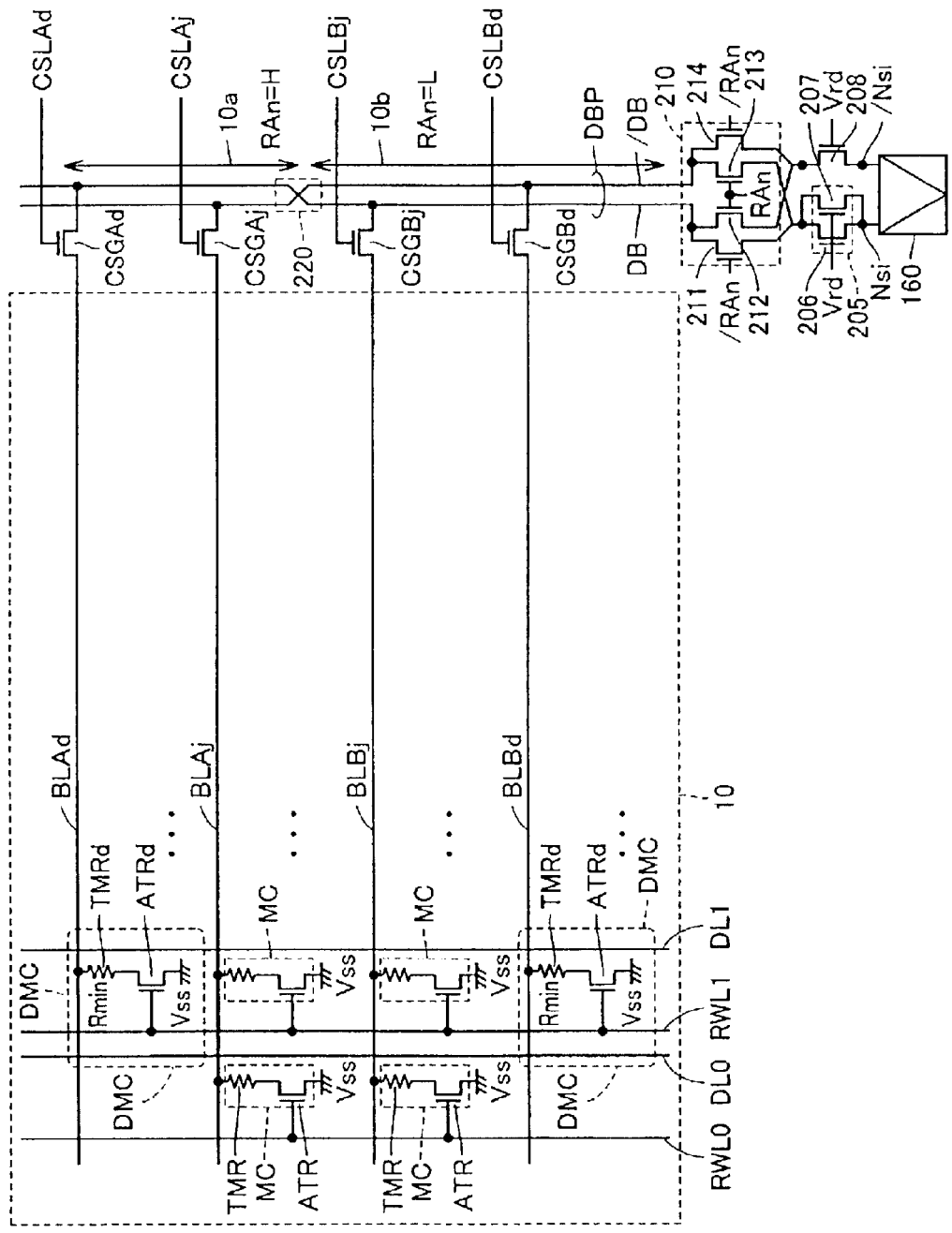
FIG. 25 is a circuit diagram showing a structure of a data read circuit system according to a second modification of the sixth embodiment.

Referring to FIG. 25, a structure of the second modification of the sixth embodiment differs from the structure shown in FIG. 24 in that memory array 10 is divided into two regions 10a and 10b. For example, selection of regions 10a and 10b is performed in accordance with address signal RAn. For example, when address signal RAn is at H-level, the selected memory cell is included in region 10a. When address signal RAn is at L-level, selected memory cell is included in region 10b.

In region 10a, each bit line is connected to data bus/DB via the column select gate. In region 10b, each bit line is connected to data bus DB via the column select gate. FIG. 25 representatively shows bit lines BLAj and BLBj corresponding to the memory cell column in the jth position in each of regions 10a and 10b.

The dummy cell column formed of dummy cells DMC is arranged in each of regions 10a and 10b. Dummy bit line BLAd provided corresponding to the dummy cell column in region 10a is connected to data bus DB via a dummy column select gate CSGAd, and dummy bit line BLBd provided corresponding to the dummy cell column in region 10b is connected to data bus/DB via a dummy column select gate CSGBd. Further, the positional relationship between data buses DB and /DB is switched in a region 220 intermediate between regions 10a and 10b. This structure can keep a balance between the load capacitances of data buses DB and /DB.

Similarly to the structure shown in FIG. 23, connection switching circuit 210 and dummy resistance adding portions 205 and 208 are arranged between data buses DB and /DB and data read circuit 160.

Connection switching circuit 210 operates in accordance with address signals RAn and /RAn to connect one of data buses DB and /DB, which is electrically coupled to the selected memory cell, to dummy resistance adding portion 205, and to connect the other electrically connected to the dummy cell to dummy resistance adding portion 208.

According to the structure of the second modification of the sixth embodiment, therefore, effects similar to those by the first modification of the sixth embodiment can be achieved while keeping a balance between the load capacitances of data buses DB and /DB. Thereby, the data reading can be performed fast.

Third Modification of the Sixth Embodiment

Figure 26:
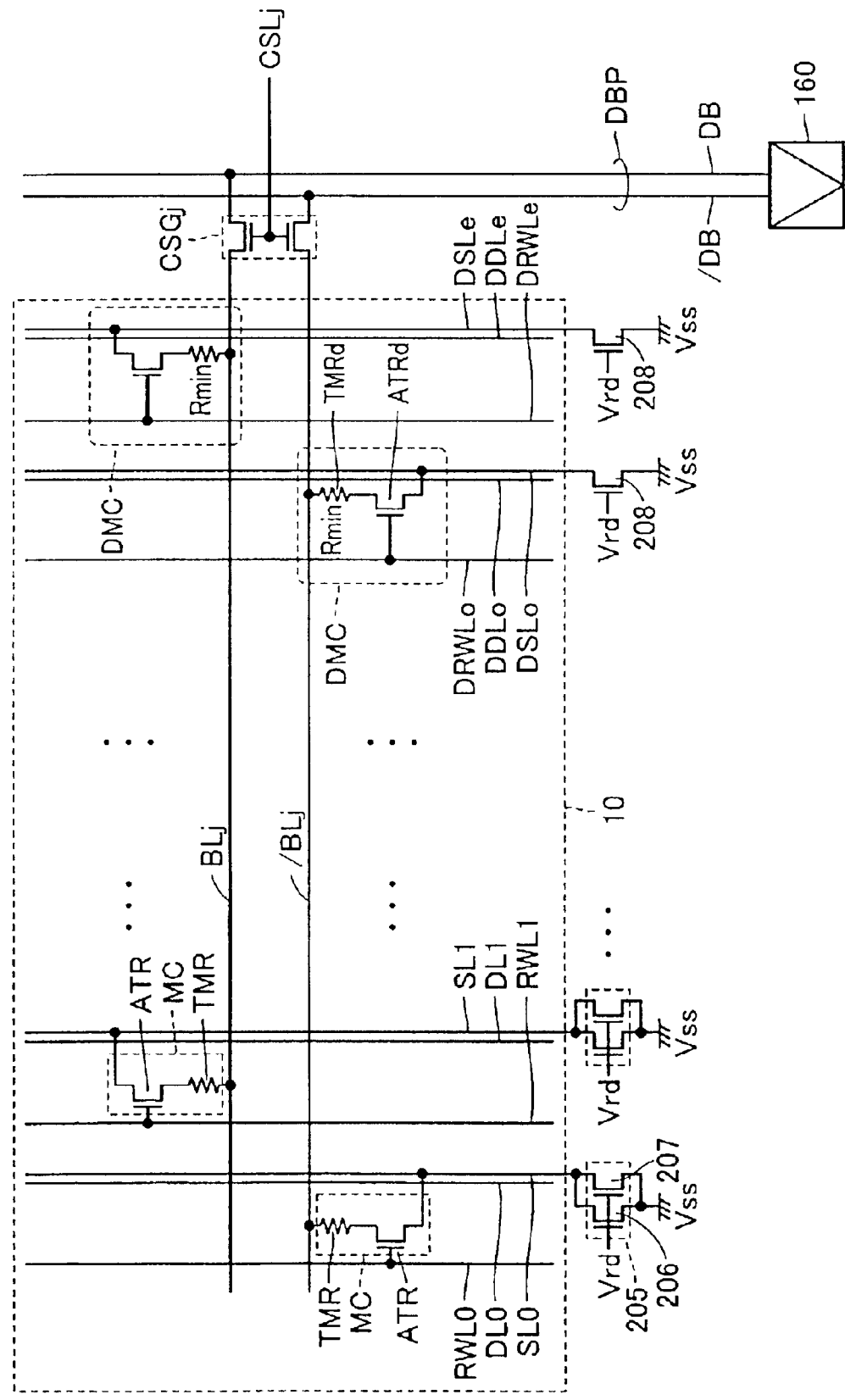
FIG. 26 is a circuit diagram showing a structure of a data read circuit system according to a third modification of the sixth embodiment.

In a structure of a third modification of the sixth embodiment shown in FIG. 26, dummy resistance adding portion 208 having the electric resistance of $\Delta R$ is connected in series to dummy cell DMC, and dummy resistance adding portion 205 having the electric resistance of $\Delta R/2$ is connected in series to the selected memory cell, similarly to the first and second modifications of the sixth embodiment. However, these dummy resistance adding portions 205 and 208 are not arranged between data read circuit 160 and data buses DB and /DB, but are arranged corresponding to source voltage lines SL0, SL1, . . . and dummy source voltage lines DSLo and DSLe, which are arranged similarly to those in FIG. 22.

More specifically, dummy resistance adding portion 205 having the electric resistance of ΔR/2 is arranged between each of source voltage lines SL0, SL1, . . . of the normal memory cells and predetermined voltage Vss, and dummy resistance adding portion 208 is arranged between each of dummy source voltage lines DSLo and DSLe and predetermined voltage Vss.

The above structure can execute the data reading similarly to the first and second modifications of the sixth embodiment. Further, the above structure allows the data reading without employing connection switching circuit 210 shown in FIG. 25 and others even in memory array 10 employing the folded bit line structure. Thus, the circuit structure of the data read circuit system can be simplified.

Fourth Modification of the Sixth Embodiment

Figure 27:
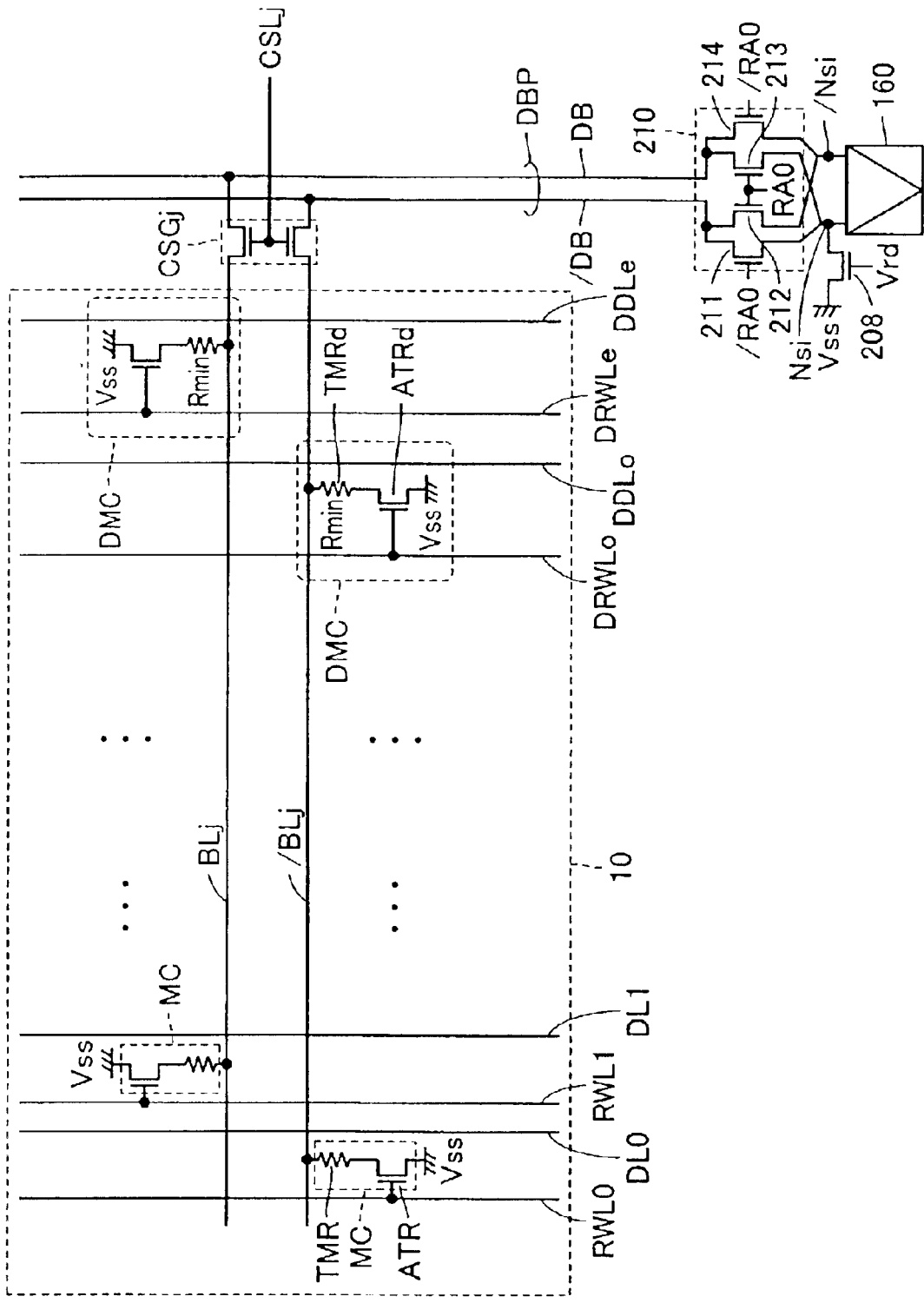
FIG. 27 is a circuit diagram showing a structure of a data read circuit system according to a fourth modification of the sixth embodiment.

Referring to FIG. 27, a structure of a fourth modification of the sixth embodiment differs from the structure shown in FIG. 23 in that only dummy resistance adding portion 208 is connected in parallel to sense input node Nsi. As already described, sense input node Nsi is electrically coupled by connection switching circuit 210 to the selected memory cell (electric resistance Rmax or Rmin) independently of the results of address selection (selection of the odd- or even-numbered row). However, sense input node/Nsi is connected in series to dummy cell (electric resistance Rmin).

Accordingly, an electric resistance Rdd of dummy resistance adding portion 208 is set such that the electric resistance of dummy cell is at a level intermediate between the composite resistances (Rmin//Rdd) and (Rmax//Rdd), which are provided by parallel connections of the two kinds of electric resistances Rmax and Rmin of the selected memory cell to electric resistance Rdd, respectively. For example, the electric resistance of the dummy cell may be equal to Rmin. Electric resistance Rdd of dummy resistance adding portion 208 can be adjusted by control voltage Vrd.

Owing to the above structure, the data reading can be performed while achieving effects similar to those of the first modification of the sixth embodiment.

Figure 31:
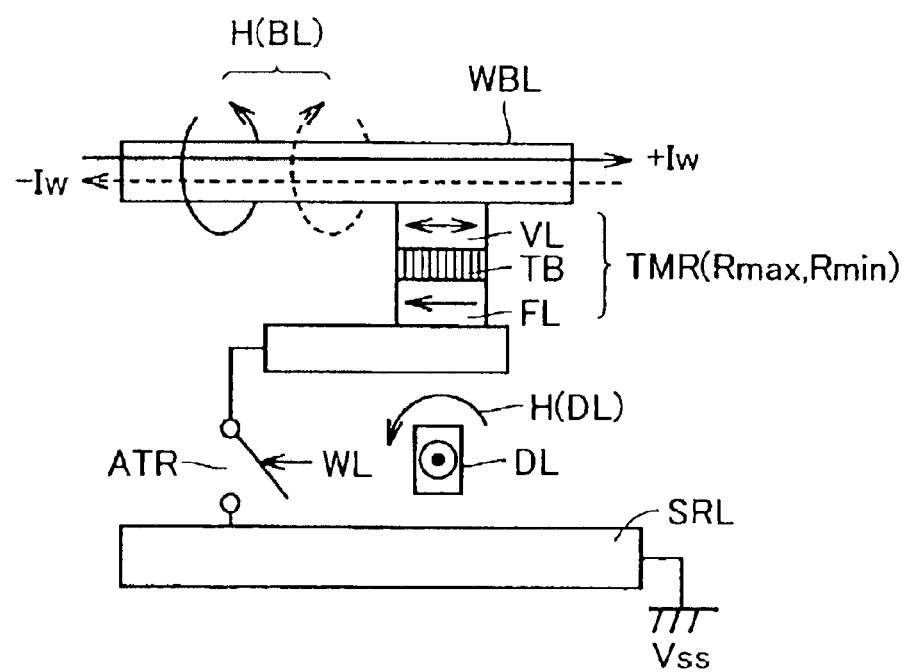
FIG. 31 conceptually illustrates an operation of writing data into the MTJ memory cell.
Figure 32:
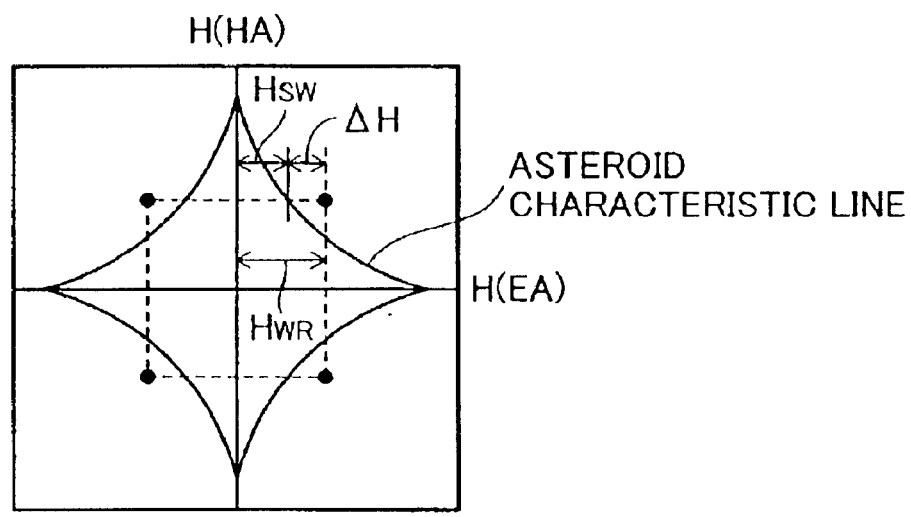
FIG. 32 conceptually illustrates a relationship between a data write current and a magnetization direction of a tunneling magneto-resistance element in a data write operation.
Figure 33:
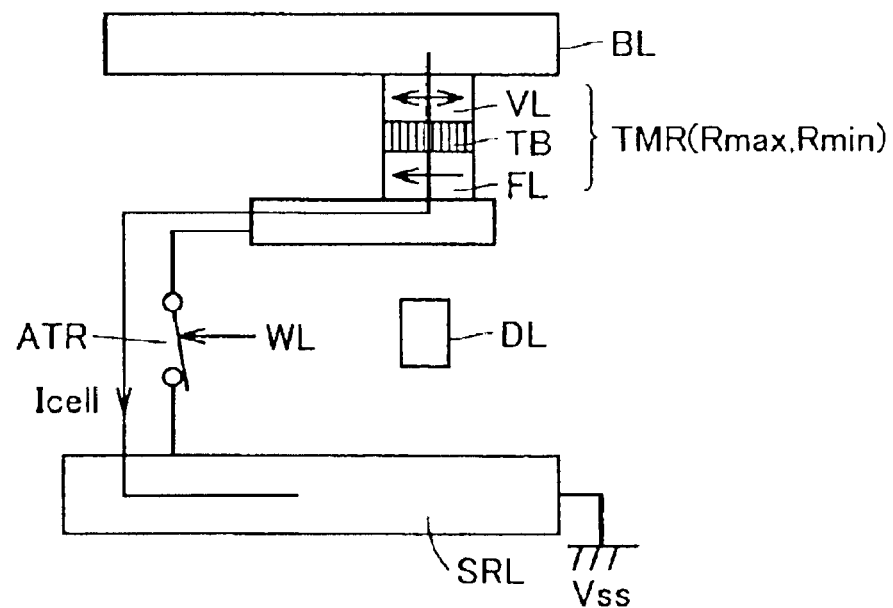
FIG. 33 conceptually illustrates an operation of reading data from the MTJ memory cell.

The sixth embodiment and the first to fourth modifications (FIGS. 20–27) thereof have been described in connection with the structures, in which the electric resistance of dummy magneto-resistance element TMRd in the dummy cell is preset to Rmin. This presetting is performed because fixed magnetic layer FL and free magnetic layer FL shown in FIG. 31 are magnetized in the same direction at the end of the step, which is performed for magnetizing fixed magnetic layer FL after producing memory array 10 in the manufacturing process of the MRAM device, and therefore the dummy cell has the electric resistance of Rmin. For setting the electric resistance of dummy cell DMC to Rmax, therefore, it is necessary to add a step of magnetizing dummy magneto-resistance element TMRd. In other words, by setting the electric resistance of dummy magneto-resistance element TMRd to Rmin, a new step of magnetizing the dummy cell is not required.

However, even in the case where dummy cell DMC has the electric resistance preset to Rmax, it is possible to employ the structures of the first to fourth modifications of the sixth embodiment shown in FIGS. 23 to 27. For such employment, it is merely required to switch the positions of dummy resistance adding portions 205 and 208 in the structures (FIGS. 23–26) of the first to third modifications of the sixth embodiment. In the structure (FIG. 27) of the fourth modification of the sixth embodiment, it is merely required to connect dummy resistance adding portion 208 in parallel to sense input node/Nsi, which is always connected to the dummy cell. Thereby, the data reading can be performed similarly.

Seventh Embodiment

A seventh embodiment will now be described in connection with a structure, which does not additionally employ the dummy resistance adding portion employed in the sixth embodiment and the modifications thereof, and can execute the data reading based on the passing current difference between the selected memory cell and the dummy cell, which are produced similarly.

Figure 28:
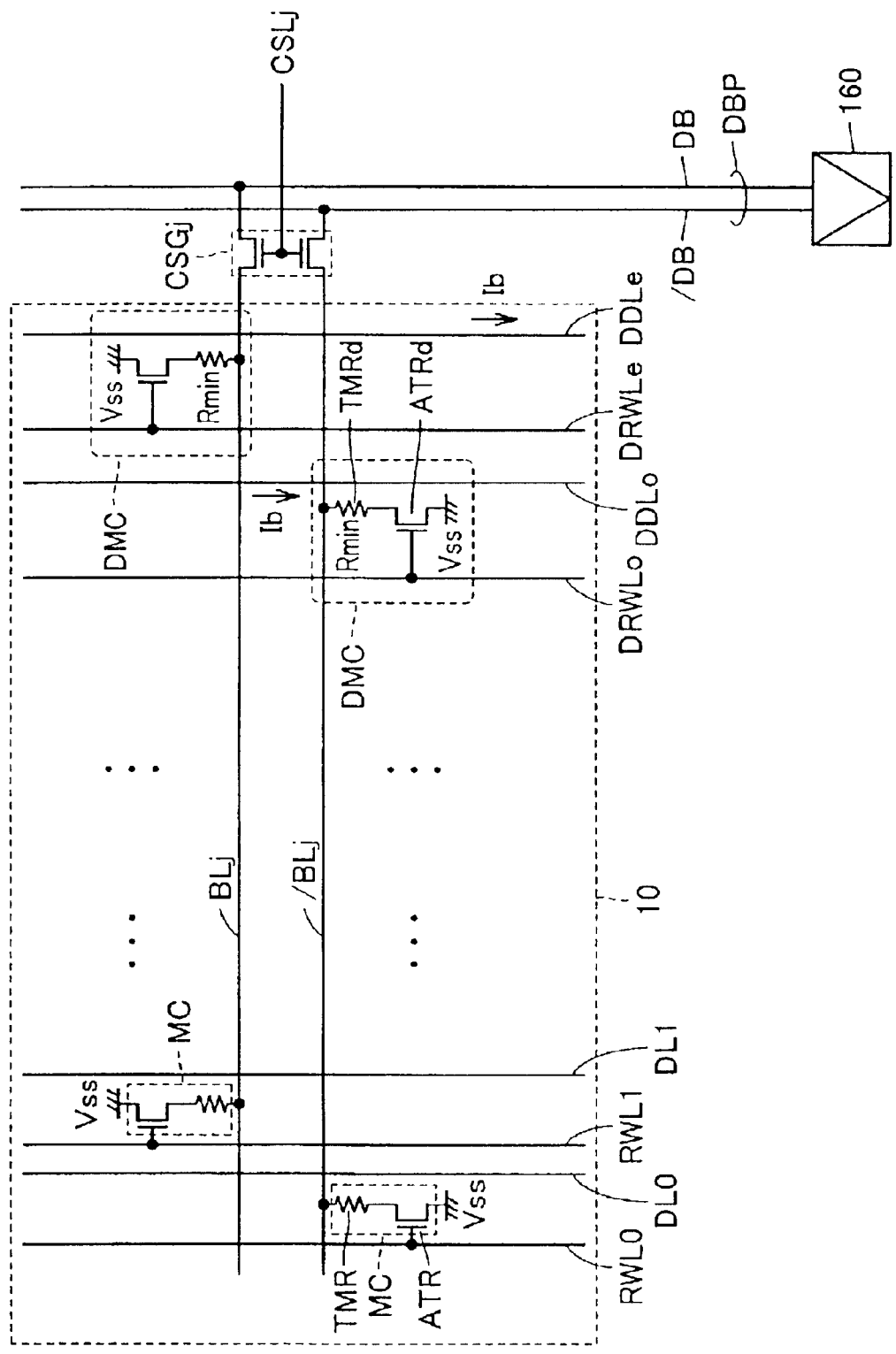
FIG. 28 is a circuit diagram showing a structure of a data read circuit system according to a seventh embodiment.

Referring to FIG. 28, the structure of the seventh embodiment does not employ the dummy resistance adding portion, which is employed in the sixth embodiment and the modifications thereof, and is connected in series or parallel to at least one of the dummy cell or the selected memory cell. In memory array 10, normal memory cells MC and dummy cells DMC are continuously arranged to share the memory cell columns, similarly to the structure shown in FIG. 4.

Bit lines BL and /BL are arranged in such a direction that the passing currents thereof produce the magnetic field along easy axes of tunneling magneto-resistance element TMR and dummy magneto-resistance element TMRd. Digit lines DL and dummy digit lines DDLe and DDLo are arranged in such a direction that the passing currents thereof produce the magnetic fields along the hard axes of tunneling magneto-resistance element TMR and dummy magneto-resistance element TMRd. In general, bit lines BL and /BL are arranged along the hard axes of tunneling magneto-resistance element TMR and dummy magneto-resistance element TMRd, and digit lines DL and dummy digit lines DDLe and DDLo are arranged along the easy axes of tunneling magneto-resistance element TMR and dummy magneto-resistance element TMRd.

As already described, the data write currents are supplied to both bit line BL and digit line DL corresponding to the normal memory cell selected as the data write target. Thereby, tunneling magneto-resistance element TMR of the selected memory cell is magnetized along the easy axis and in accordance with the direction of the data write current flowing through bit line BL, whereby the data writing is executed.

The electric resistance of dummy cell DMC and thus the magnetization direction of dummy magneto-resistance element TMRd must be kept constant. Therefore, it is not essential to arranged dummy digit lines DDLe and DDLo for executing the data write selection. According to the structure of the seventh embodiment, however, a bias current Ib for applying the bias magnetic field in the direction of the hard axis to dummy magneto-resistance element TMRd flows through dummy digit lines DDLe and DDLo even in the data read operation.

Figure 29A:
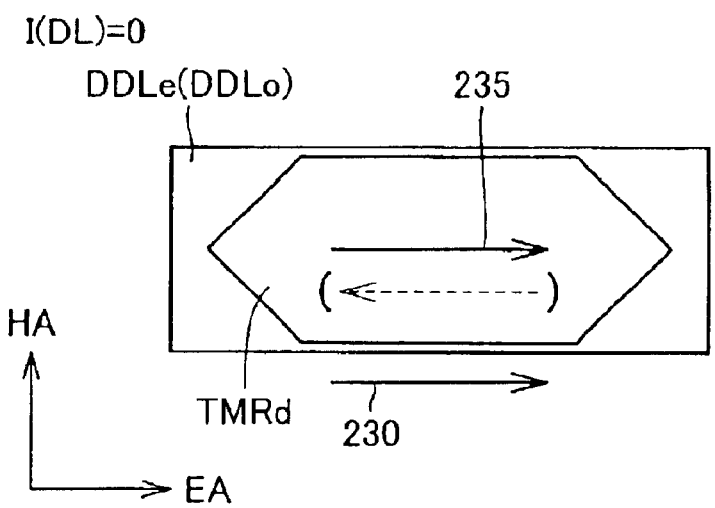
FIGS. 29A and 29B conceptually illustrate a relationship between a current flowing through a dummy digit line and an electric resistance of a dummy magneto-resistance element.
Figure 29B:
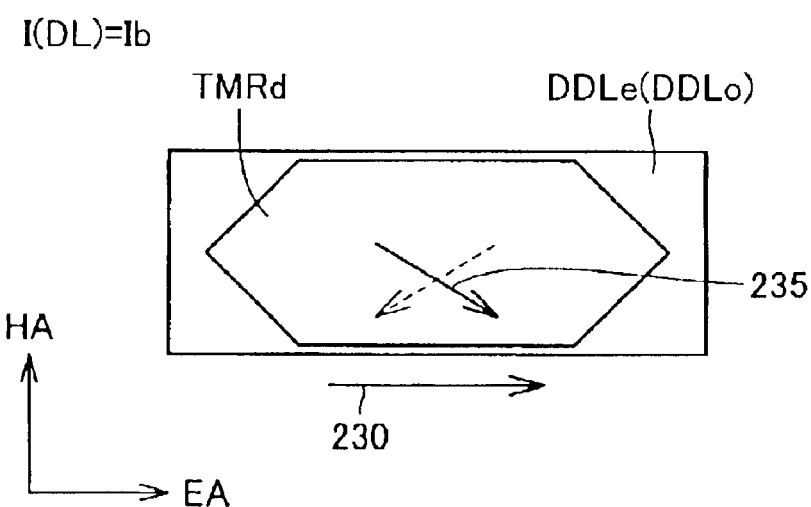

Referring to FIGS. 29A and 29B, description will now be given on a relationship between a current flowing through the dummy digit lines and the electric resistance of the dummy magneto-resistance element.

FIG. 29A shows a magnetization direction of dummy magneto-resistance element TMRd in the case where no current flows through dummy digit line DDLe (DDLo), and thus in the case of I(DL)=0. If dummy magneto-resistance element TMRd has the electric resistance of Rmin, a magnetization direction 235 of the free magnetic layer is parallel to easy axis (EA), and is the same as a magnetization direction 230 of the fixed magnetic layer.

In FIG. 29B, a bias current Ib flows through dummy digit line DDLe (DDLo) after the above state, and thus a relationship of I(DL)=Ib is attained. Thereby, a magnetization direction 235 of the free magnetic layer is turned by the bias magnetic field caused in the direction of the hard axis by bias current Ib.

Thereby, magnetization direction 230 of the fixed magnetic layer no longer matches with magnetization direction 235 of the free magnetic layer so that the electric resistance of dummy magneto-resistance element TMRd changes to a level intermediate between Rmin and Rmax. The electric resistance at this intermediate level can be tuned in accordance with a current amount of bias current Ib.

As represented by dotted lines in FIGS. 29A and 29B, dummy magneto-resistance element TMRd may enter the state, in which magnetization directions 230 and 235 of the fixed and free magnetic layers are parallel but opposite to each other, and the electric resistance is preset to Rmax. Even in this case, the electric resistance of dummy magneto-resistance element TMRd can likewise be set to the level intermediate between electric resistances Rmin and Rmax owing to the influence of the bias magnetic field caused by bias current Ib.

Referring to FIG. 28 again, the data read currents flow through bit lines BL and /BL for dummy cell DMC corresponding to the selected column. However, these data read currents are usually kept at an extremely small level as compared with the data write currents required for inverting the magnetization direction along the easy axis in the data write operation. Therefore, even when bias current Ib flows through dummy digit lines DDLe and DDLo in the data read operation as already described, erroneous writing of data into the dummy cell is not executed.

As already described, it is not necessary to use a connection switching circuit, which can connect a dummy resistance in series or parallel to the current path including the dummy cell and the current path including the selected memory cell, or can switch the connection relationship of such current paths with respect to data buses DB and /DB in accordance with the results of address selection. Further, such a structure for providing an offset between the passing currents of the dummy cell and the selected memory cell is not employed. Without employing the above connection switching circuit and the above structure for providing the offset, it is possible to execute the data reading in accordance with the passing current difference between the selected memory cell and the dummy cell, which is designed and manufactured similarly to the normal memory cell.

Accordingly, it is possible to provide the data read circuit system without such disadvantages that the data read circuit system is complicated and therefore the circuit area increases, and that the manufacturing steps of memory array 10 become difficult due to complication of the processing thereof.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:
   a plurality of memory cells each being configured to exhibit an electric resistance corresponding to a magnetization direction, and being magnetized in a direction corresponding to storage data;
   a dummy cell having a structure and a form similar to those of said memory cell, and being magnetized in advance in a direction corresponding to a predetermined level of said storage data;
   first and second data lines electrically coupled to a fixed voltage via one and the other of a selected memory cell among said plurality of memory cells and said dummy cell in a data read operation, respectively;
   a differential amplifier portion for reading out said storage data based on a comparison between electric resistances of said selected memory cell and said dummy cell,
   said differential amplifier portion including:
      a current supply circuit having first and second transistors electrically coupled between an operation voltage and first and second sense nodes, respectively, and each having a gate connected to one of first and second sense nodes, and
      a current amplifier circuit having third and fourth transistors electrically coupled between said first and second data lines and said first and second sense nodes, respectively; and
      a first offset adjusting circuit for applying first and second offset control voltages to gates of said third and fourth transistors, wherein
         said differential amplifier portion provides a first offset, when necessary, between passing currents of said first and second data lines such that the passing current of one of said first and second data lines electrically coupled to said dummy cell is set to a level intermediate between two kinds of passing currents respectively corresponding to levels of said storage data on the other of said first and second data lines electrically coupled to said selected memory cell.

2. The thin film magnetic memory device according to claim 1, wherein
   said first offset is provided by setting said first and second offset control voltages to different levels by said first offset adjusting circuit, respectively.

3. The thin film magnetic memory device according to claim 1, wherein
   said first offset adjusting circuit sets said first and second offset control voltages to a common level, and
   said first offset is provided by the fact that said first and second transistors have different current drive capabilities, respectively.

4. The thin film magnetic memory device according to claim 1, further comprising:
   first and second global data lines; and
   a global differential amplifier portion for producing a voltage difference between first and second global sense nodes in accordance with a voltage difference between said first and second sense nodes, wherein
   said global differential amplifier portion includes:
      fifth and sixth transistors electrically coupled between a first voltage and the first and second global sense nodes, respectively, and each having a gate connected to one of said first and second global sense nodes,
      a seventh transistor electrically coupled between said first global data line and a second voltage, and having a gate connected to said first sense node,
      an eighth transistor electrically coupled between said second global data line and said second voltage, and having a gate connected to said second sense node,
      a ninth transistor electrically coupled in series to said first global data line, and
      a tenth transistor electrically coupled in series to said second global data line;

said differential amplifier portion and said first offset adjusting circuit are designed not to provide said first offset between passing currents of said first and second data lines;

said thin film magnetic memory device further comprises:

a second offset adjusting circuit for applying third and fourth offset control voltages to gates of said ninth and tenth transistors, respectively; and said global differential amplifier portion provides a second offset between passing currents of said first and second global data lines such that the passing current of one of said first and second global data lines corresponding to one of said first and second sense nodes electrically coupled to said dummy cell is set to a level intermediate between two kinds of the passing currents corresponding to said storage data on the other of said first and second global data lines corresponding to the other of said first and second sense node electrically coupled to said selected memory cell.

5. The thin film magnetic memory device according to claim 4, wherein said second offset adjusting circuit sets said third and fourth offset control voltages to different levels for producing said second offset, respectively.

6. The thin film magnetic memory device according to claim 4, wherein said second offset adjusting circuit sets said third and fourth offset control voltages to a common level, and said ninth and tenth transistors have different current drive capabilities for producing said second offset, respectively.

7. The thin film magnetic memory device according to claim 4, wherein a connection relationship of said first and second data lines with respect to said selected memory cell and said dummy cell in said data read operation is switched in accordance with results of address selection, and said thin film magnetic memory device further comprises:

a connection switching circuit for switching the connection relationship of said seventh and eighth transistors with respect to said first and second global data lines in accordance with said results of the address selection.

8. The thin film magnetic memory device according to claim 1, wherein a connection relationship of said first and second data lines with respect to said selected memory cell and said dummy cell in said data read operation is switched in accordance with results of address selection, and said thin film magnetic memory device further comprises:

a connection switching circuit connected between said first and second data lines and said differential amplifier for switching the connection relationship of said first and second data lines with respect to said third and fourth transistors in accordance with said results of the address selection.

9. The thin film magnetic memory device according to claim 1, wherein a connection relationship of said first and second data lines with respect to said selected memory cell and said dummy cell in said data read operation is switched in accordance with results of address selection;

said current amplifier circuit further includes:

a fifth transistor connected in parallel to said third transistor, and having a gate receiving said second offset control voltage, and a sixth transistor connected in parallel to said fourth transistor, and having a gate receiving said first offset control voltage;

each of said fourth and fifth transistors is designed to have a current drive capability different from a current drive capability of each of said third and sixth transistors; and said first offset adjusting circuit sets said first and second offset control voltages such that either a set of said fourth and fifth transistors or a set of said third and sixth transistors is turned off in accordance with said results of the address selection.

10. The thin film magnetic memory device according to claim 1, wherein said plurality of memory cells and said dummy cells are arranged in a divided fashion in first and second memory blocks to be selectively handled as a data read target, each of said first and second memory blocks includes said dummy cell, said first and second data lines and said differential amplifier portion are shared by said first and second memory blocks, and in said data read operation, one of said first and second data lines is electrically coupled to said fixed voltage via said selected memory cell, and the other of said first and second data lines is electrically coupled to said fixed voltage via said dummy cell belonging to one of said first and second memory blocks.

11. A thin film magnetic memory device comprising:

a plurality of memory cells each being configured to exhibit an electric resistance corresponding to a magnetization direction, and being magnetized in a direction corresponding to storage data;

a dummy cell having a structure and a form similar to those of said memory cell, and being magnetized in advance in a direction corresponding to a predetermined level of said storage data;

a first voltage line provided for said plurality of memory cells for transmitting a first predetermined voltage;

a second voltage line provided corresponding to said dummy cell for transmitting a second predetermined voltage different from said first predetermined voltage;

first and second data lines being electrically coupled to said first and second voltage lines via the selected memory cell among said plurality of memory cells and said dummy cell in a data read operation, respectively; and a data reading portion for performing data reading in accordance with a difference between passing currents of said first and second data lines, wherein said first and second predetermined voltages are determined such that the passing current of said dummy cell attains a level intermediate between two kinds of passing currents corresponding to respective levels of said storage data in said selected memory cell.

12. The thin film magnetic memory device according to claim 11, wherein each of said memory cells is magnetized to have one of first and second electric resistances in accordance with said storage data, said dummy cell is magnetized in advance to have an electric resistance value that is between said first and second electric resistances, and said first and second predetermined voltages are determined such that a voltage applied across opposite ends of said dummy cell is lower than a voltage applied across opposite ends of said selected memory cell in said data read operation.

13. The thin film magnetic memory device according to claim 11, wherein a plurality of said dummy cells are connected in parallel between said second data line and said second voltage line in said data read operation.

14. The thin film magnetic memory device according to claim 11, further comprising:

a voltage supply node for supplying a fixed voltage, a first transistor arranged between said voltage supply node and said second voltage line, and a first voltage comparator for controlling a passing current of said first transistor in accordance with a difference between said second predetermined voltage and a voltage on said second voltage line.

15. The thin film magnetic memory device according to claim 14, further comprising a second transistor arranged between said voltage supply node and said first voltage line, and a second voltage comparator for controlling a passing current of said second transistor in accordance with a difference between said first predetermined voltage and a voltage on said first voltage line, wherein one of said first and second predetermined voltages is set in value based on the value of the other of said first and second predetermined voltages.

16. A thin film magnetic memory device comprising:

a plurality of memory cells each having a magneto-resistance element configured to be magnetized in a direction corresponding to a level of storage data, and to have either a first or second electric resistance in accordance with the magnetization direction, and an access transistor connected in series to said magneto-resistance element and being selectively turned on in a data read operation;

a dummy cell for comparing a passing current with that of the selected memory cell selected as an access target among said plurality of memory cells in said data read operation;

first and second data lines electrically coupled to a fixed voltage via said selected memory cell and said dummy cell in the data read operation, respectively; and a data reading portion for performing data reading in accordance with a difference between passing currents of said first and second data lines, wherein said dummy cell includes:

a dummy magneto-resistance element configured similar to said magneto-resistance element of the plurality of memory cells and being magnetized in advance to have an electric resistance value that is between said first and second electric resistances, a dummy access transistor connected in series to said dummy magneto-resistance element, being selectively turned on in the data read operation and being designed similarly to said access transistor, and a dummy resistance adding portion connected in series to said dummy magneto-resistance element, and having an electric resistance smaller than a difference between said first and second electric resistances; and said dummy resistance adding portion has at least one transistor designed similarly to said access transistor and having a gate supplied with an adjustable control voltage.

17. The thin film magnetic memory device according to claim 16, wherein said bias magnetic field applying portion has a current line corresponding to said dummy cell, and arranged along said easy axis for receiving a bias current in the data read operation.

18. A nonvolatile semiconductor memory device comprising a plurality of nonvolatile memory cells;

a dummy cell provided as a comparison target for a selected memory cell selected as an access target from among said nonvolatile memory cells in data reading;

first and second data lines electrically connected to one and the other of said selected memory cell and said dummy cell, respectively, in accordance with an address signal in said data reading; and a data read circuit for performing said data reading in accordance with a difference in current between passing currents of said first and second data lines, wherein said data read circuit includes a differential amplifier portion for sensing and amplifying a difference in current between a reference current passing through its first node and a data read current passing through its second node, said first and second data lines are configured to connect to said selected memory cell and said dummy cell in said data reading such that a connection relationship of said first and second data lines with respect to said selected memory cell and said dummy cell is switched in accordance with a result of address selection based on said address signal, said nonvolatile semiconductor memory device further comprising:

a connection switching circuit provided between said first and second nodes and said first and second data lines, and for switching a connection relationship of said first and second data lines with respect to said first and second nodes in accordance with the result of address selection such that one data line of said first and second data lines connected to said dummy cell and the other data line of said first and second data lines connected to said selected memory cell are electrically connected to said first and second nodes, respectively, wherein said differential amplifier portion includes a current supply circuit configured to supply a current to each of said first node and said second node, and a current amplifier circuit configured to produce a voltage difference between said first and second nodes in accordance with a difference in current between a current passing through said first node and a current passing through second node.

19. The nonvolatile semiconductor memory device according to claim 18, wherein said current supply circuit has a first transistor electrically connected between an operation voltage and said first node, and a second transistor elecrically connected between said operation voltage and said second node, and a third transistor electrically connected between said first node and said connection switching circuit, and a fourth transistor electrically connected between said second node and said connection switching circuit.

20. The nonvolatile semiconductor memory device according to claim 19, wherein said dummy cell has, set in advance therein, data of a predetermined level corresponding to one of first and second levels of storage data in each said nonvolatile memory cell, and said reference current passing through said first node is determined such that the passing current of said other data line corresponding to said first and second levels of said storage data.

21. The nonvolatile semiconductor memory device according to claim 19, wherein each of said nonvolatile memory cells includes a resistive element having an electric resistance in accordance with storage data.

22. A thin film magnetic memory device comprising:

a memory array provided with a plurality of memory cells and a dummy cell for comparing a passing current with that of a selected memory cell selected as an access target among said plurality of memory cells in a data read operation, each of said memory cells including a magneto-resistance element configured to be magnetized in a direction corresponding to a level of storage data and to have either a first or second electric resistance in accordance with the magnetization direction, and said dummy cell including a dummy magneto-resistance element having a structure and a form substantially similar to the structure and form of said magneto-resistance element, and being magnetized in advance to have a fixed one of said first and second electric resistances;

first and second data lines, one of the first and second data lines electrically coupled, to one of said selected memory cell and said dummy cell, while the other of the first and second data lines is electrically coupled to the other of said selected memory cell and said dummy cell in the data read operation; and a data reading portion for performing data reading in accordance with a difference between passing currents of said first and second data lines; wherein said plurality of memory cells and said dummy cells are arranged in a divided fashion in first and second memory blocks, and said first and second data lines are arranged such that a positional relationship of said first and second data lines is exchanged at least in a region intermediate between said first and second memory blocks.

23. The thin film magnetic memory device according to claim 22, wherein said first data line is coupled to one of said plurality of memory cells via a select gate in said first memory block and to said dummy cell via a dummy select gate in said second memory block, and said second data line is coupled to said dummy cell via a dummy select gate in said first memory and to one of said plurality of memory cells via a select gate block in said second memory block.

24. A thin film magnetic memory device comprising: a memory array provided with a plurality of memory cells and a dummy cell for comparing a passing current with that of a selected memory cell selected as an access target among said plurality of memory cells in a data read operation, wherein each of said memory cells includes a magneto-resistance element confingured to be magnetized in a direction corresponding to a level of storage data and to have either a first or second electric resistance in accordance with the magnetization direction, said dummy cell includes a dummy magneto-resistance element having a structure and a form substantially similar to the structure and form of said magneto-resistance element, and being magnetized in advance to have a fixed one of said first and second electric resistances, and said plurality of memory cells and said dummy cells are arranged in a divided fashion in first and second memory blocks, said thin film magnetic memory device further comprising:

a first data line configured to be coupled to one of said plurality of memory cells via a select gate in said first memory block and to said dummy cell via a dummy select gate in said second memory block, in the data read operation;

a second data line configured to be coupled to said dummy cell via a dummy select gate in said first memory block and to one of said plurality of memory cells via a select gate block in said second memory block, in the data read operation; and a data reading portion for performing data reading in accordance with a difference between passing currents of said first and second data lines.

25. The thin film magnetic memory device according to claim 24, wherein said first and second data lines are arranged to be twisted with respect to each other in a region intermediate between said first and second memory blocks.

* * * * *